(12) United States Patent
Seong et al.

(10) Patent No.: US 9,806,168 B2
(45) Date of Patent: Oct. 31, 2017

(54) SEMICONDUCTOR DEVICES AND METHODS FOR FABRICATING THE SAME

(71) Applicant: Samsung Electronics Co., Ltd., Suwon-Si, Gyeonggi-do (KR)

(72) Inventors: GeumJung Seong, Seoul (KR); JinWook Lee, Seoul (KR); Dohyoung Kim, Hwaseong-si (KR); Sungwoo Myung, Seoul (KR); Jisoo Oh, Incheon (KR); Yong-Ho Jeon, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 7 days.

(21) Appl. No.: 14/988,867

(22) Filed: Jan. 6, 2016

(65) Prior Publication Data

US 2016/0240630 A1 Aug. 18, 2016

(30) Foreign Application Priority Data

Feb. 12, 2015 (KR) ........................ 10-2015-0021639

(51) Int. Cl.
| | | |
|---|---|---|
| H01L 21/00 | (2006.01) | |
| H01L 29/66 | (2006.01) | |
| H01L 29/40 | (2006.01) | |
| H01L 29/49 | (2006.01) | |
| H01L 21/3105 | (2006.01) | |
| H01L 21/311 | (2006.01) | |
| H01L 21/3213 | (2006.01) | |

(52) U.S. Cl.
CPC .. *H01L 29/66545* (2013.01); *H01L 21/31058* (2013.01); *H01L 21/31138* (2013.01); *H01L 21/32139* (2013.01); *H01L 29/401* (2013.01); *H01L 29/4966* (2013.01)

(58) Field of Classification Search
CPC ......... H01L 29/66545; H01L 21/31058; H01L 21/31138; H01L 21/32139; H01L 29/401; H01L 29/4966
See application file for complete search history.

(56) References Cited

U.S. PATENT DOCUMENTS

| | | |
|---|---|---|
| 7,270,931 B2 | 9/2007 | Angelopoulos et al. |
| 7,534,730 B2 | 5/2009 | Ozaki et al. |

(Continued)

FOREIGN PATENT DOCUMENTS

| | | |
|---|---|---|
| KR | 1020020058518 A | 7/2002 |
| KR | 1020040008447 A | 1/2004 |

(Continued)

*Primary Examiner* — Richard Booth
(74) *Attorney, Agent, or Firm* — Ward and Smith, P.A.

(57) ABSTRACT

The inventive concept relates to a semiconductor device and a method for fabricating the same. The semiconductor device comprises active patterns protruding from a substrate, an interlayer dielectric layer disposed on the substrate and including grooves exposing the active patterns, and gate electrodes in the grooves. The grooves include a first groove having a first width and a second groove having a second width greater than the first width. The gate electrodes include a first gate electrode in the first groove, and a second gate electrode in the second groove. Each of the first and second gate electrodes includes a first work function conductive pattern on a bottom surface and sidewalls of corresponding one of the first and second grooves, and a second work function conductive pattern on the first work function conductive pattern.

19 Claims, 47 Drawing Sheets

(56) References Cited

U.S. PATENT DOCUMENTS

| | | |
|---|---|---|
| 7,771,606 B2 | 8/2010 | Kim et al. |
| 8,419,958 B2 | 4/2013 | Wilson |
| 8,598,037 B2 | 12/2013 | Winniczek et al. |
| 8,611,135 B2 | 12/2013 | Wang et al. |
| 8,704,294 B2 | 4/2014 | Liao et al. |
| 2009/0061641 A1 | 3/2009 | Jung |
| 2011/0065286 A1 | 3/2011 | Sasaki et al. |
| 2014/0179109 A1 | 6/2014 | Lee et al. |

FOREIGN PATENT DOCUMENTS

| | | |
|---|---|---|
| KR | 1008666681 B1 | 11/2008 |
| KR | 1020090023825 A | 3/2009 |

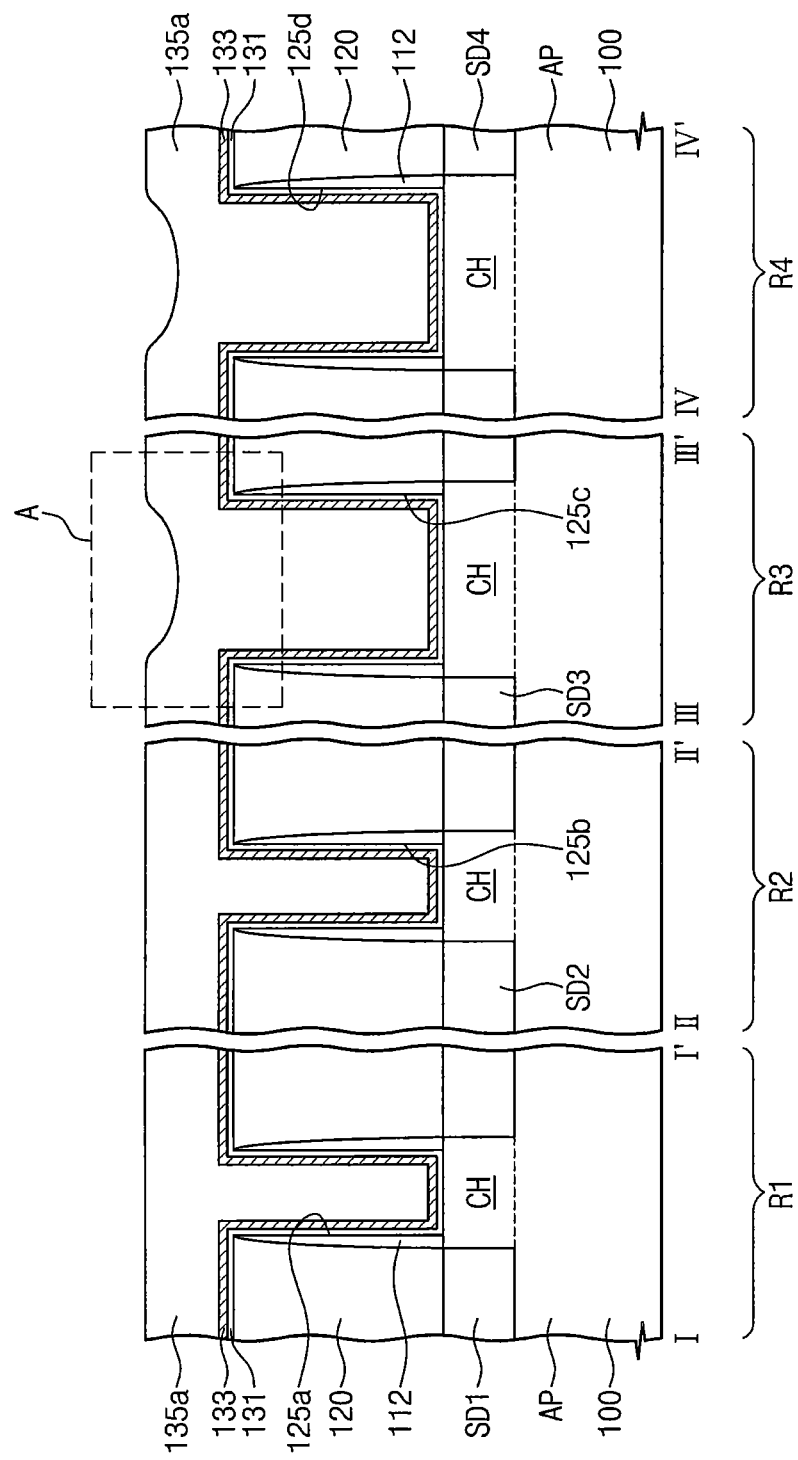

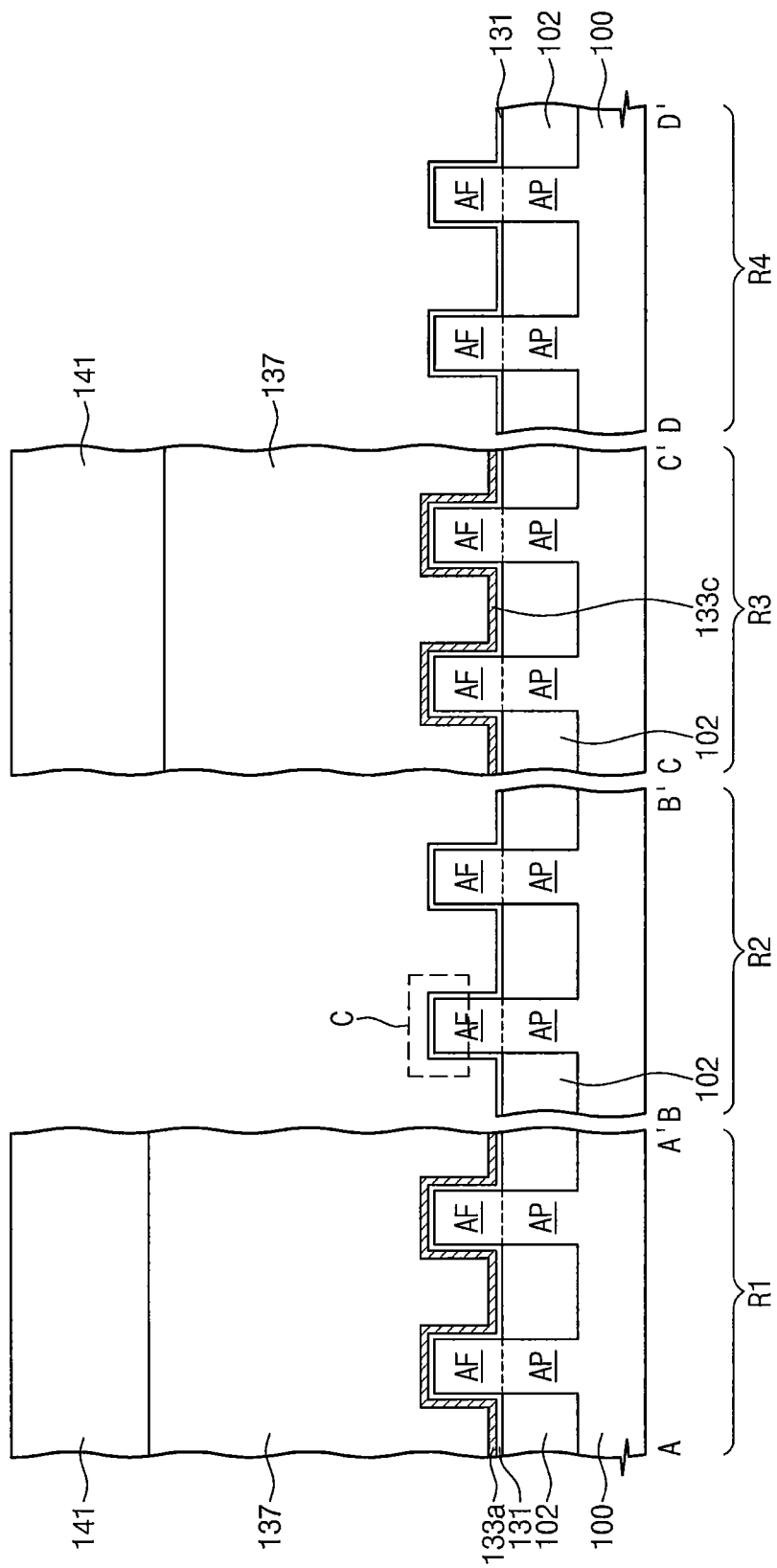

1200

SEMICONDUCTOR DEVICES AND METHODS FOR FABRICATING THE SAME

CROSS-REFERENCE TO RELATED APPLICATION

This application claims priority under 35 U.S.C. §119 to Korean Patent Application 10-2015-0021639 filed on Feb. 12, 2015, the entire contents of which are hereby incorporated by reference.

BACKGROUND

Semiconductor devices may include integrated circuits such as metal-oxide-semiconductor (MOS) transistors. As the size and design rule of the semiconductor device gradually continue to decrease, the scaling down of the MOS transistor has been accelerated. The scaling down of the MOS transistor may induce short channel effects and thus operation characteristics of the semiconductor device can be reduced.

SUMMARY

According to some embodiments of the present inventive concept, a method for fabricating a semiconductor device may include forming active patterns on a substrate, the active patterns protruding from the substrate, forming an interlayer dielectric layer covering the active patterns, the interlayer dielectric layer including grooves exposing the active patterns, the grooves including a first groove having a first width and a second groove having a second width greater than the first width; forming a first conductive layer on inner surfaces of the first and second grooves, forming a first sacrificial layer filling the first and second grooves, performing a first etching process to remove the first sacrificial layer and expose a portion of the first conductive layer, and removing the exposed first conductive layer to form first conductive patterns covering top surfaces and sidewalls of the active patterns in the first and second grooves.

In some example embodiments, each of the first conducive patterns may have a "U" shape in a cross-sectional view.

In some example embodiments, each of the first conductive patterns may have an uppermost top surface positioned below a top surface of the interlayer dielectric layer and above a top surface of the active pattern.

In some example embodiments, the first conductive pattern in the second groove may have an uppermost top surface positioned above that of the first conductive pattern in the first groove.

In some example embodiments, the first etching process may be performed in such a way that an etch rate of the first sacrificial layer in the second groove is less than that of the first sacrificial layer in the first groove.

In some example embodiments, the first etching process may include an anisotropic dry etching process using a mixture of hydrogen (H2) and nitrogen (N2) as an etch gas.

In some example embodiments, the etch gas may include a mixture ratio of H2/N2 of about 0.5 to about 2.

In some example embodiments, a pulsed bias power may be employed as a bias power applied to the substrate while the first etching process is performed.

In some example embodiments, the pulsed bias power may have a duty ratio in the range of from about 0.05 to about 0.75.

In some example embodiments, the first etching process may be performed at a temperature of about 30° C. to about 80° C.

In some example embodiments, the grooves may further include a third groove whose width is substantially the same as the first width of the first groove. The first conductive patterns may be formed in the first to third grooves. The method may further include removing at least one of the first conductive patterns in the first to third grooves.

In some example embodiments, removing the at least one of the first conductive patterns in the first to third grooves may include removing the first conductive patterns in the first groove and the first conductive pattern in the second groove. Removing the first conductive patterns in the first and second grooves may include forming a second sacrificial layer filling the first to third grooves, forming mask patterns on the second sacrificial layer, the first and second grooves opened by the mask patterns, and performing a second etching process using the mask patterns as an etch mask to remove the second sacrificial layer in the first and second grooves.

In some example embodiments, the second etching process may be performed in such a way that an etch rate of the second sacrificial layer in the second groove is less than that of the second sacrificial layer in the first groove.

In some example embodiments, the second etching process may include an anisotropic dry etching process using a mixture of hydrogen (H2) and nitrogen (N2) as an etch gas. The second etching process may use a pulsed bias power as a bias power provided to the substrate.

In some example embodiments, the pulsed bias power may have a duty ratio in the range of from about 0.05 to about 0.75.

In some example embodiments, the first and second sacrificial layers may each have a carbon-based SOH layer or a silicon-based SOH layer.

In some example embodiments, after removing the first conductive patterns in the first and second grooves, the method may further include forming a second conductive layer in the first to third grooves. The second conductive layer may include a material different from that of the first conductive layer.

In some example embodiments, the first conductive layer may include metal nitride and the second conductive layer may include aluminum and metal carbide.

In some example embodiments, prior to forming the interlayer dielectric layer, the method may further include forming first and second sacrificial gate patterns crossing the active patterns on the substrate, the interlayer dielectric layer covering sidewalls of the first and second sacrificial gate patterns, and removing the first and second sacrificial gate patterns to expose the active patterns. The removal of the first and second sacrificial gate patterns may create spaces serving as the first and second grooves.

In some example embodiments, prior to removing the first and second sacrificial gate patterns, the method may further include forming first and second source/drain regions on the active patterns at opposing sides of the first and second sacrificial gate patterns, respectively. The first and second source/drain regions may be of the same conductivity type.

In some example embodiments, forming the first sacrificial layer may include forming a first sub-sacrificial layer filling the first and second grooves, recessing the first sub-sacrificial layer; and forming a second sub-sacrificial layer on the recessed first sub-sacrificial layer.

According to some other example embodiments of the present inventive concept, methods for fabricating a semiconductor device may include forming active patterns on a substrate, the active patterns protruding from a substrate, forming sacrificial gate patterns crossing the active patterns on the substrate, forming an interlayer dielectric layer covering sidewalls of the sacrificial gate patterns, removing the sacrificial gate patterns to form a plurality of grooves exposing the active patterns, at least one of the plurality of grooves having a width greater than those of respective others of the plurality of grooves, and forming gate electrodes in the plurality of grooves. Forming the gate electrodes may include forming first work function conductive patterns in the plurality of grooves, removing at least one of the first work function conductive patterns in the plurality of grooves, and forming second work function conductive patterns in the plurality of grooves. The first work function conductive pattern may include a "U" shape in a cross-sectional view. The first work function conductive pattern may include an uppermost top surface positioned below a top surface of the interlayer dielectric layer and higher than a top surface of the active pattern.

In some example embodiments, forming the first work function conductive patterns may include forming a first work function conductive layer in the plurality of grooves, forming a first sacrificial layer in the plurality of grooves; performing a first etching process to expose a portion of the first work function conductive layer in the plurality of grooves, and removing the exposed portion of the first work function conductive layer.

In some other example embodiments, forming the first sacrificial layer may include forming a first sub-sacrificial layer filling the plurality of grooves, recessing the first sub-sacrificial layer, and forming a second sub-sacrificial layer on the recessed first sub-sacrificial layer.

In some other example embodiments, removing the at least one of the first work function conductive patterns may include forming a second sacrificial layer filling the plurality of grooves in which the first work function conductive patterns are formed, forming a mask pattern on the second sacrificial layer, the mask pattern opening at least one of the plurality of grooves, and performing a second etching process using the mask pattern as an etch mask to remove the second sacrificial layer in the at least one of the plurality of grooves.

In some other example embodiments, at least one of the first and second etching processes may include an anisotropic dry etching process using a mixture of hydrogen (H2) and nitrogen (N2) as an etch gas.

In some other example embodiments, the etch gas may include a mixture ratio of H2/N2 of about 0.5 to about 2.

In some other example embodiments, a first pulsed bias power may be employed as a first bias power applied to the substrate while the first etching process is performed, and a second pulsed bias power may be employed as a second bias power applied to the substrate while the second etching process is performed.

In some other example embodiments, the first and second pulsed bias powers may each include a duty ratio of about 0.05 to about 0.75.

In some other example embodiments, the second work function conductive patterns may have an uppermost top surface substantially coplanar with a top surface of the interlayer dielectric layer.

In some other example embodiments, the second work function conductive patterns may include an uppermost top surface positioned below a top surface of the interlayer dielectric layer and above an uppermost top surface of the first work function conductive pattern.

According to some other example embodiments of the present inventive concept, a semiconductor device may include active patterns protruding from a substrate, an interlayer dielectric layer disposed on the substrate and including grooves exposing the active patterns, and gate electrodes in the grooves. The grooves may include a first groove having a first width and a second groove having a second width greater than the first width. The gate electrodes may include a first gate electrode in the first groove, and a second gate electrode in the second groove. Each of the first and second gate electrodes may include a first work function conductive pattern on a bottom surface and sidewalls of corresponding one of the first and second grooves, and a second work function conductive pattern on the first work function conductive pattern, the second work function conductive pattern having a material different of that of the first work function conductive pattern. The first work function conductive pattern may include a "U" shape in a cross-sectional view. The first work function conductive pattern may include an uppermost top surface positioned below an uppermost top surface of the interlayer dielectric layer and above a top surface of the active pattern.

In some other example embodiments, the first work function conductive pattern included in the first gate electrode may include an uppermost top surface positioned below that of the first work function conductive pattern included in the second gate electrode.

In some other example embodiments, second work function conductive pattern may include an uppermost top surface substantially coplanar with a top surface of the interlayer dielectric layer.

In some other example embodiments, the second work function conductive pattern may include an uppermost top surface positioned below a top surface of the interlayer dielectric layer and above an uppermost top surface of the first work function conductive pattern.

In some other example embodiments, the first work function conductive pattern may include metal nitride and the second work function conductive pattern may include aluminum and metal carbide.

In some other example embodiments, the semiconductor device may further include first source/drain regions at opposing sides of the first gate electrode, and second source/drain region at opposing sides of the second gate electrode. The first and second source/drain regions may be of the same conductive type.

Some embodiments of the present inventive concept are directed to semiconductor device. Such devices may include active patterns that protrude from a substrate, an interlayer dielectric layer on the substrate and that includes a first groove having a first width and a second groove having a second width that is different from the first width, wherein the first and second grooves expose the active patterns, a first work function conductive pattern that includes a first material on a bottom surface and sidewalls of corresponding ones of the first and second grooves, and a second work function conductive pattern that includes a second material that is different from the first material on the first work function conductive pattern. In some embodiments, the first work function conductive pattern has an uppermost top surface that is positioned below an uppermost top surface of the interlayer dielectric layer and above a top surface of the active pattern.

Some embodiments provide that an uppermost top surface of the first work function conductive pattern of the first gate electrode is lower than that of the first work function conductive pattern of the second gate electrode relative to the substrate.

In some embodiments, the first work function conductive pattern includes a metal nitride and the second work function conductive pattern includes an aluminum and a metal carbide.

Some embodiments provide that each of the first conductive patterns has a "U" shape in a cross-sectional view.

Some embodiments further include a third groove that exposes the active patterns and that has a third width that is substantially the same as the first width. In some embodiments, the first work function conductive pattern is on a bottom surface and sidewalls of the third groove.

Some embodiments of the present inventive concept include a semiconductor device that includes active patterns that protrude from a substrate and an interlayer dielectric layer on the substrate and that includes a first groove having a first width, a second groove having a second width that is substantially the same as the first width, a third groove having a third width, and a fourth groove having a fourth width that is substantially the same as the third width, wherein the first through fourth grooves expose the active patterns. The device may include first through fourth gate electrodes that are formed in the first through fourth grooves, respectively and that cross the active patterns that are exposed by the first through fourth grooves.

In some embodiments, the first and third gate electrodes include a first work function conductive pattern that includes a first material on a bottom surface and sidewalls of corresponding ones of the first and third grooves. Some embodiments provide that the first through fourth gate electrodes include a second work function conductive pattern that includes a second material that is different from the first material. Some embodiments provide that the second and fourth gate electrodes do not include the first work function material.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The foregoing and other features and advantages of example embodiments of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings:

FIGS. 2A to 4A, 7A, 10A to 14A, and 16A are plan views illustrating methods for fabricating a semiconductor device according to example embodiments of the present inventive concept;

FIGS. 2B to 4B, 7B, 10B to 14B, and 16B are cross-sectional views taken along lines I-I', II-II', III-III', and IV-IV' of FIGS. 2A to 4A, 7A, 10A to 14A, and 16A, respectively;

FIGS. 2C to 4C, 7C, 10C to 14C, and 16C are cross-sectional views taken along lines A-A', B-B', C-C' and D-D' of FIGS. 2A to 4A, 7A, 10A to 14A, and 16A, respectively;

FIGS. 8A to 8C are cross-sectional views, illustrating operations 621 to 623 of FIG. 6, taken along lines I-I', II-II', III-III', and IV-IV' of FIG. 7A;

FIG. 11 is a graph showing etch rate ratios of Comparative Example and Embodiments;

DETAILED DESCRIPTION

Figure 1A:
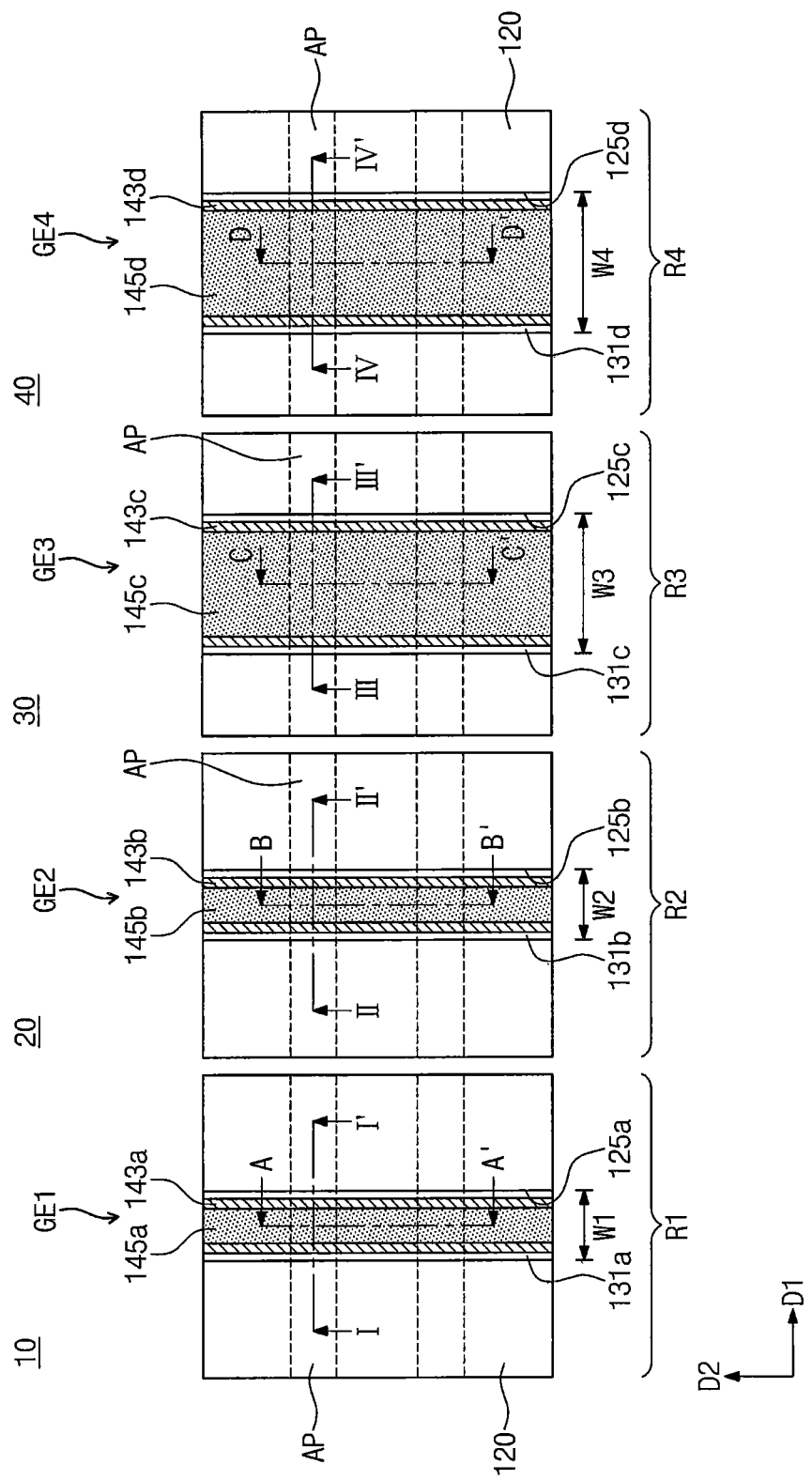
FIG. 1A is a plan view illustrating a semiconductor device according to some example embodiments of the present inventive concept.

Example embodiments of inventive concepts will now be described more fully hereinafter with reference to the accompanying drawings, in which some example embodiments of inventive concepts are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements. Hereinafter, it will be described about some example embodiments of the present inventive concept in conjunction with the accompanying drawings.

Figure 1B:
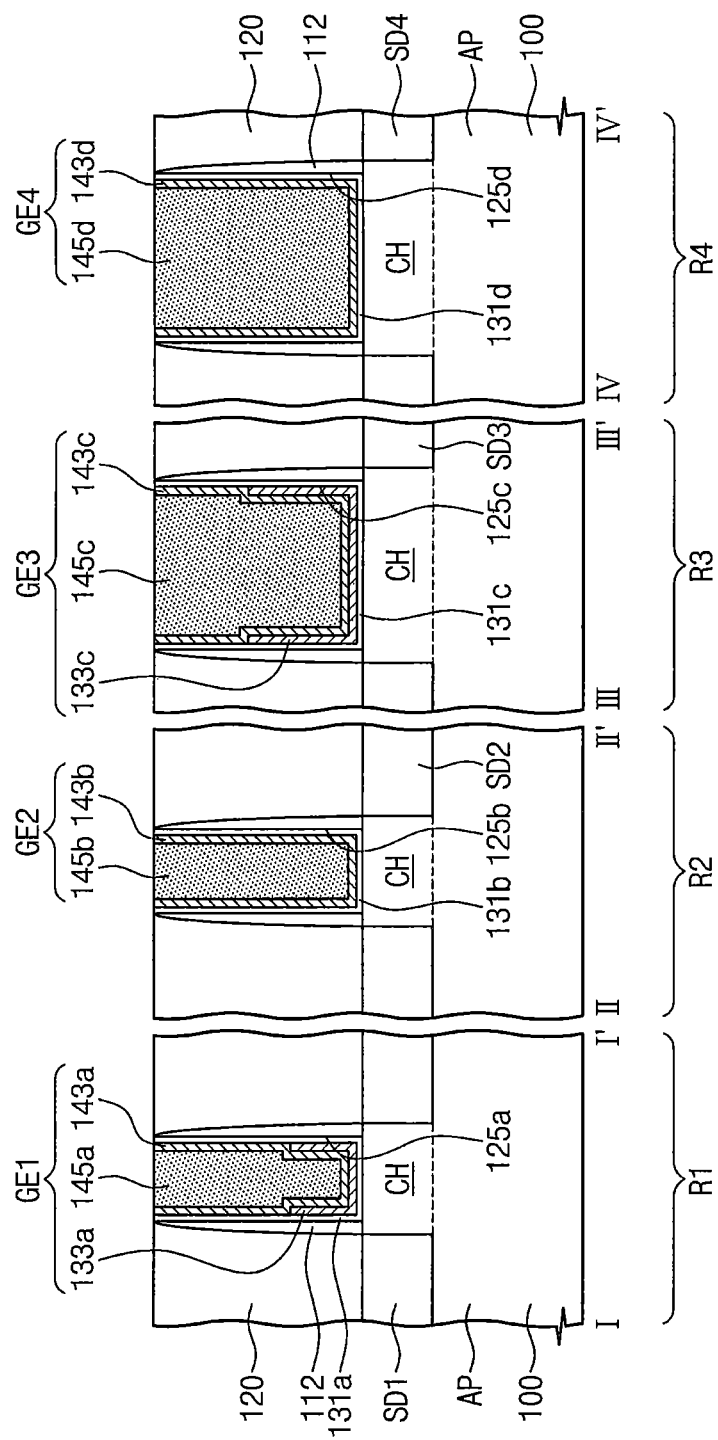
FIG. 1B is a cross-sectional view taken along lines I-I', II-II', III-III', and IV-IV' of FIG. 1A.
Figure 1C:
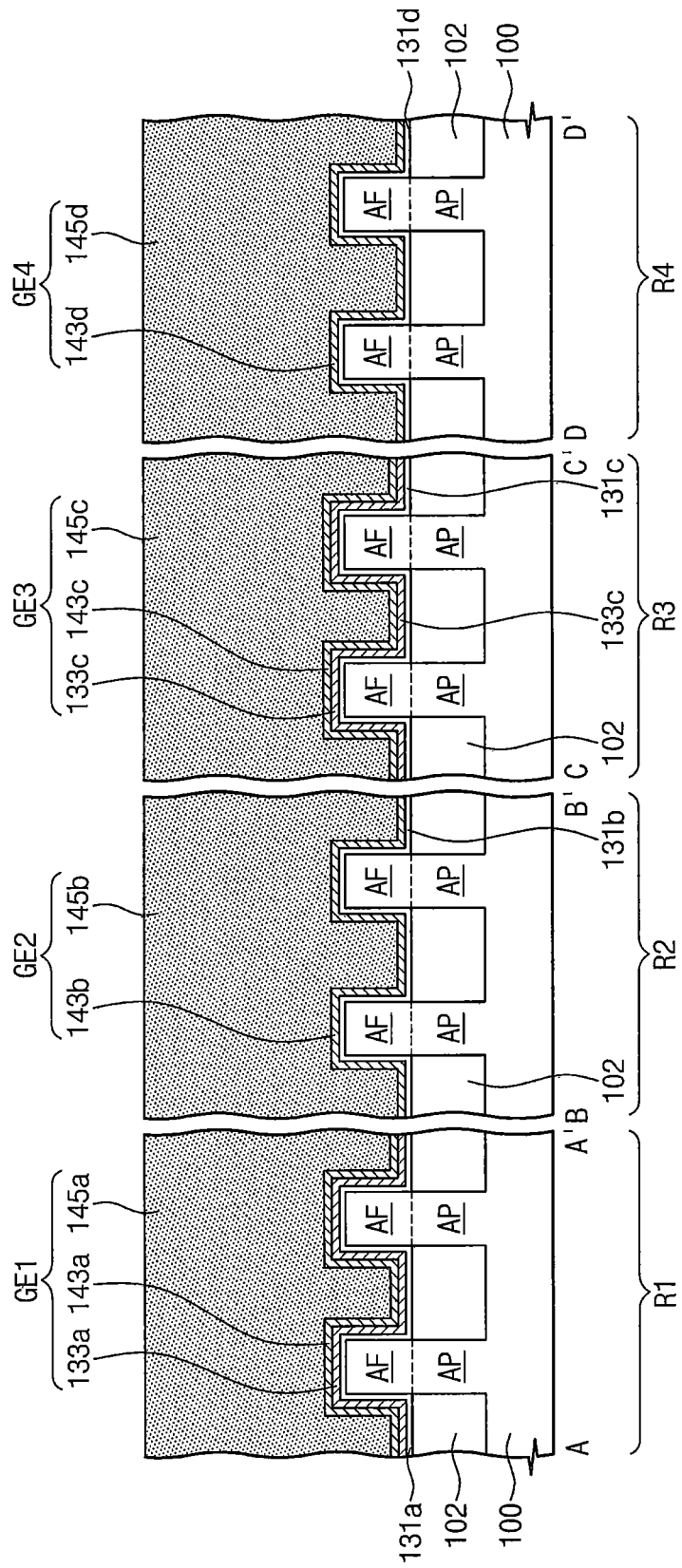
FIG. 1C is a cross-sectional view taken along lines A-A', B-B', C-C' and D-D' of FIG. 1A.

FIG. 1A is a plan view illustrating a semiconductor device according to some example embodiments of the present inventive concept. FIG. 1B is a cross-sectional view taken along lines I-I', II-II', III-III', and IV-IV' of FIG. 1A. FIG. 1C is a cross-sectional view taken along lines A-A', B-B', C-C' and D-D' of FIG. 1A.

Referring to FIGS. 1A, 1B and 1C, a semiconductor substrate 100 (referred to hereinafter as the substrate) may comprise a first region R1, a second region R2, a third region R3 and a fourth region R4 that are spaced apart from each other. The first to fourth regions R1 to R4 may respectively correspond to regions on which a first transistor 10, a second transistor 20, a third transistor 30 and a fourth transistor 40 are formed. The first and second transistors 10 and 20 may respectively include gate electrodes whose widths are less than those of gate electrodes respectively included in the third and fourth transistors 30 and 40.

In some example embodiments, the first and second transistors 10 and 20 may have different types. In some embodiments, the first and second transistors 10 and 20 may have different threshold voltages and yet be of the same type. Likewise, the third and fourth transistors 30 and 40 may have different types, or may have different threshold voltages and yet be of the same type. This will be discussed in detail below. The substrate 100 may be, for example, a silicon substrate. However, the present inventive concept is not limited thereto. For example, the substrate 100 may be formed of a semiconductor material different from silicon.

Active patterns AP may be disposed on the substrate 100 of the first to fourth regions R1 to R4, respectively. The active patterns AP may include fin shapes protruding from the substrate 100. Moreover, the active patterns AP may include linear or bar shapes extending between device isolation patterns 102. The first to fourth regions R1 to R4 may respectively include a pair of active patterns AP extending in a first direction D1 and spaced apart from each other in a second direction D2 crossing the first direction D1, but the present inventive concept is not limited to these example embodiments. For example, the first to fourth regions R1 to R4 may respectively include one or more active patterns AP. In some embodiments, the active patterns AP included in at least one of the first to fourth regions R1 to R4 may extend in the second direction D2 and spaced apart from each other in the first direction D1.

The active patterns AP may each be formed of a semiconductor material. For example, the active patterns AP may each be a portion of the substrate 100. In some embodiments, the active patterns AP may each include an epitaxial layer epitaxially grown from the substrate 100. In this case, tensile or compressive strain may be applied to the active patterns AP. The device isolation patterns 102 may be disposed on the substrate 100 to expose upper portions of the active patterns AP. The exposed upper portions of the active patterns AP may be defined as active fins AF. The device isolation patterns 102 may include an oxide (e.g., silicon oxide), a nitride (e.g., silicon nitride), and/or an oxynitride (e.g., silicon oxynitride).

An interlayer dielectric layer 120 may be disposed on the substrate 100 to cover the active patterns AP. The interlayer dielectric layer 120 may include an insulating a material such as, for example, a silicon oxide, a silicon nitride, a silicon carbide, and/or a silicon oxynitride. The interlayer dielectric layer 120 may comprise first to fourth grooves 125a to 125d exposing the active patterns AP included in the first to fourth regions R1 to R4, respectively. The grooves 125a to 125d may extend in the second direction D2 and expose the device isolation patterns 102 adjacent the active fins AF.

First to fourth gate electrodes GE1 to GE4 may be provided in the first to fourth grooves 125a to 124d, respectively. The first to fourth gate electrodes GE1 to GE4 may cross the active fins AF exposed by the first to fourth grooves 125a to 125d. In other words, the first to fourth gate electrodes GE1 to GE4 may respectively extend in the second direction D2 and cover top surfaces and sidewalls of the active fins AF. Gate spacers 112 may be provided between the interlayer dielectric layers 120 and sidewalls of the first to fourth gate electrodes GE1 to GE4. In some example embodiments, the gate spacers 112 may respectively be disposed on sidewalls of corresponding one of the first to fourth gate electrodes GE1 to GE4 and extend in the direction D2 along the first to fourth gate electrodes GE1 to GE4.

Respective sidewalls of the first to fourth grooves 125a to 125d may be defined by sidewalls of the corresponding gate spacers 112 facing each other. The first to fourth grooves 125a to 125d may include first to fourth widths W1 to W4, respectively. The first to fourth widths W1 to W4 may be respectively defined by distances between the gate spacers 112 facing each other where corresponding gate electrodes GE1 to GE4 are interposed between the gate spacers 112. In some example embodiments, the first and second widths W1 and W2 may respectively be less than each of the third and fourth widths W3 and W4. The first width W1 may be substantially equal to the second width W2, and the third width W3 may be substantially equal to the fourth width W4. However, the present inventive concept is not limited thereto. In some example embodiments, the first to fourth widths W1 to W4 may be different from each other.

The first to fourth gate electrodes GE1 to GE4 may have widths corresponding to those of the first to fourth grooves 125a to 125d, respectively. For example, the respective widths of the first and second gate electrodes GE1 and GE2 may be less than the respective widths of the third and fourth gate electrodes GE3 and GE4. The first gate electrode GE1 may have the width substantially equal to that of the second gate electrode GE2, and the third gate electrode GE3 may have the width substantially equal to that of the fourth gate electrode GE4. The active fins AF under the gate electrodes GE1 and GE4 may be referred to as channel regions CH.

First to fourth gate dielectric patterns 131a to 131d may be provided in the first to fourth grooves 125a to 125d, respectively. For example, the first to fourth gate dielectric patterns 131a to 131d may respectively be disposed between the corresponding gate electrodes GE1 to GE4 and the corresponding channel regions CH and between the corresponding gate spacers 112 and the sidewalls of the corresponding gate electrodes GE1 to GE4. The gate dielectric patterns 131a to 131d may extend along bottom surfaces of the gate electrodes GE1 to GE4, respectively. Therefore, the gate dielectric patterns 131a to 131d may respectively extend horizontally from the active fins AF to partially cover top surfaces of the device isolation patterns 102. The gate dielectric patterns 131a to 131d may each have a "U" shape in a cross-sectional view. In some example embodiments, the gate dielectric patterns 131a to 131d may each include a high-k dielectric material including at least one of a hafnium-based material (e.g., HfO2, HfSiO, HfSiON, HfAlO and/or HfLaO), a silicate-based material (e.g., AlSiO or TaSiO), a zirconium-based material (e.g., ZrO2 or ZrSiO), a lanthanide-based material (e.g., La2O3, Pr2O3 or Dy2O3), an oxide of Group IV element (e.g., BST((Ba, Sr)TiO3) or PZT(Pb(Zr, Ti)O3)) and any combination thereof. Top surfaces of the gate dielectric patterns 131a to 131d and the gate electrodes GE1 to GE4 provided in the grooves 125a to 125d, respectively, may be substantially coplanar with a top surface of the interlayer dielectric layer 120.

First to fourth source/drain regions SD1 to SD4 may be disposed on the active patterns AP at opposing sides of the first to fourth gate electrodes GE1 to GE4, respectively. In a cross-sectional view, the first to fourth source/drain regions SD1 to SD4 may each be interposed between the active patterns AP and the interlayer dielectric layer 120. In some example embodiments, the first to fourth source/drain regions SD1 to SD4 may each be an epitaxial layer epitaxially grown from the active pattern AP. For instance, the first to fourth source/drain regions SD1 to SD4 may each include a first epitaxial layer exerting a tensile strain to the channel region CH or a second epitaxial layer exerting a compressive strain to the channel region CH. For example, the first to fourth source/drain regions SD1 to SD4 may include the first epitaxial layers in case that the first to fourth transistors 10 to 40 are NMOSFETs. In some embodiments, the first to fourth source/drain regions SD1 to SD4 may include the second epitaxial layers in case that the first to fourth transistors 10 to 40 are PMOSFETs. In other words, the conductivity types of the first to fourth transistors 10 to 40 may determine whether the first to fourth source/drain regions SD1 to SD4 are the first epitaxial layers or the second epitaxial layers. The first epitaxial layer may include, for example, silicon or a silicon carbide and/or is doped with n-type impurities. The second epitaxial layer may include, for example, silicon germanium and/or is doped with p-type impurities. The first to fourth source/drain regions SD1 to SD4 may elevate over top surfaces of the channel regions CH otherwise as shown in FIG. 1B. The channel regions CH may respectively include top surfaces positioned above bottom surfaces of the source/drain regions SD1 to SD4 in a cross-sectional view, and may each be disposed between the corresponding ones of the first to fourth source/drain regions SD1 to SD4 in a plan view.

The first gate electrode GE1 may comprise a first conductive pattern 133a, a second conductive pattern 143a and a third conductive pattern 145a. For example, the first conductive pattern 133a may lie on the first gate dielectric pattern 131a and extend in the second direction D2. The first conductive pattern 133a may have a "U" shaped cross-sectional profile. The first conductive pattern 133a may include an uppermost top surface positioned below a top surface of the interlayer dielectric layer 120 and above a top surface of the channel CH. That is, the first conductive pattern 133a may expose a portion of the first gate dielectric pattern 131a on opposing sidewalls of the first groove 125a. The second conductive pattern 143a may be disposed on the first conductive pattern 133a. The second conductive pattern 143a may cover sidewalls and top surfaces of the first conductive pattern 133a. The second conductive pattern 143a may cover the portion of the first gate dielectric pattern 131a exposed by the first conductive pattern 133a. The second conductive pattern 143a may include an uppermost top surface substantially coplanar with the top surface of the interlayer dielectric layer 120. The third conductive pattern 145a may be disposed on the second conductive pattern 143a. The third conductive pattern 145a may fill the first groove 125a in which the first and second conductive patterns 133a and 143a are formed. The third conductive pattern 145a may be spaced apart from the first conductive pattern 133a. The third conductive pattern 145a may include a top surface substantially coplanar with the top surface of the interlayer dielectric layer 120.

Likewise with the first gate electrode GE1, the third gate electrode GE3 may comprise a first conductive pattern 133c, a second conductive pattern 143c and a third conductive pattern 145c. Respective conductive patterns 133c, 143c and 145c included in the third gate electrode GE3 may include shapes and arrangement substantially the same as those of respective conductive patterns 133a, 143a and 145a included in the first gate electrode GE1.

In some example embodiments, as shown in FIG. 1B, the first conductive pattern 133a of the first gate electrode GE1 may include the uppermost top surface positioned below an uppermost top surface of the first conductive pattern 133c of the third gate electrode GE3. However, the present inventive concept is not limited thereto. The uppermost top surface of the first conductive pattern 133a may be positioned to be substantially coplanar with or below that of the first conductive pattern 133c.

The second gate electrode GE2 may comprise a second conductive pattern 143b and a third conductive pattern 145b. For example, the second conductive pattern 143b may be disposed on the second gate dielectric pattern 131b and extend in the second direction D2. The second conductive pattern 143b may include a "U" shaped cross-sectional profile. The second conductive pattern 143b may include an uppermost top surface substantially coplanar with the top surface of interlayer dielectric layer 120. The third conductive pattern 145b may be disposed on the second conductive pattern 143b. The third conductive pattern 145b may fill the second groove 125b in which the second conductive pattern 143b is formed. The third conductive pattern 145b may include a top surface substantially coplanar with the top surface of the interlayer dielectric layer 120.

Likewise with the second gate electrode GE2, the fourth gate electrode GE4 may comprise a second conductive pattern 143d and a third conductive pattern 145d. Respective conductive patterns 143d and 145d included in the fourth gate electrode GE4 may include shapes and arrangement substantially the same as those of respective conductive patterns 143b and 145b included in the second gate electrode GE2.

The first conductive patterns 133a and 133c and the second conductive patterns 143a, 143b, 143c and 143d may be conductive layers to adjust work functions. The first conductive patterns 133a and 133c and the second conductive patterns 143a to 143d may have different materials. In some example embodiments, the first conductive patterns 133a and 133c may include metal nitride layers. For example, the first conductive patterns 133a and 133c may include at least one of TiN, TaN, WN, HfN, TiAlN, TaAlN and any combination thereof. The first conductive patterns 133a and 133c may include, for example, TiN. The second conductive patterns 143a to 143d may include aluminum (Al) and a metal carbide. The metal carbide may be a compound comprising carbon (C) and at least one of Ti, Ta, W, Ru, Nb, Mo, Hf and La. The second conductive patterns 143a to 143d may include, for example, TiAlC. The third conductive patterns 145a, 145b, 145c and 145d may include, for example, tungsten. The first to fourth gate electrodes GE1 to GE4 may each comprise a barrier conductive pattern (not shown) between corresponding one of the second conductive patterns 143a to 143d and corresponding one of the third conductive patterns 145a to 145d. The barrier conductive pattern may include a metal nitride. In some example embodiments, the first conductive patterns 133a and 133c for adjusting work functions may be further included in the first and third gate electrodes GE1 to GE3, respectively, such that the first and third gate electrodes GE1 to GE3 may have work functions greater than those of the second and fourth gate electrodes GE2 and GE4 inclusive of the second and third conductive patterns 143b and 143d, respectively. The difference of work function may affect threshold voltage of transistor.

The gate electrodes GE1 to GE4, the gate dielectric patterns 131a to 131d and the source/drain regions SD1 to SD4 may constitute the first to fourth transistors 10 to 40. In same example embodiments, the first transistor 10 and the second transistor 20 may have different types. In this case, the first and second transistors 10 and 20 may each be a low voltage transistor which operates under low driving voltage (that is, having low threshold voltage) or a high voltage transistor which operates under high driving voltage (that is, having high threshold voltage). In some embodiments, the first and second transistor 10 and 20 may be of the same type. In this case, one of the first and second transistors 10 and 20 may be a low voltage transistor and the other of the first and second transistors 10 and 20 may be a high voltage transistor.

Likewise, the third and fourth transistors 30 and 40 may have different types or be of the same type. In case that the third and fourth transistors 30 and 40 have different types, the third and fourth transistors 30 and 40 may be low voltage transistors or high voltage transistors. In case that the third and fourth transistors 30 and 40 are of the same type, one of the third and fourth transistors 30 and 40 may be a low voltage transistor and the other of the third and fourth transistors 30 and 40 may be a high voltage transistor.

Figure 5:
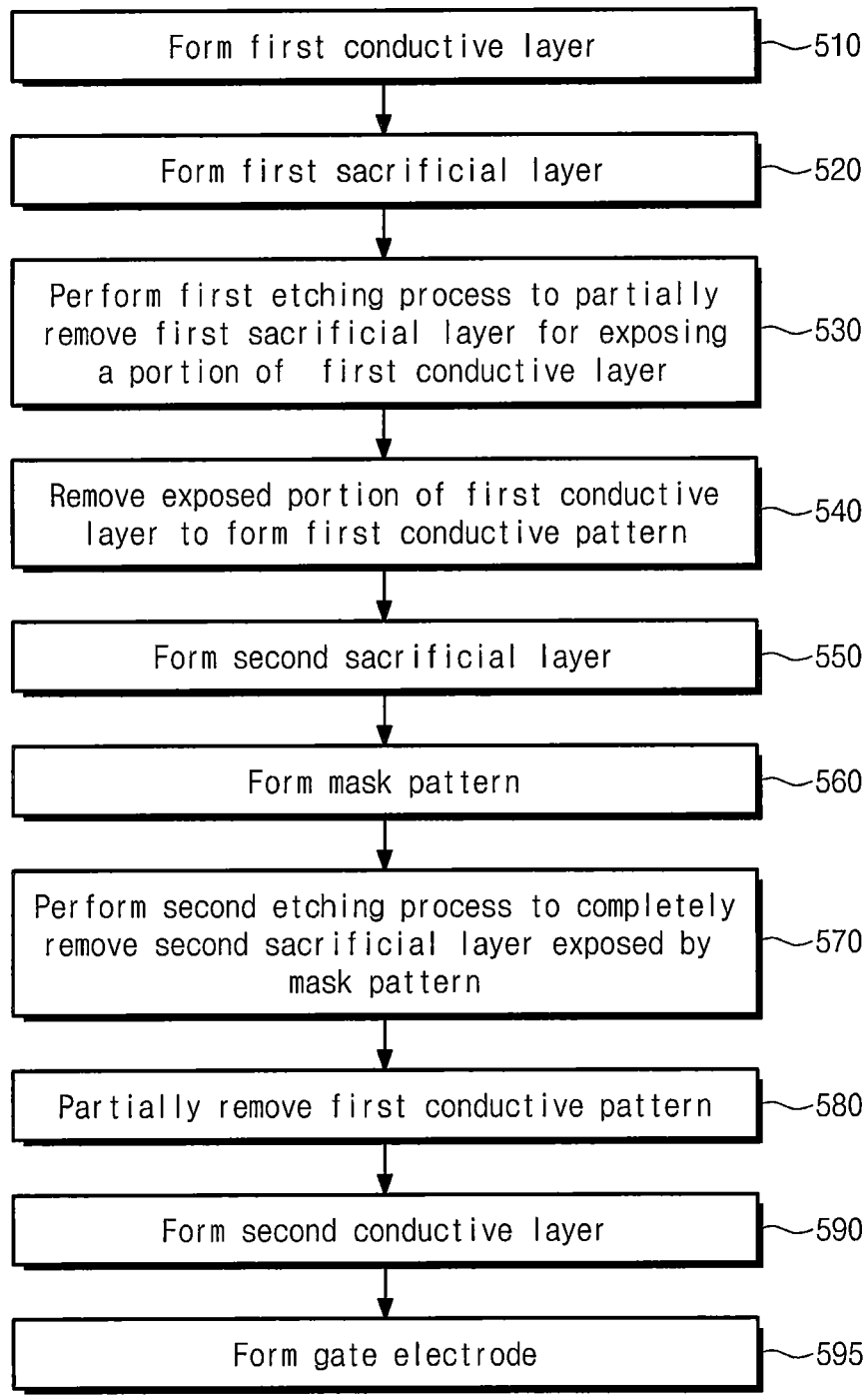
FIG. 5 is a flow chart diagram illustrating methods for forming a gate electrode according to some example embodiments of the present inventive concept.
Figure 6:
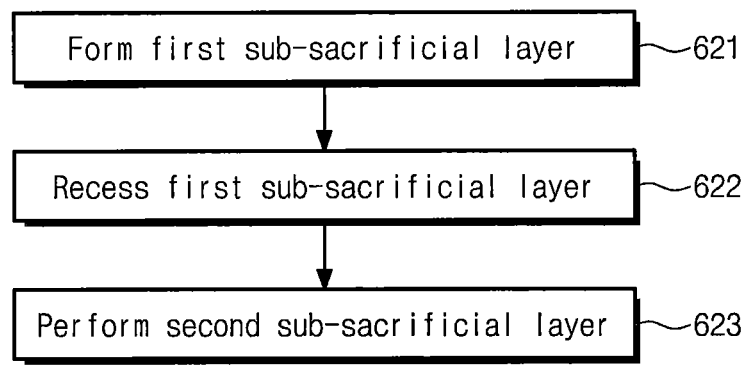
FIG. 6 is a flow chart diagram illustrating operation 520 in detail of FIG. 5.

FIGS. 2A to 4A, 7A, 10A to 14A, and 16A are plan views illustrating methods for fabricating a semiconductor device according to some example embodiments of the present inventive concept. FIGS. 2B to 4B, 7B, 10B to 14B, and 16B are cross-sectional views taken along lines I-I', II-II', III-III', and IV-IV' of FIGS. 2A to 4A, 7A, 10A to 14A, and 16A, respectively. FIGS. 2C to 4C, 7C, 10C to 14C, and 16C are cross-sectional views taken along lines A-A', B-B', C-C' and D-D' of FIGS. 2A to 4A, 7A, 10A to 14A, and 16A, respectively. FIG. 5 is a flow chart diagram illustrating methods for forming a gate electrode according to some example embodiments of the present inventive concept. FIG. 6 is a flow chart diagram illustrating operation 520 in detail of FIG. 5. FIGS. 15A and 15B are enlarged cross-sectional views illustrating portion C of FIG. 14C.

Figure 2A:
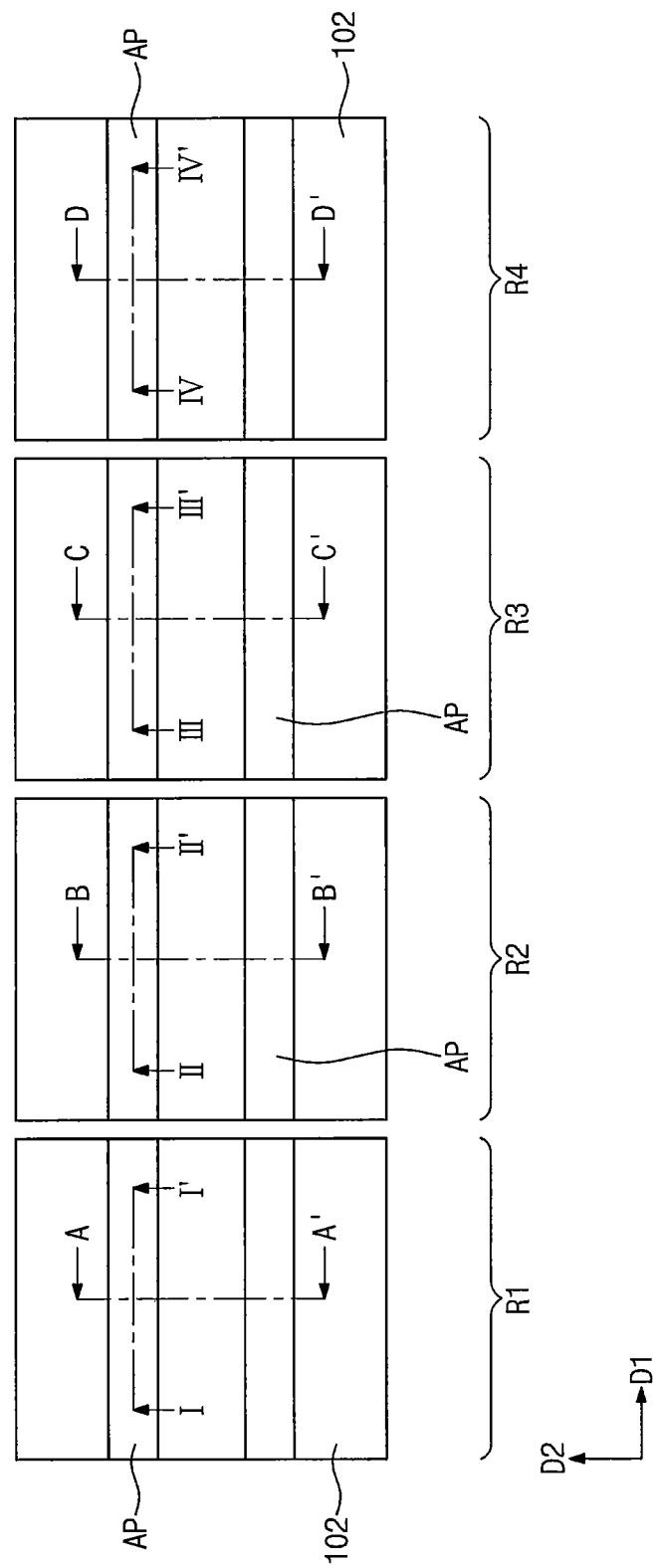
Figure 2B:
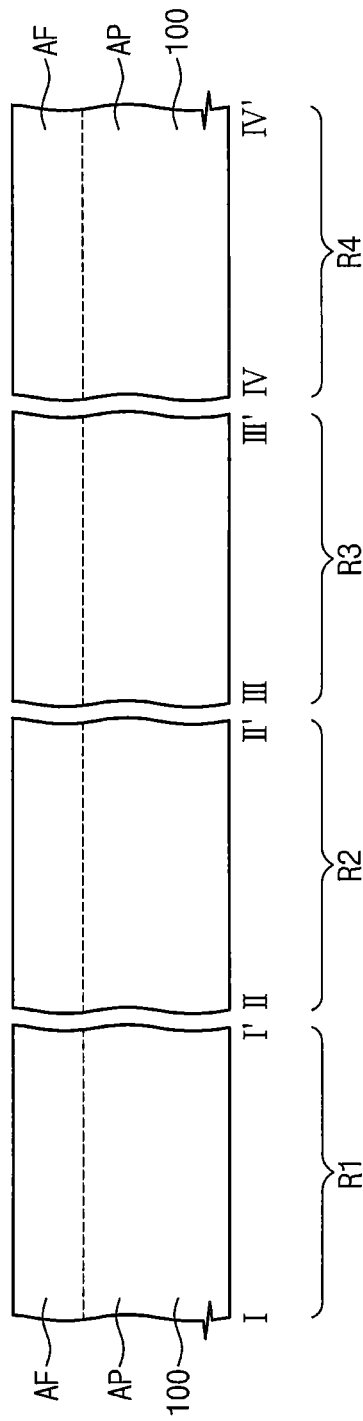
Figure 2C:
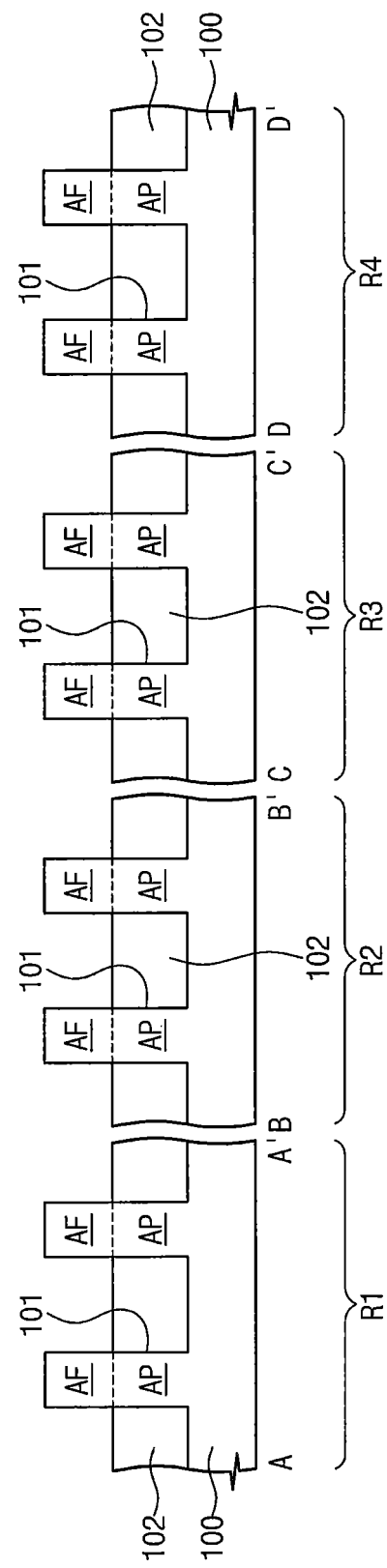

Referring to FIGS. 2A, 2B and 2C, a substrate 100 may be provided to include first to fourth regions R1 to R4. The substrate 100 may be, for example, a bulk silicon substrate. However, the present inventive concept is not limited thereto. The substrate 100 may be formed of different semiconductor materials.

Trenches 101 may be formed in the substrate 100 to define active patterns AP at respective first to fourth regions R1 to R4. In some embodiments, the trenches 101 may be formed by forming mask patterns on the substrate 100 and then performing an anisotropic etching process using the mask patterns as an etch mask. Device isolation patterns 102 may be formed in the trenches 101 to expose upper sidewalls of the active patterns AP provided in the respective first to fourth regions R1 to R4. The device isolation patterns 102 may be formed of, for example, a high density plasma oxide layer, an SOG (spin on glass) layer, and/or a CVD oxide layer. In some embodiments, the device isolation patterns 102 may be formed by forming device isolation layers filling the trenches 101 and then etching the device isolation layers until upper portions of the active patterns AP provided in the respective first to fourth regions R1 to R4 are exposed. The active patterns AP may each be a portion of the substrate 100. Active fins AF may be defined by the upper portions of the active patterns AP exposed by the device isolation patterns 102.

In some other example embodiments, the active patterns AP may be formed by forming epitaxial layers on the substrate 100 and then patterning the epitaxial layers. In this case, the active patterns AP of the respective regions R1 to R4 may be formed of a material substantially the same as that of the substrate 100. Alternatively, the active patterns AP may be formed of a material having lattice constant and/or band gap different from those of a material of the substrate 100. For example, the substrate 100 may include a single crystalline silicon, and the active patterns AP may include Ge, SiGe and/or SiC.

The active patterns AP may each include a shape of line or bar extending between the device isolation patterns 102. A pair of the active patterns AP may extend in a first direction D1 and be spaced apart from each other in a second direction D2 in respective first to fourth regions R1 to R4, as shown in FIG. 2A. The present inventive concept is not limited thereto. One or more than three active patterns AP may be formed in the respective first to fourth regions R1 to R4. The active patterns AP included in one of the first to fourth regions R1 to R4 may extend in the second direction D2 and be spaced apart from each other in the first direction D1.

Figure 3A:
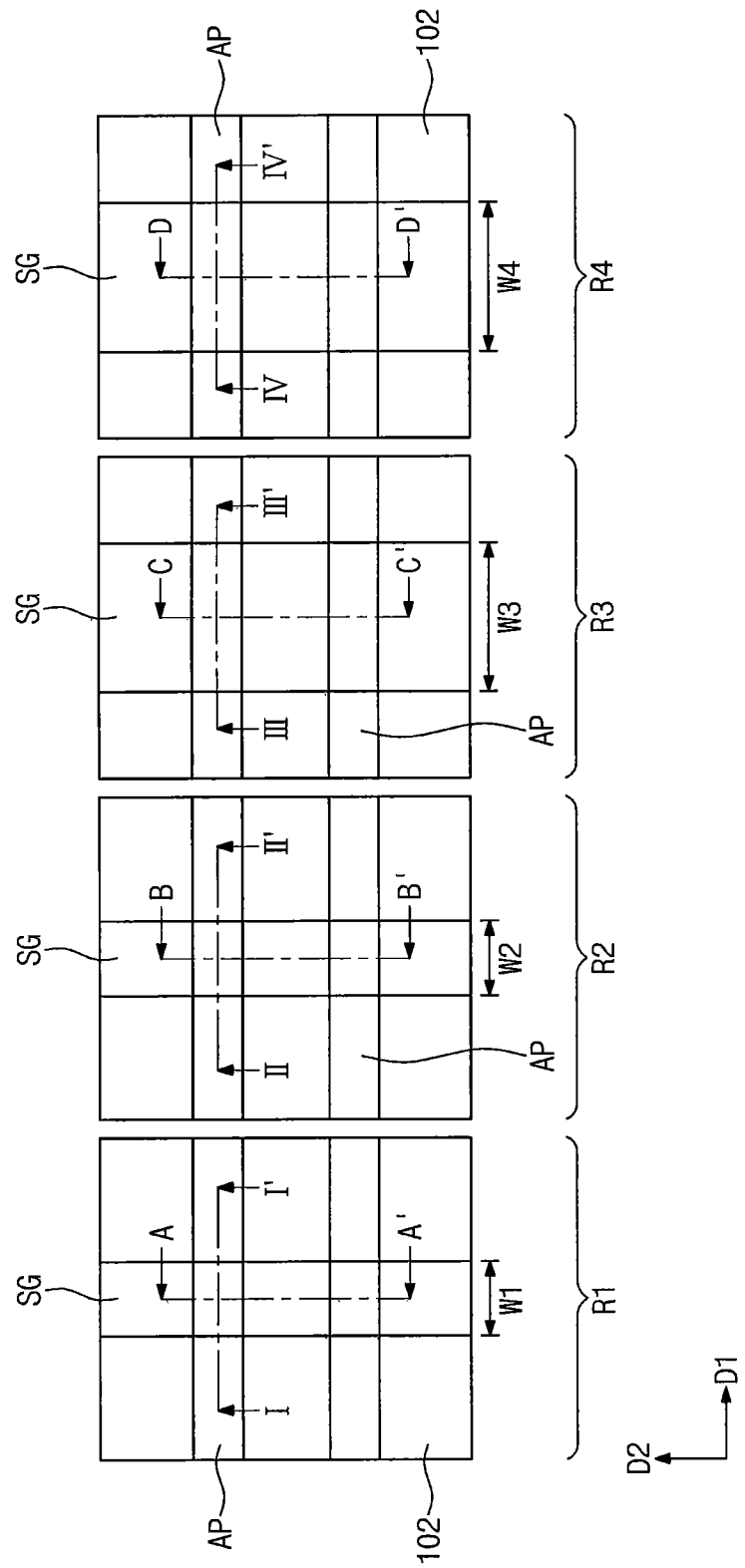
Figure 3B:
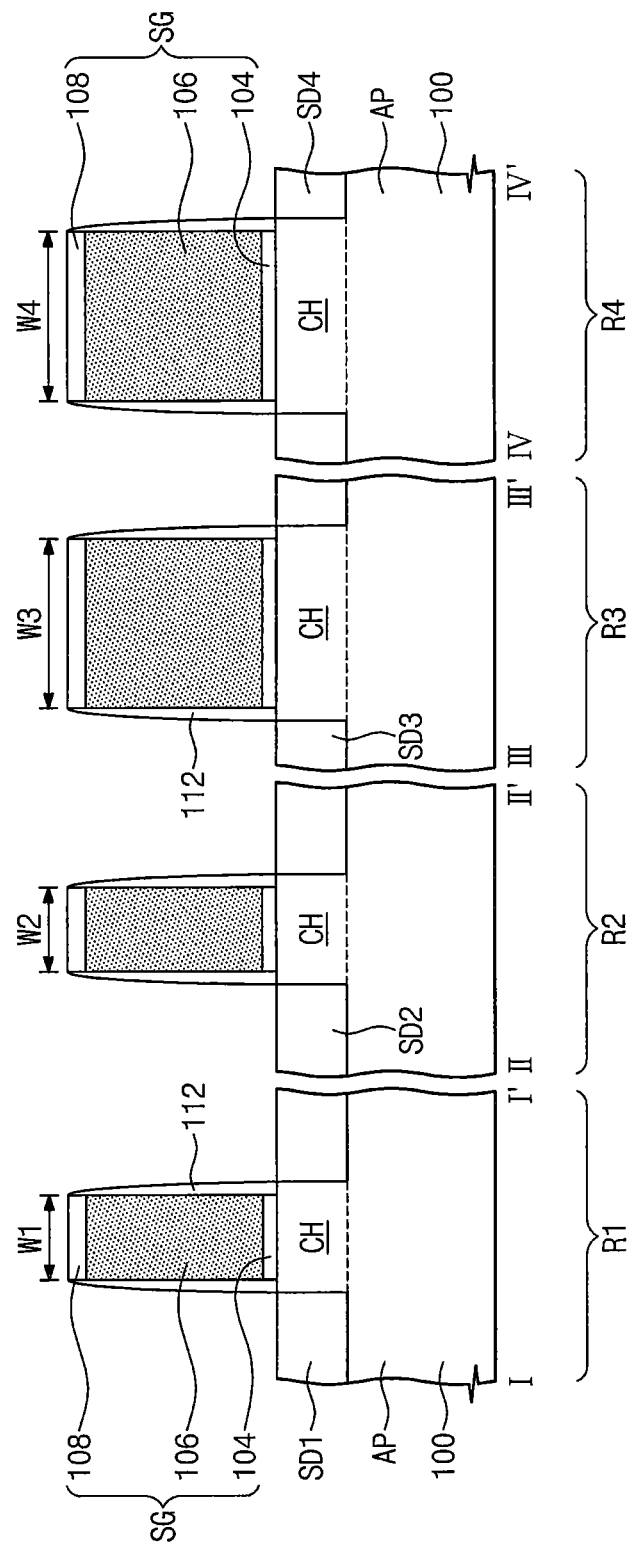
Figure 3C:
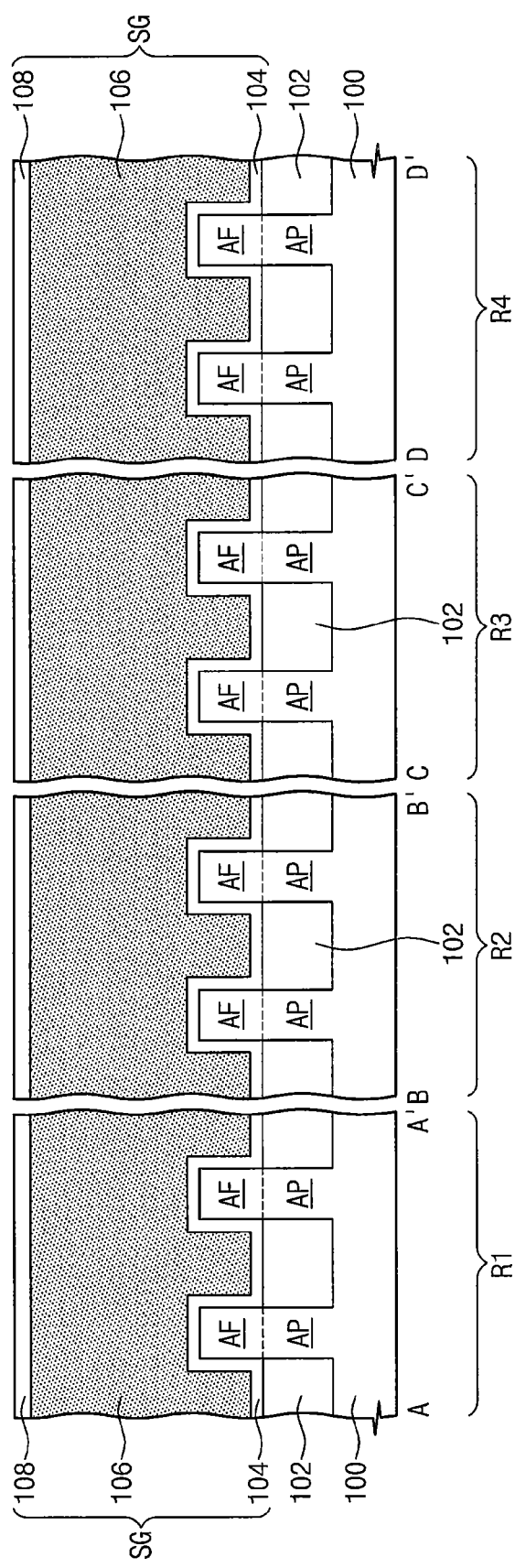

Referring to FIGS. 3A, 3B and 3C, a sacrificial gate structure SG may be formed on the substrate 100 to cross the active patterns AP included in corresponding first to fourth regions R1 to R4. The sacrificial gate structure SG of the corresponding first to fourth regions R1 to R4 may comprise an etch stop pattern 104, a sacrificial gate pattern 106 and a gate mask pattern 108 stacked on one another.

For example, an etch stop layer and a sacrificial gate layer may be sequentially formed on an entire top surface of the substrate 100 to cover the active fins AF. The etch stop layer may include, for example, a silicon oxide. The sacrificial gate layer include a material having a different etch selectivity with respect to the etch stop layer. For example, the sacrificial gate layer may include poly silicon. After forming the sacrificial gate layer, a planarization process may be performed on a top surface of the sacrificial layer. The gate mask patterns 108 may be formed on the planarized sacrificial gate layer and then an anisotropic etching process may be performed using the gate mask patterns 108 as an etch mask. The sacrificial gate patterns 106, extending in the second direction D2 to cross the active fins AF, may therefore be respectively formed on the substrate 100 of the corresponding first to fourth regions R1 to R4. The gate mask patterns 108 may include, for example, a silicon nitride.

Next, the etch stop layer exposed by the sacrificial gate patterns 106 may be removed to form the etch stop patterns 104 under the sacrificial gate patterns 106. The etch stop patterns 104 may respectively extend along a bottom surface of the corresponding sacrificial gate patterns 106 to cover a top surface and opposing sidewalls of the corresponding active fins AF.

The sacrificial gate structures SG of the first to fourth regions R1 to R4 may have first to fourth widths W1 to W4, respectively. In some example embodiments, the first and second widths W1 and W2 may respectively be less than each of the third and fourth widths W3 and W4. The first width W1 may be substantially the same as the second width W2, and the third width W3 may be substantially the same as the fourth width W4. However, the present inventive concept is not limited thereto. In some other example embodiments, the first to fourth widths W1 to W4 may be different from each other.

Gate spacers 112 may be successively formed on sidewalls of the sacrificial gate structures SG. In some example embodiments, the gate spacers 112 may be formed by forming a gate spacer layer conformally on the substrate 100 having the sacrificial gate structures SG formed thereon and performing an anisotropic etching process until top surfaces of the sacrificial gate structures SG are exposed. The gate spacers 112 may include, for example, a silicon nitride.

After forming the gate spacers 112, first to fourth source/drain regions SD1 to SD4 may be formed in the first to fourth regions R1 to R4, respectively.

In some example embodiments, the source/drain regions SD1 to SD4 may be formed by removing the active patterns AP on the opposing sidewalls of the sacrificial gate structures SG and forming epitaxial layers. In the fabrication of CMOS semiconductor device, the epitaxial layer may be formed by forming a first epitaxial layer for NMOFET source/drain region and a second epitaxial layer for PMOSFET source/drain region. In some example embodiments, the first epitaxial layer may be formed to exert tensile strain and the second epitaxial layer may be formed to exert compressive strain. For example, the first epitaxial layer may be formed of silicon (Si) or silicon carbide (SiC) and the second epitaxial layer may be formed of silicon germanium (SiGe), but the present embodiment is not limited thereto. In case that the source/drain regions SD1 to SD4 are formed of epitaxial layers, the source/drain regions SD1 to SD4 may elevate over top surfaces of the channel regions CH otherwise as shown in FIG. 3B. In some embodiments, the source/drain regions SD1 to SD4 may be formed by implanting n-type or p-type impurities into the active fins AF at opposing sides of the sacrificial gate structure SG, which may be used as an ion implantation mask.

The formation of the source/drain regions SD1 to SD4 may define the channel regions CH on the active fins AF. The channel region CH may be a portion of the active fin AF positioned below the sacrificial structure SG and interposed between corresponding ones of the source/drain regions SD1 to SD4.

Figure 4A:
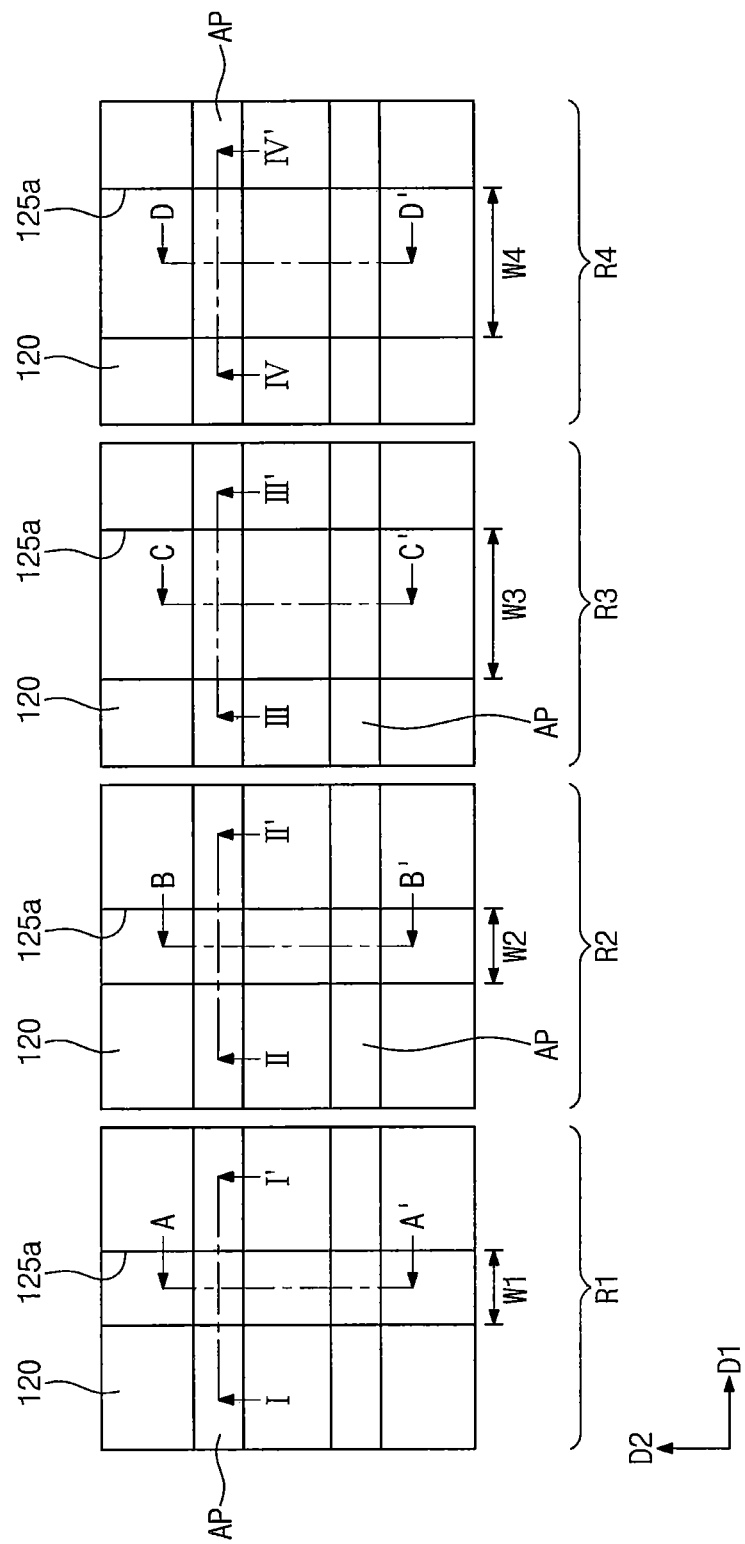
Figure 4B:
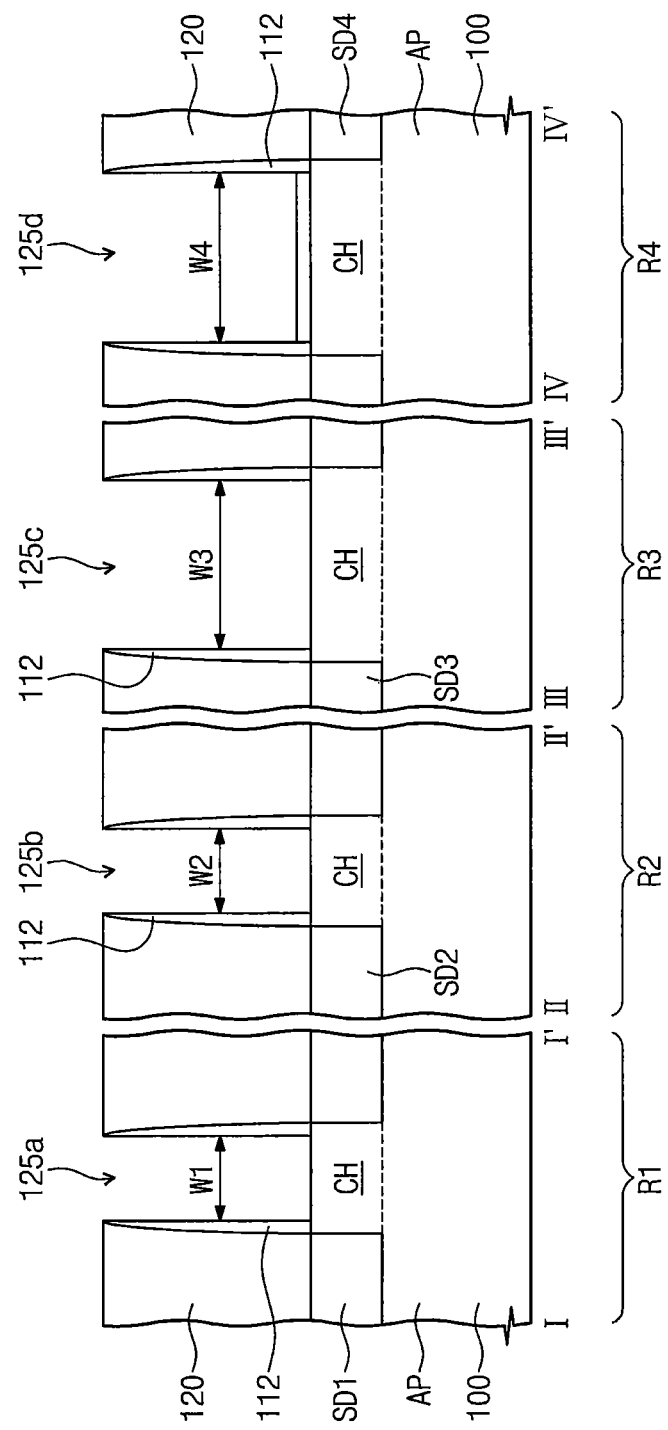
Figure 4C:
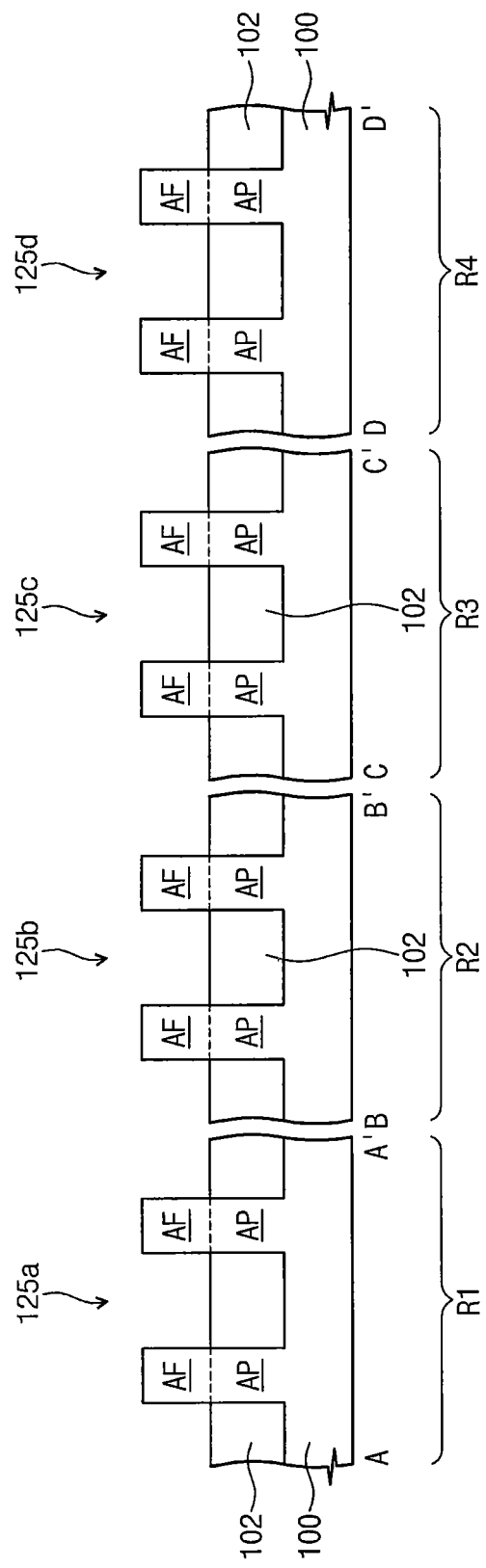

Referring to FIGS. 4A, 4B and 4C, an interlayer dielectric layer 120 may be formed on the entire top surface of the substrate 100. The interlayer dielectric layer 120 may be formed to cover the source/drain regions SD1 to SD4 and the sacrificial gate structures SG. The interlayer dielectric layer 120 may include an insulating material such as a silicon oxide, a silicon nitride, a silicon carbide or a silicon oxynitride. Thereafter, a planarization process may be performed on the interlayer dielectric layer 120 until top surfaces of the sacrificial gate patterns 106 are exposed. The planarization process for the interlayer dielectric layer 120 may be performed by using an etch back and/or a CMP.

Next, the sacrificial gate patterns 106 and the etch stop patterns 104 may be removed. The removal of the sacrificial gate patterns 106 and the etch stop patterns 104 may be performed by selectively etching the sacrificial gate patterns 106 and the etch stop patterns 104. As a result, first to fourth grooves 125a, 125b, 125c and 125d may be formed in the first to fourth regions R1 to R4, respectively. The first to fourth grooves 125a to 125d may each expose the active patterns AP and extend in the second direction D2. The first to fourth grooves 125a to 125d may each include a width substantially the same as or similar to that of the corresponding sacrificial gate pattern SG. For example, the first to fourth grooves 125a to 125d may include the first to fourth widths W1 to W4, respectively. Respective grooves 125a to 125d may include opposing sidewalls defined by the gate spacers 112. The first to fourth widths W1 to W4 may be respectively defined by distances between the gate spacers 112 facing each other where corresponding gate electrodes GE1 to GE4 are interposed between the gate spacers 112. The size relationship of the first to fourth widths W1 to W4 may also be the same as described above.

Thereafter, first to fourth gate electrodes GE1 to GE4 of FIGS. 1A, 1B and 1C may be formed in the first to fourth grooves 125a to 125d, respectively, which will be discussed in detail below.

Referring to FIGS. 5, 7A, 7B, 7C and 7D, a gate dielectric layer 131 may be formed in the first to fourth grooves 125a to 125d. In some example embodiments, the gate dielectric layer 131 may be conformally formed on the entire top surface of the substrate 100 having the first to fourth grooves 125a to 125d formed therein. Therefore, the gate dielectric layer 131 may be formed to have a substantially even thickness on and along inner surfaces of the grooves 125a to 125d and a top surface of the interlayer dielectric layer 120. The gate dielectric layer 131 may cover sidewalls and top surfaces of the respective channel regions CH that are exposed by the grooves 125a to 125d. In some example embodiments, the gate dielectric layer 131 may include a high-k dielectric layer such as a hafnium oxide, a hafnium silicate, a zirconium oxide or a zirconium silicate. The gate dielectric layer 131 may be formed by, for example a chemical vapor deposition (CVD) process and/or an atomic layer deposition (ALD) process. The gate dielectric layer 131 may be formed to partially fill the first to fourth grooves 125a to 125d.

A first conductive layer 133 may be formed on the entire top surface of the substrate 100 on which the gate dielectric layer 131 is formed. Likewise with the gate dielectric layer 131, the first conductive layer 133 may be formed to have a substantially even thickness on inner surfaces of the grooves 125a to 125d and a top surface of the interlayer dielectric layer 120. Therefore, the first conductive layer 133 may cover the sidewalls and top surfaces of the respective channel regions CH. The first conductive layer 133 may be formed to partially fill the first to fourth grooves 125a to 125d. In some example embodiments, the first conductive layer 133 may include TiN, TaN, WN, HfN, TiAlN or HfAlN. The first conducive layer 133 may be a layer capable of adjusting work functions of the first to fourth gate electrodes GE1 to GE4. The first conductive layer 133 may be formed by, for example, a CVD process and/or an ALD process.

A first sacrificial layer 135 may be successively formed on the entire top surface of the substrate 100. The first sacrificial layer 135 may be formed to completely fill the first to fourth grooves 125a to 125d in which the gate dielectric layer 131 and the first conductive layer 133 are formed. In some example embodiments, the first sacrificial layer 135 may be formed of a material having superior gap-fill characteristics and an etch selectivity with respect to the interlayer dielectric layer 120 and the first conducive layer 133. For example, the first sacrificial layer 135 may include a SOH (spin on hardmask) layer formed by a spin coating process. The SOH layer may include a carbon-based SOH layer or a silicon-based SOH layer.

The first sacrificial layer 135 may include a level difference at a top surface thereof. As shown in FIG. 7B, the first sacrificial layer 135 included in the first and second regions R1 and R2 may have the top surface without level difference. On the other side, the first sacrificial layer 135 included in the third and fourth regions R3 and R4 may have the top surface with level difference. Whether the level difference is present or not at the top surface of the first sacrificial layer 135 may be caused by the existence of width differences between the first to fourth grooves 125a to 125d formed in the first to fourth regions R1 to R4. For example, the first sacrificial layer 135 in the third and fourth regions R3 and R4 may be formed to have a concave portion at the top surface thereof while filling the third and fourth grooves 125c and 125d whose corresponding widths are greater than each of the widths of the first and second grooves 125a and 125b. The level difference at the top surface of the first sacrificial layer 135 may result in a reduced process margin of the subsequent etching process for removing the first sacrificial layer 135.

The first sacrificial layer 135 may be formed by performing three operations in order to alleviate the level difference of the first sacrificial layer 135. The following are detailed explanations regarding a method for forming the first sacrificial layer 135 using the three operations with reference to FIGS. 6, 8A to 8C, 9A and 9B.

Figure 7A:
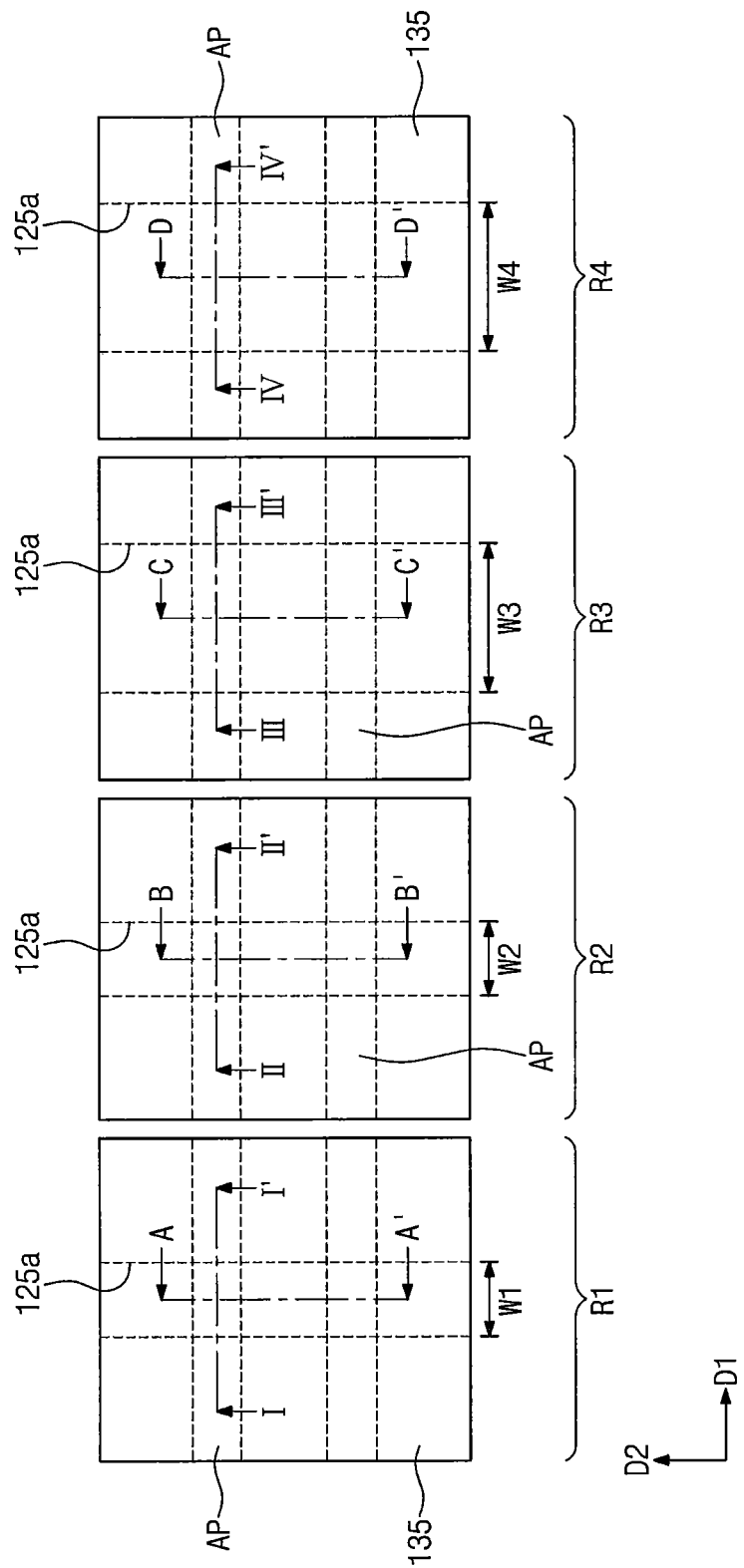
Figure 7B:
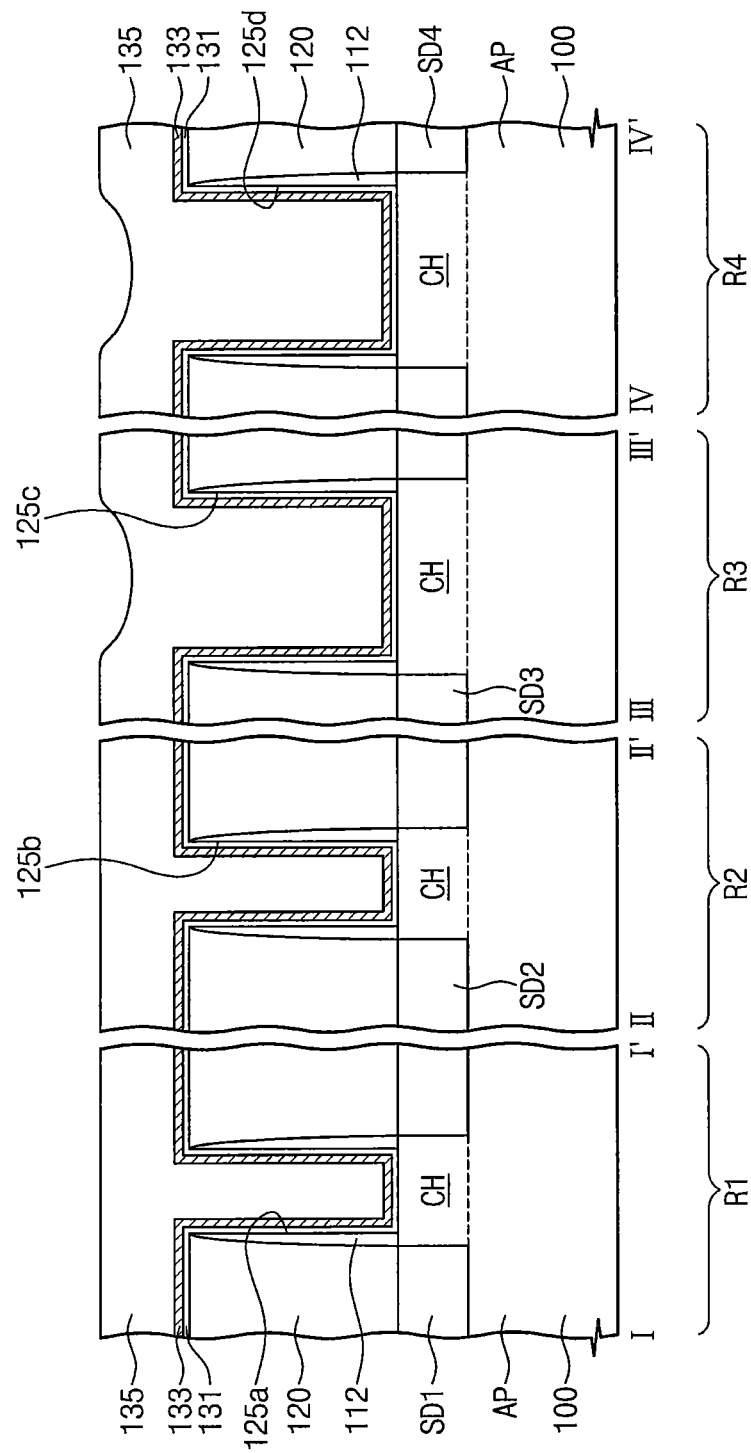
Figure 7C:
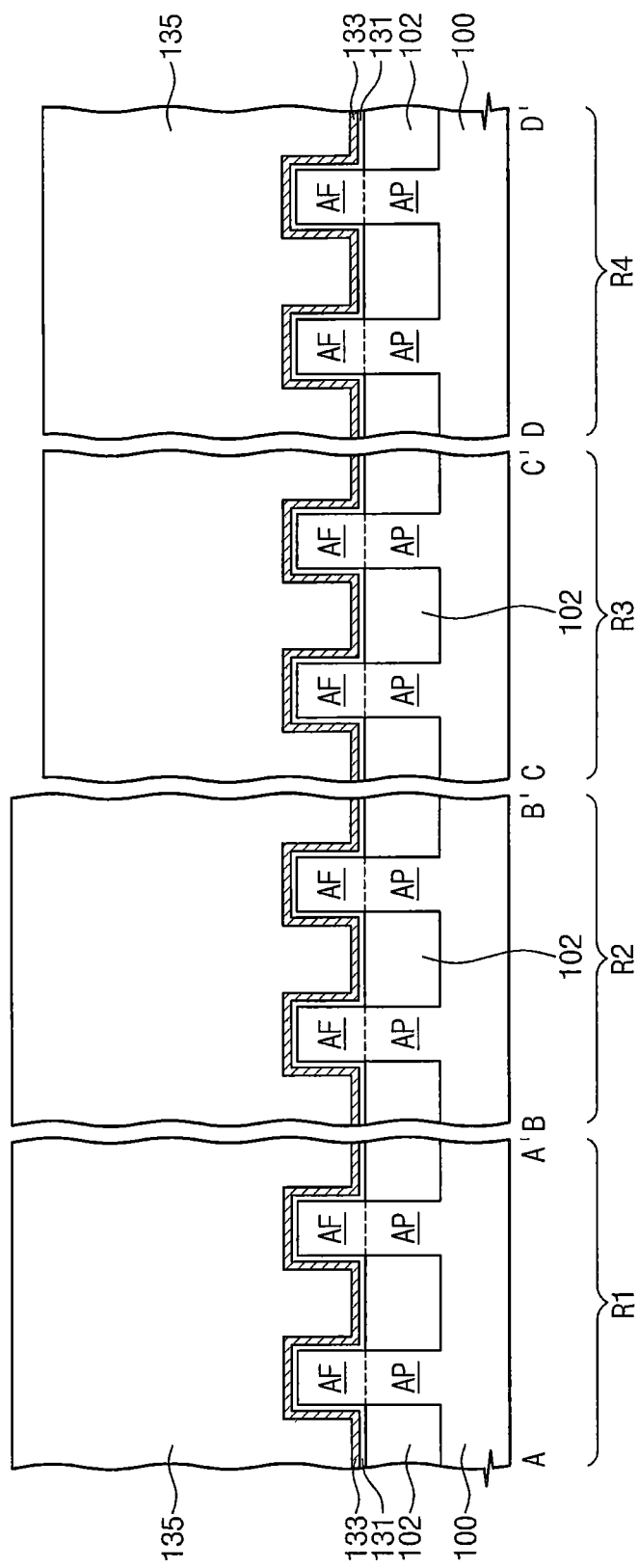
Figure 8B:
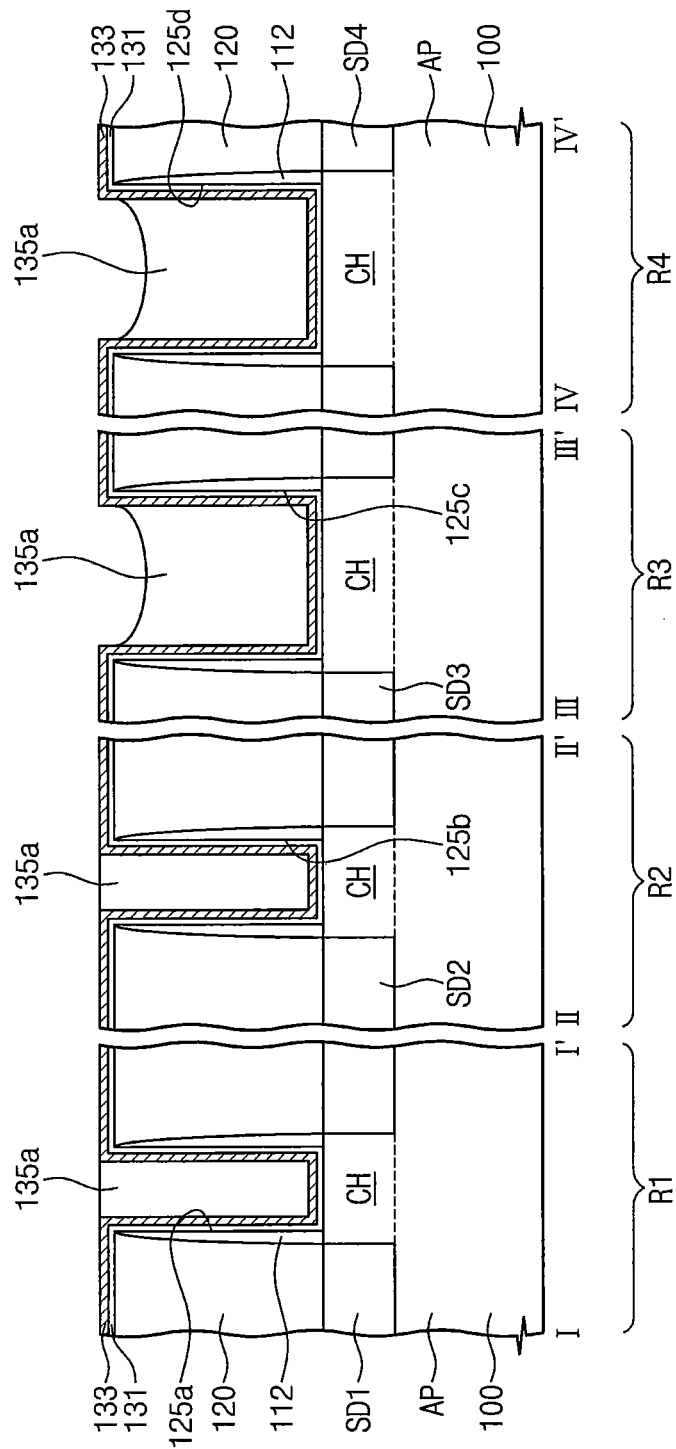
Figure 8C:
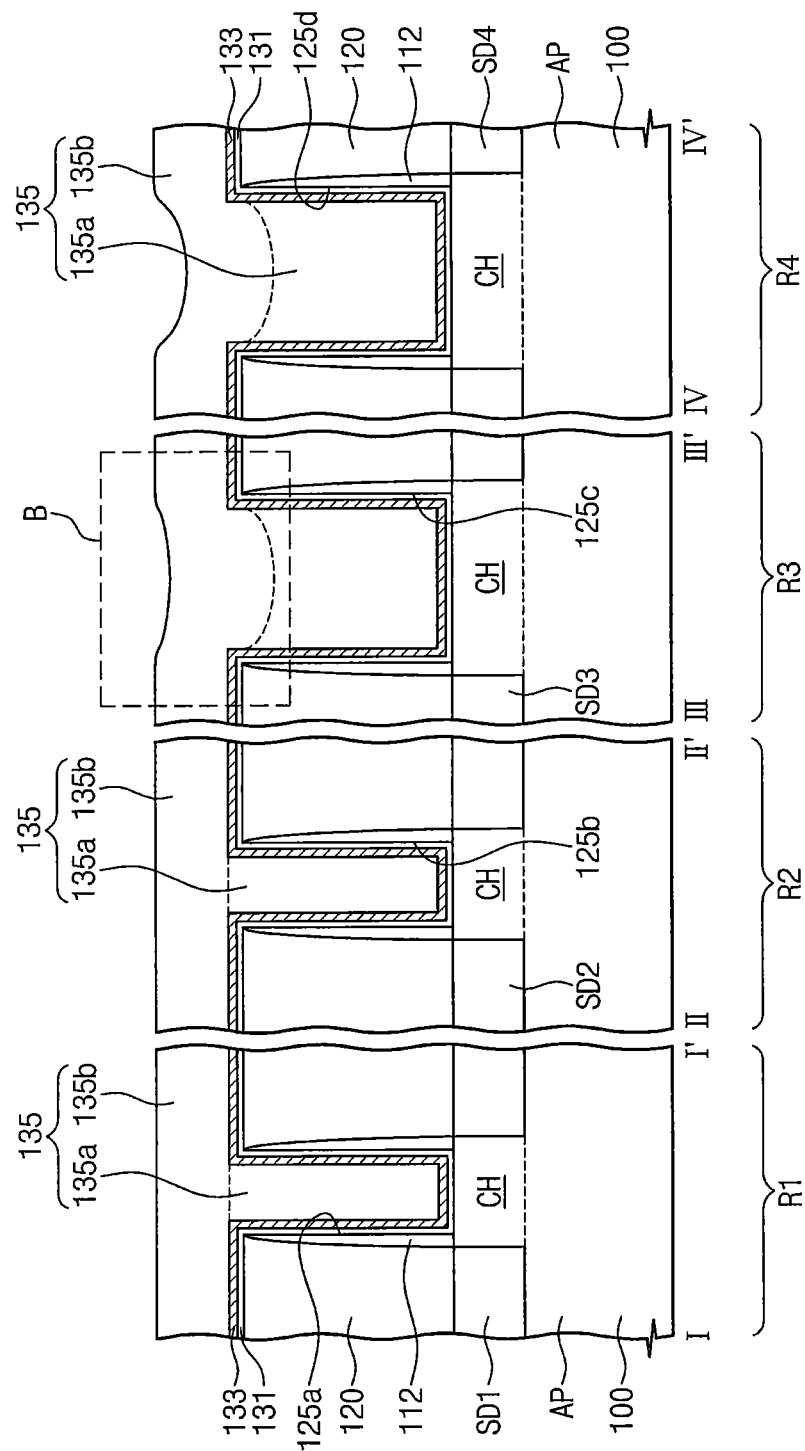
Figure 9A:
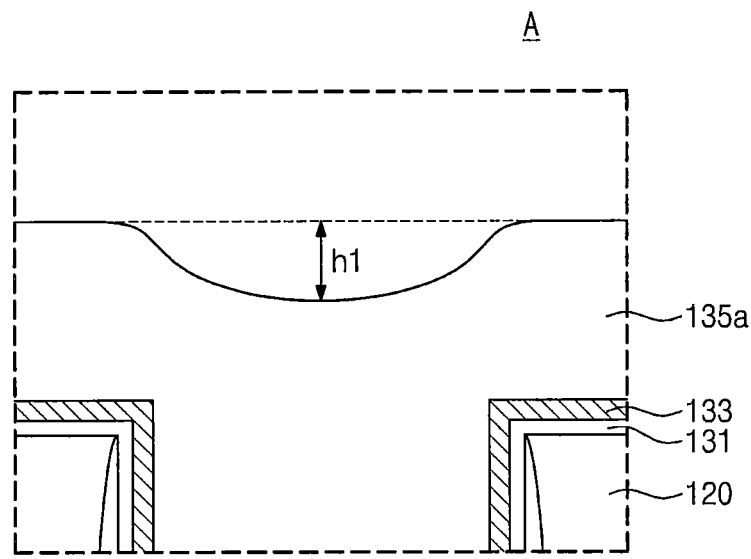
FIG. 9A is an enlarged cross-sectional view of portion A of FIG. 8A.
Figure 9B:
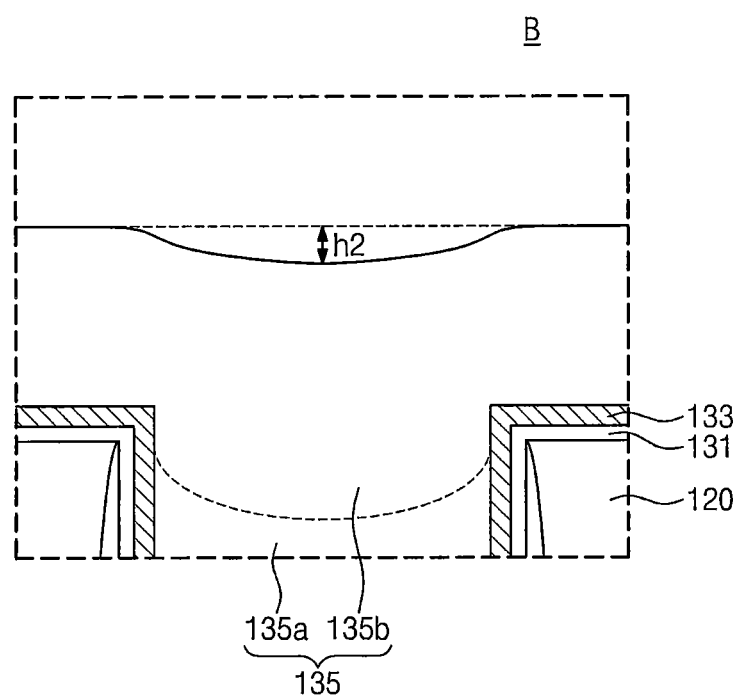
FIG. 9B is an enlarged cross-sectional view of portion B of FIG. 8C.
Figure 10A:
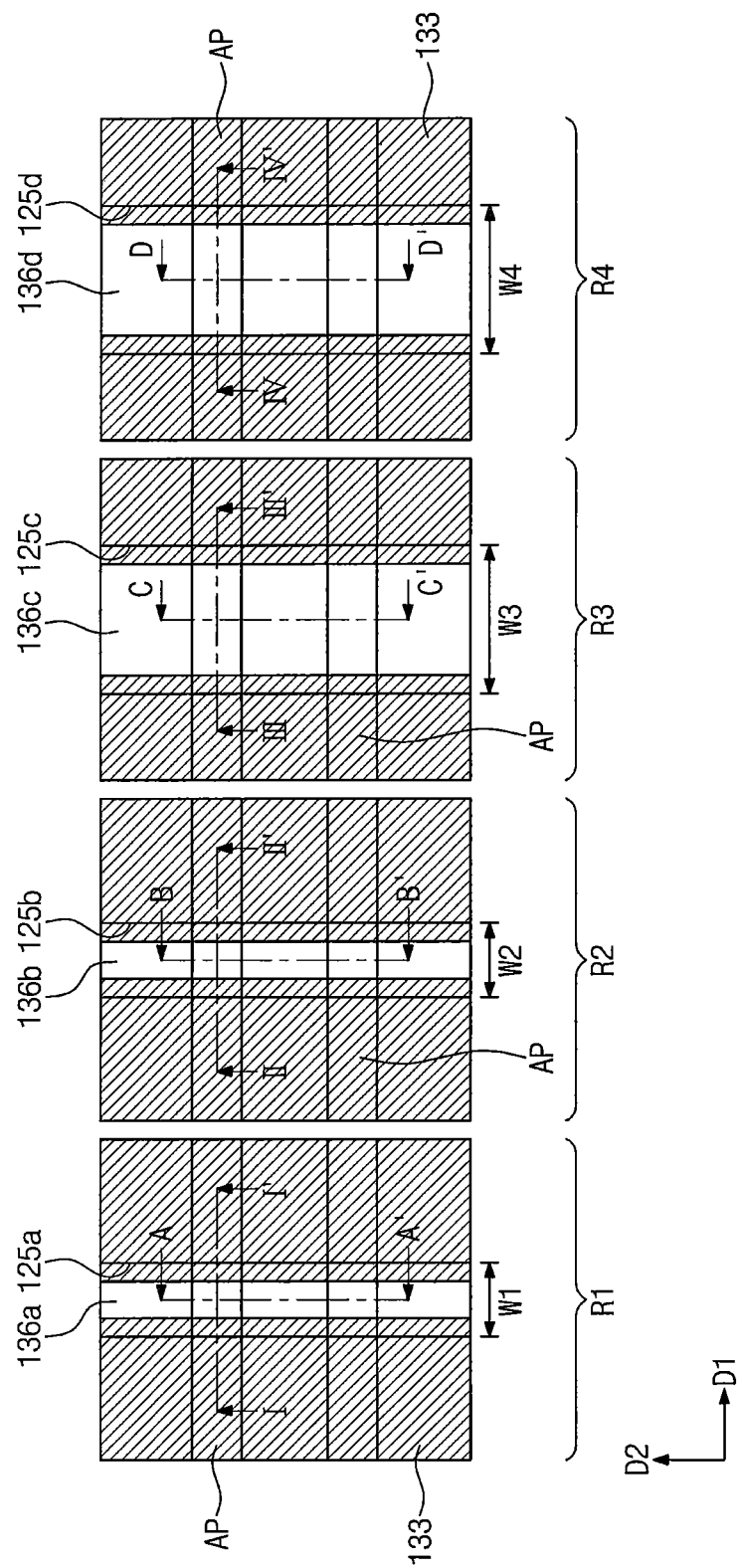
Figure 10B:
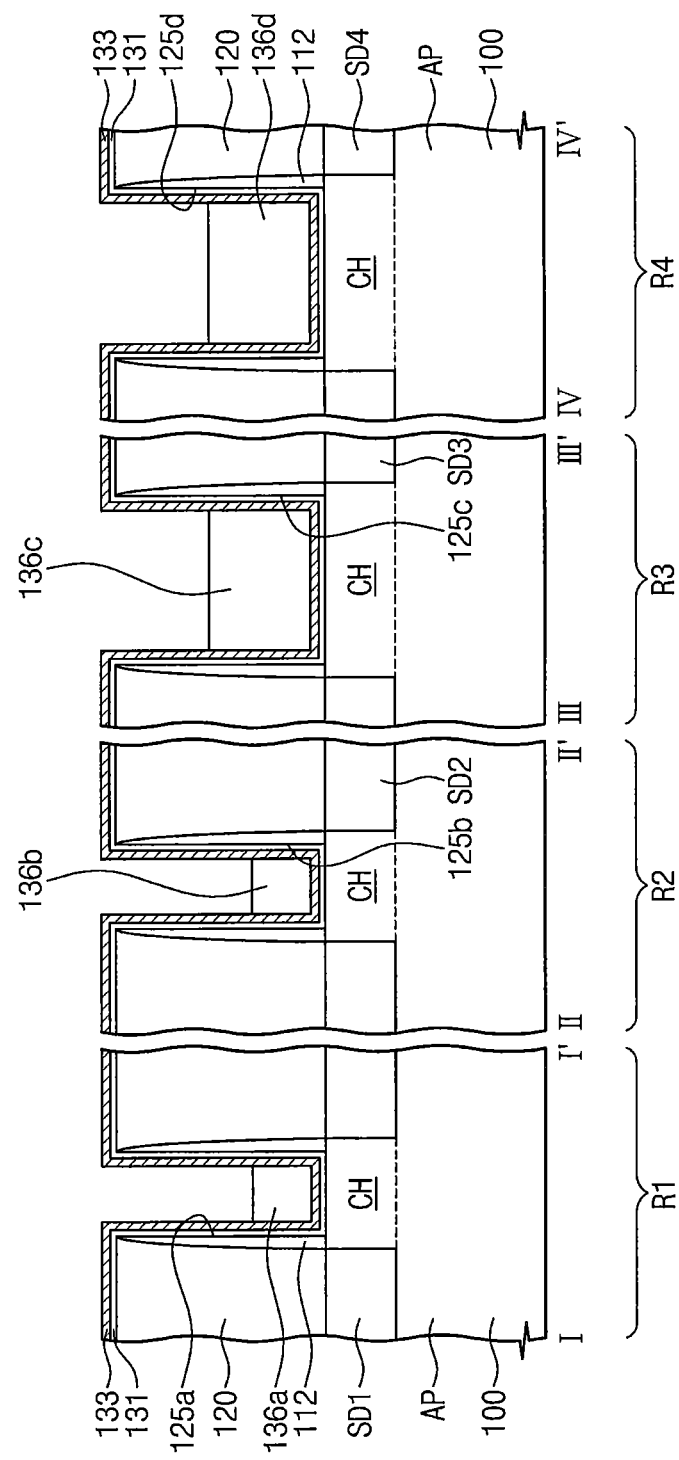
Figure 10C:
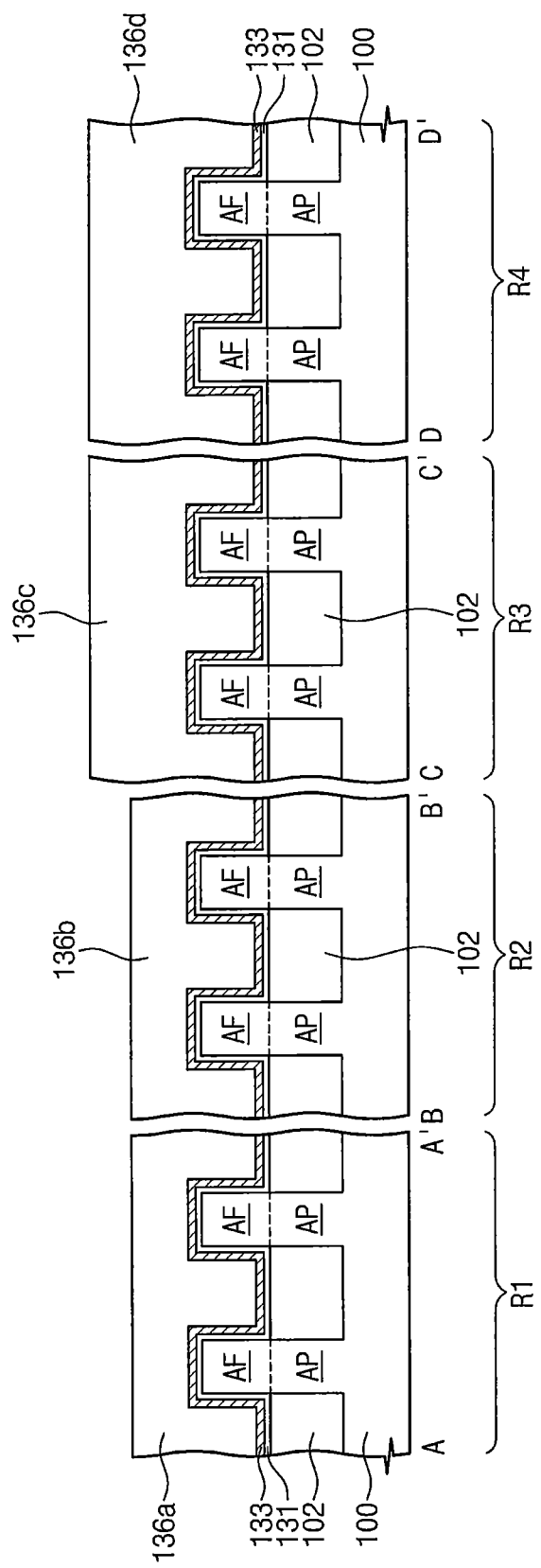

FIGS. 8A to 8C are cross-sectional views, illustrating operations 621 to 623 of FIG. 6, taken along lines I-I', II-II', III-III', and IV-IV' of FIG. 7A. FIG. 9A is an enlarged cross-sectional view of portion A of FIG. 8A. FIG. 9B is an enlarged cross-sectional view of portion B of FIG. 8C.

Referring to FIGS. 6, 8A, 8B and 8C, the first sacrificial layer 135 may be formed by forming a first sub-sacrificial layer 135a (block 621), recessing the first sub-sacrificial layer 135a (block 622), and forming a second sub-sacrificial layer 135b (block 623). The first sub-sacrificial layer 135a may be formed to fill the first to fourth grooves 125a to 125d. The first sub-sacrificial layer 135a may include the SOH layer formed by the spin coating process as described above. As a result, the first sub-sacrificial layer 135a included in the first and second regions R1 and R2 may have a flat top surface, while the first sub-sacrificial layer 135a included in the third and fourth regions R3 and R4 may have a top surface having a level difference of a first height h1 between an uppermost top surface and an lowermost top surface, as shown in FIG. 9A.

Thereafter, the first sub-sacrificial layer 135a may be recessed to expose the first conductive layer 133 on the interlayer dielectric layer 120. The recess of the first sub-sacrificial layer 135a may be performed by an etching process using the first conductive layer 133 as an etch stop layer. As a result of the etching process, the first sub-sacrificial layer 135a included in the first and second regions R1 and R2 may have a top surface substantially coplanar with a top surface of the exposed first conductive layer 133, while the first sub-sacrificial layer 135a included in the third and fourth regions R3 and R4 may have a top surface positioned in the third and fourth grooves 125c and 125d. In other words, the first sub-sacrificial layer 135a included in the third and fourth regions R3 and R4 may have the top surface positioned below the top surface of the interlayer dielectric layer 120 and above the top surface of the channel region CH.

A second sub-sacrificial layer 135b may be formed on the recessed first sub-sacrificial layer 135a. The second sub-sacrificial layer 135b may include a material the same as that of the first sub-sacrificial layer 135a and be formed by a process identical to that for forming the first sub-sacrificial layer 135a. As a result, the second sub-sacrificial layer 135b included in the first and second regions R1 and R2 may have a flat top surface, while the second sub-sacrificial layer 135b included in the third and fourth regions R3 and R4 may have a top surface having a level difference of a second height h2 between an uppermost top surface and an lowermost top surface, as shown in FIG. 9B. The level difference of the second height h2 at the top surface of the second sub-sacrificial layer 135b may be less than the level difference of the first height h1 at the top surface of the first sub-sacrificial layer 135a. Consequently, the height or level difference may be mitigated in the first sacrificial layer 135 formed by the three steps compared with the first sacrificial layer 135 formed by different processes (e.g., the first sacrificial layer 135 is formed to have only the first sub-sacrificial layer 135a). It may therefore be possible to acquire improved process margin of the subsequent etching process for removing the first sacrificial layer 135.

Referring to FIGS. 5, 10A, 10B and 10C, a first etching process may be performed on the entire top surface of the substrate 100 to remove a portion of the first sacrificial layer 135 and expose a portion of the first conductive layer 133 (block 530). Therefore, the first to fourth grooves 125a to 125d may be respectively provided with first to fourth sacrificial patterns 136a to 136d by which the first conductive layer 133 is partially exposed. The first to fourth sacrificial patterns 136a to 136d may respectively have top surfaces positioned below the top surface of the interlayer dielectric layer 120 and above the top surfaces of the channel regions CH. For example, the first to fourth sacrificial patterns 136a to 136d may respectively have the top surfaces positioned above a top surface of a portion of the first conductive layer 133 on the top surface of the channel region CH.

In some example embodiments, the first and second sacrificial patterns 136a and 136b may have the top surfaces whose levels are different from those of the third and fourth sacrificial patterns 136c and 136d. For example, the top surfaces of the first and second sacrificial patterns 136a and 136b may be positioned below the top surfaces of the third and fourth sacrificial patterns 136c and 136d. However, the present inventive concept is not limited thereto. The top surfaces of the first and second sacrificial patterns 136a and 136b may be positioned to be substantially coplanar to or below the top surfaces of the third and fourth sacrificial patterns 136c and 136d. Levels of the top surfaces of the first to fourth sacrificial patterns 136a to 136d may be implemented or determined by adjusting the conditions of the first etching process. The first etching may be discussed in detail below.

In some example embodiments, the first etching process may be an anisotropic dry etching process. In detail, the first etching process may be a plasma etching process performed in a plasma environment generated from an etch gas. For example, the first etching process may be performed in a plasma etching apparatus utilizing an ICP (inductively coupled plasma) or a dual frequency CCP (capacitively charged coupled plasma).

The first etching process may be an etching process using a reverse loading effect by which the etch rate varies in accordance with the widths of the grooves 125a to 125d. In other words, the first etching process may be performed in such a way that an etch rate of the first sacrificial layer 135 formed in the third and fourth grooves 125c and 125d having wider widths is less than an etch rate of the first sacrificial layer 135 formed in the first and second grooves 125a and 125b having narrower widths.

In some example embodiments, the first etching process may use a mixture of H2 and N2 as an etch gas. In this case, the first etching process may be performed at a temperature about of 30° C. to about 80° C. In the first etching process, etch by-products (e.g., C or Si) of the first sacrificial layer 135 may combine with plasma ions (e.g., H+) produced from an etch gas (e.g., H2) and then be re-deposited on the first sacrificial layer 135 under the etching process. The re-deposited by-products may be a factor to reduce the etch rate of the first sacrificial layer 135 in the grooves 125a to 125d. The re-deposition rate of the by-products may be greater in the third and fourth grooves 125c and 125d having wider widths rather than the first and second grooves 125a and 125b having narrower widths. Consequently, the etch rate of the first sacrificial layer 135 in the third and fourth grooves 125c and 125d may be less than that of the first sacrificial layer 135 in the first and second grooves 125a and 125b.

In some example embodiments, the etch gas may have a mixture ratio (H2/N2) of about 0.5 to about 2. In case that a great difference is present between the narrower widths W1 and W2 of the first and second grooves 125a and 125b and the wider widths W3 and W4 of the third and fourth grooves 125c and 125d, the etch gas of the first etching process may have a high hydrogen (H2) ratio to improve the reverse loading effect. For example, the mixture ratio (H2/N2) of the etch gas may be about 1 or 2.

Moreover, the first etching process may use a pulsed bias power. In other words, as a radio frequency bias power is applied the substrate 100, a pulsed bias power may be periodically supplied in a pulsed on/off mode. The pulse bias power may be applied to enhance the reverse loading effect. In some example embodiments, the pulsed bias power of the first etching process may have a duty ratio of about 0.05 to about 0.75. For example, the duty ratio of the first etching process may be in the range of about 0.25 to about 0.75. The duty ratio may be defined as the percentage of time in which the pulsed bias power is provided, i.e., a ratio of on-time to sum of on-time and off-time.

The followings are more detailed descriptions of the first etching process according to some example embodiments of the present inventive concept.

Comparative Example 1 may be estimated according to following method.

Grooves having different widths are formed in a mold layer, and then a spin coating process is performed to form SOH layers respectively in the grooves. Grooves are formed to include a reference groove and measurement grooves. The reference groove is formed to have a width of 15 nm, and the measurement grooves are formed to have widths of 15 nm, 16 nm, 29 nm, 40 nm, 77 nm, 97 nm and 320 nm, respectively. A first etching process having conditions of Comparative Example 1 is performed on sacrificial layers respectively provided in the grooves, and then etch rates of the sacrificial layers are measured.

Embodiments 1 to 7 are also measured in the same manner as in Comparative Example 1, except that first etching processes having respective conditions are performed on Embodiments 1 to 7.

Table 1 shows process conditions of the first etching processes performed on respective Comparative Example 1 and Embodiments 1 to 7.

TABLE 1

| | Hydrogen Ratio (H2/N2) | Process Temperature (° C.) | Pulsed Bias Power (Wb) | Duty Ratio |
|---|---|---|---|---|
| Comparative Example 1 | 0.625 | 35 | 150 | No Pulse |
| Embodiment 1 | 0.625 | 35 | 150 | 0.25 |
| Embodiment 2 | 0.725 | 35 | 150 | 0.25 |
| Embodiment 3 | 0.625 | 35 | 50 | 0.25 |
| Embodiment 4 | 0.725 | 35 | 50 | 0.25 |
| Embodiment 5 | 0.625 | 35 | 150 | 0.75 |
| Embodiment 6 | 0.625 | 35 | 150 | 0.5 |
| Embodiment 7 | 0.625 | 35 | 50 | 0.75 |

Figure 11:
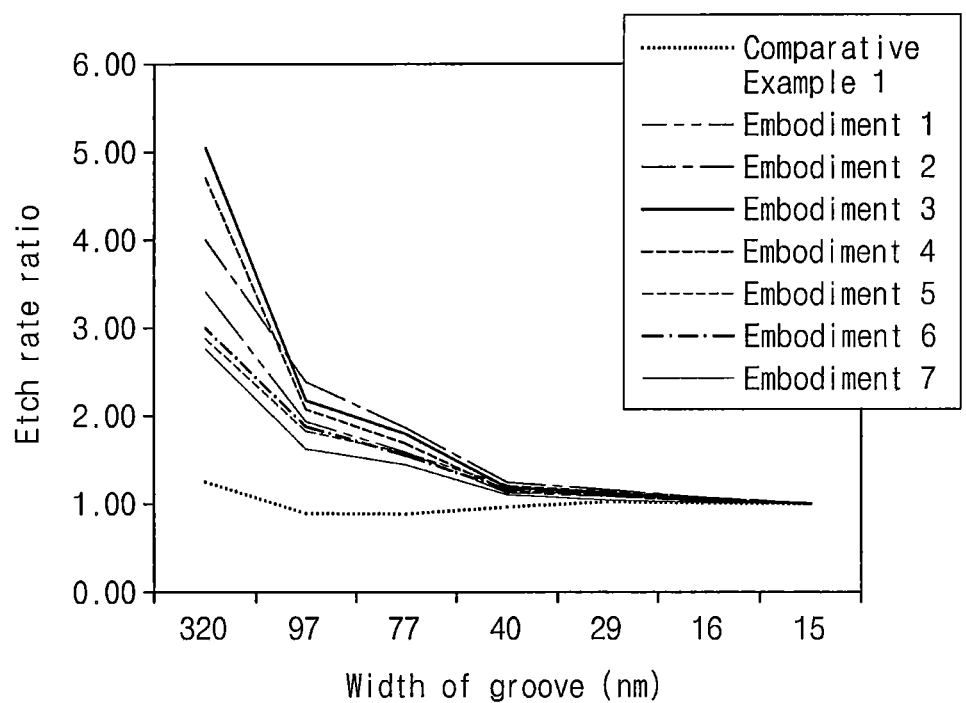

FIG. 11 is a graph showing measured results of etch rate ratios of Comparative Example 1 and Embodiments 1 to 7. In the graph of FIG. 11, the Y axis represents an etch rate ratio, i.e., an etch rate of sacrificial layer in the reference groove divided by an etch rate of sacrificial layer in the measurement grooves, and the X axis indicates widths of measurement grooves.

Referring to FIG. 11, in case where the measurement groove has a width less than 30 nm, respective etch rate ratios of Comparative Example 1 and Embodiments 1 to 7 may be about 1. In case where the measurement groove has a width greater than 30 nm, it can be seen from the graph that the etch rate ratio of Comparative Example 1 may not be greatly changed with respect to the width of the groove, while the etch rate ratios of Embodiments 1 to 7 may gradually increase with the rise of the width of the groove. The gradual increase of the etch rate ratio may mean that the etch rate of the sacrificial layer in the measurement groove may gradually decrease rather than the etch rate of the sacrificial layer in the reference groove. That is, the greater the width difference between the reference groove and the measurement groove, the more the reverse loading effect of the first etching process. Moreover, in case where there is great width difference between the reference groove and the measurement groove (i.e., the width of the measurement groove is 320 nm), the etch rate ratio may increase with the decrease of the duty ratio (see Embodiments 1 to 4), i.e., the reverse loading effect is greater. Further, in case where there is great width difference between the reference groove and the measurement groove (i.e., the width of the measurement groove is 320 nm), an etch rate ratio may be greater at the high hydrogen ratio (Embodiment 2) rather than the low hydrogen ratio (Embodiment 1) under other conditions are identical.

Consequently, it may be seen that the reverse loading effect may be greater with the decrease of the duty ratio and the increase of the hydrogen ratio. However, it may be preferable to select desirable duty ratio of the pulsed bias power for the first etching process and the mixture ratio (H2/N2) of an etch gas. The duty ratio of the pulsed bias power for the first etching process and the mixture ratio (H2/N2) of an etch gas may be appropriately determined considering the width difference between the grooves 125a to 125d, the step height of the first sacrificial layer 135, desired levels of the top surfaces of the sacrificial patterns 136a to 136d, and so forth.

Figure 12A:
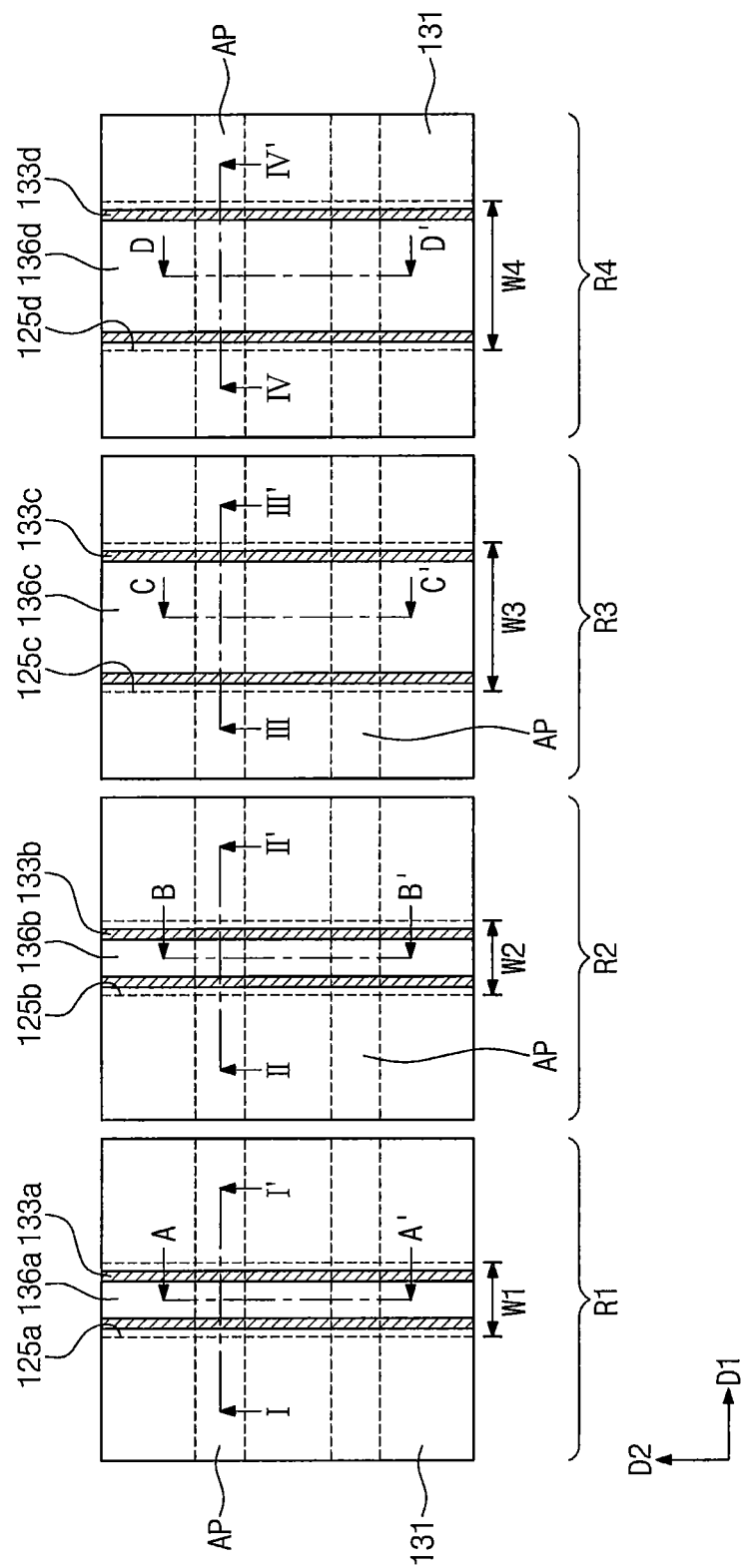
Figure 12B:
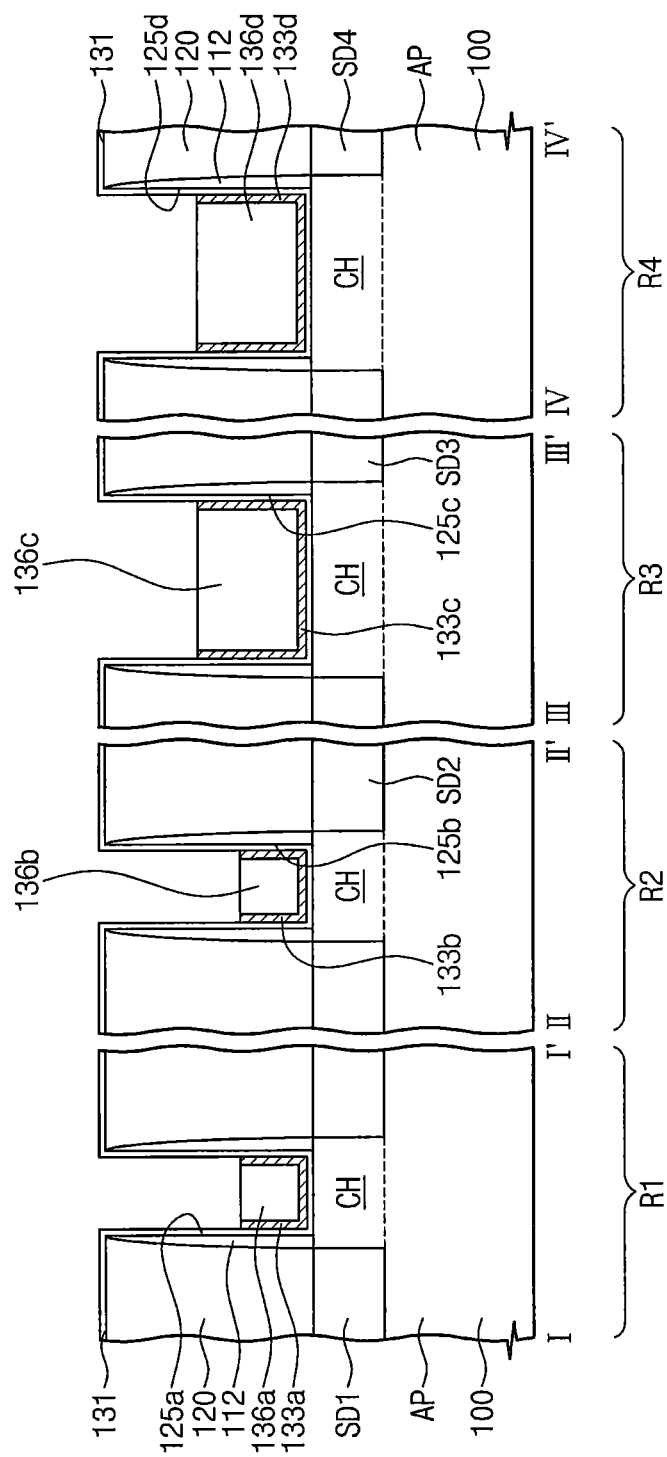
Figure 12C:
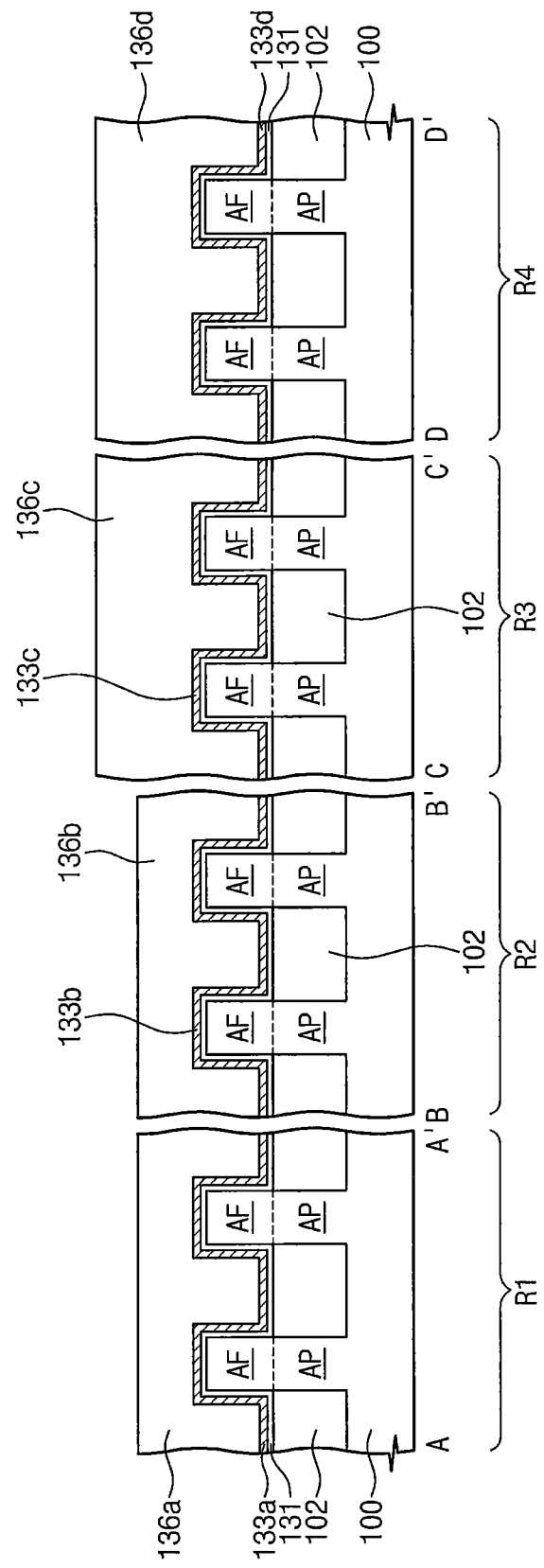

Referring to FIGS. 12A, 12B and 12C, the exposed first conductive layer 133 protruding over the sacrificial patterns 136a to 136d may be removed to form first conductive patterns 133a to 133d respectively provided in the grooves 125a to 125d (block 540). In some example embodiments, a wet etching process may be performed to remove the first conductive layer 133. The wet etching process may use an etchant capable of selectively removing the first conductive layer 133.

The first conductive patterns 133a to 133d may respectively include "U" shapes in a plan view. The first conductive patterns 133a to 133d may respectively include uppermost top surfaces positioned to be substantially the same as the top surfaces of the sacrificial patterns 136a to 136d. The first conductive patterns 133a to 133d may respectively include the uppermost top surfaces positioned below the top surface of the interlayer dielectric layer 120 and above the top surface of the channel region CH. In some example embodiments, as shown in FIG. 12B, the uppermost top surfaces of the first conductive patterns 133a and 133b in the first and second grooves 125a and 125b may be lower than the uppermost top surfaces of the first conductive patterns 133c and 133d in the third and fourth grooves 125c and 125d. However, the present inventive concept is not limited thereto. The uppermost top surfaces of the first conductive patterns 133a and 133b may be substantially the same as or higher that the uppermost top surfaces of the first conductive patterns 133c and 133d.

When a dry etching process is performed to etch regions having different widths, etch rates at wider regions may generally be greater than those at narrower regions owing to loading effects. When a dry etching process is performed on the grooves 125a to 125d having different widths, an over-etching may be occurred to the first sacrificial layer 135 in the third and fourth grooves 125c and 125d having wider widths. As such, the first conductive layer 133 may include exposed portions on the channel regions CH of the third and fourth regions R3 and R4. The height or level difference of the first conductive layer 135 included in the third and fourth regions R3 and R4 may promote the possibility of exposing. Therefore, in order to prevent the over-etching discussed above, it may be required to form a mask pattern for masking the third and fourth grooves 125c and 125d. According to some example embodiments, the first etching process using the reverse loading effect may be performed such that it may be prevented from over-etching the first sacrificial layer 135 in the third and fourth grooves 125c and 125d having wider widths. Consequently, the step 30 may be performed without the formation of separate mask pattern, thereby reaching a simplified process.

The afore-mentioned operations 520 to 540 may be referred to as a first removal process. The first removal process may correspond to a process for enhancing gap-fill margin of subsequent second conductive layer by partially removing the first conductive layer.

Figure 13A:
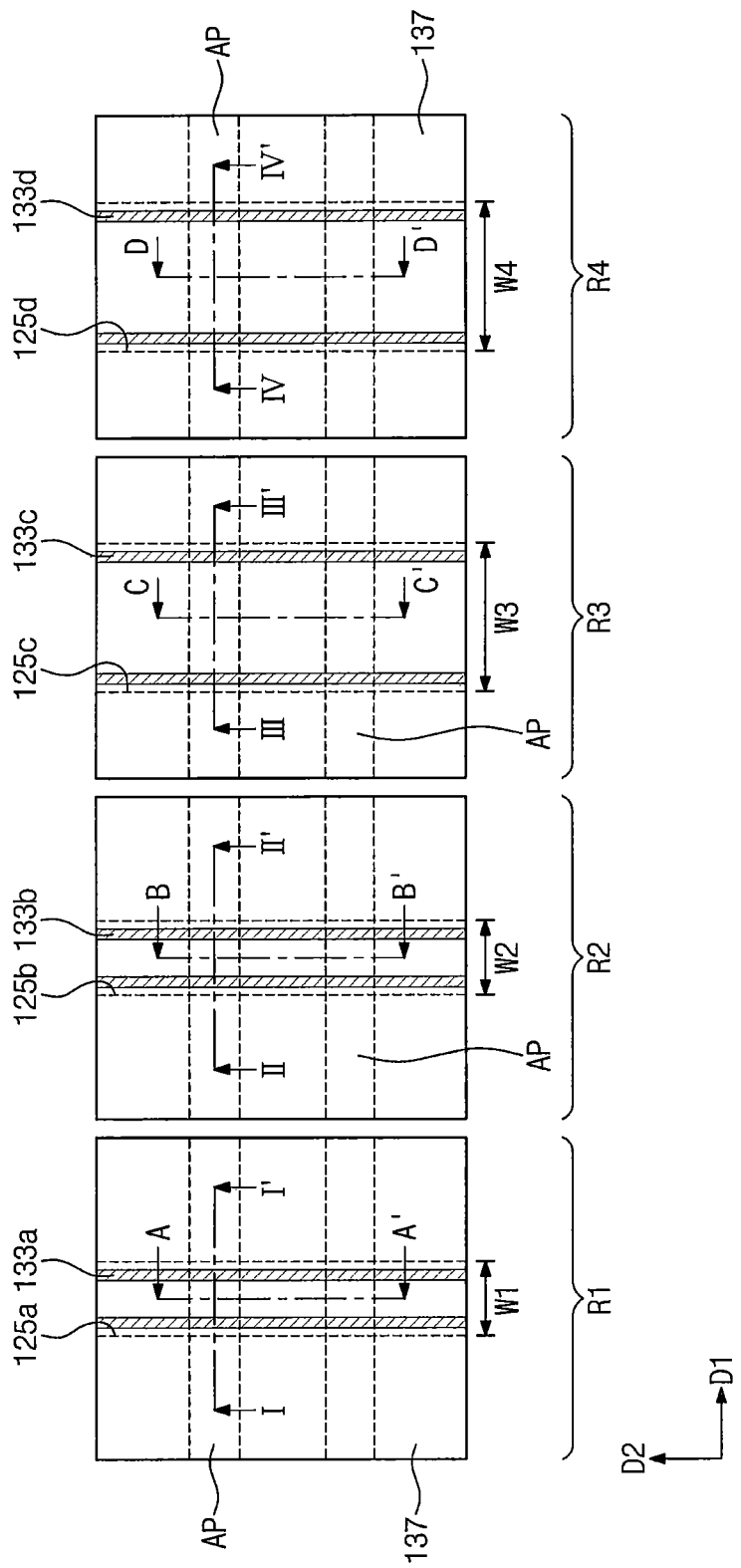
Figure 13B:
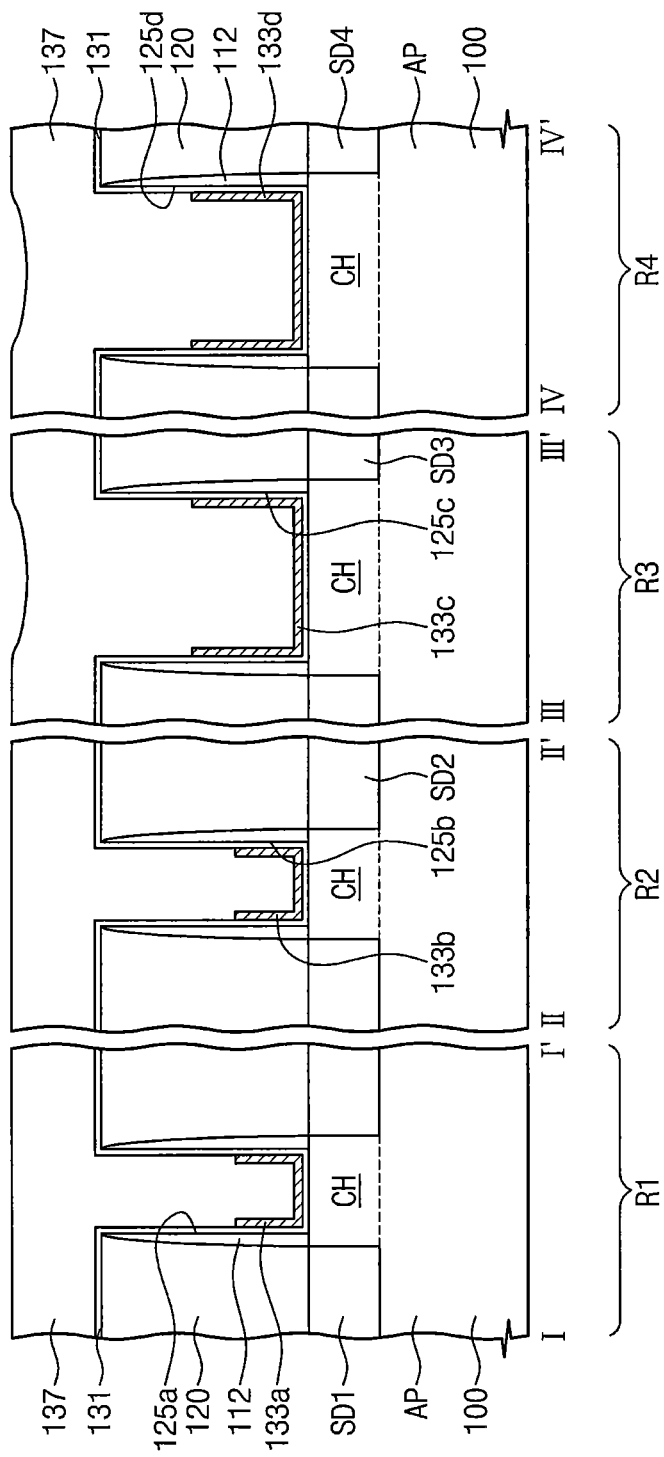
Figure 13C:
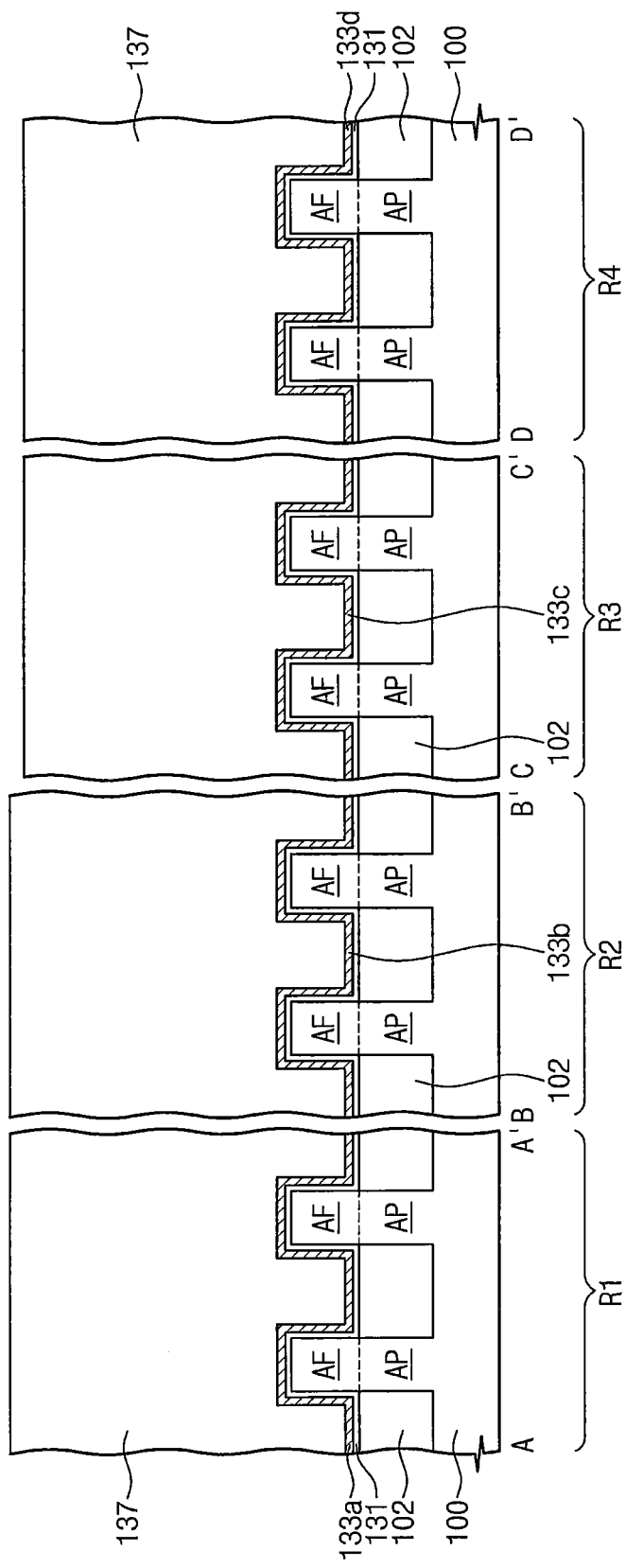

Referring to FIGS. 13A, 13B and 13C, a second sacrificial layer 137 may be formed in the grooves 125a to 125d in which the first conductive patterns 133a to 133d are formed. The second sacrificial layer 137 may be formed through the afore-mentioned operations 621 to 623.

In some example embodiments, the first sacrificial patterns 136a to 136d in the grooves 125a to 125d may be completely removed before the second sacrificial layer 127 is formed. The removal of the first sacrificial patterns 136a to 136d may be performed by, for example, an ashing process and/or a strip process. In some embodiments, the second sacrificial layer 137 may be formed to completely fill the grooves 125a to 125d in which the first sacrificial patterns 136a to 136d and the first conductive patterns 133a to 133d are formed (block 550).

Figure 14A:
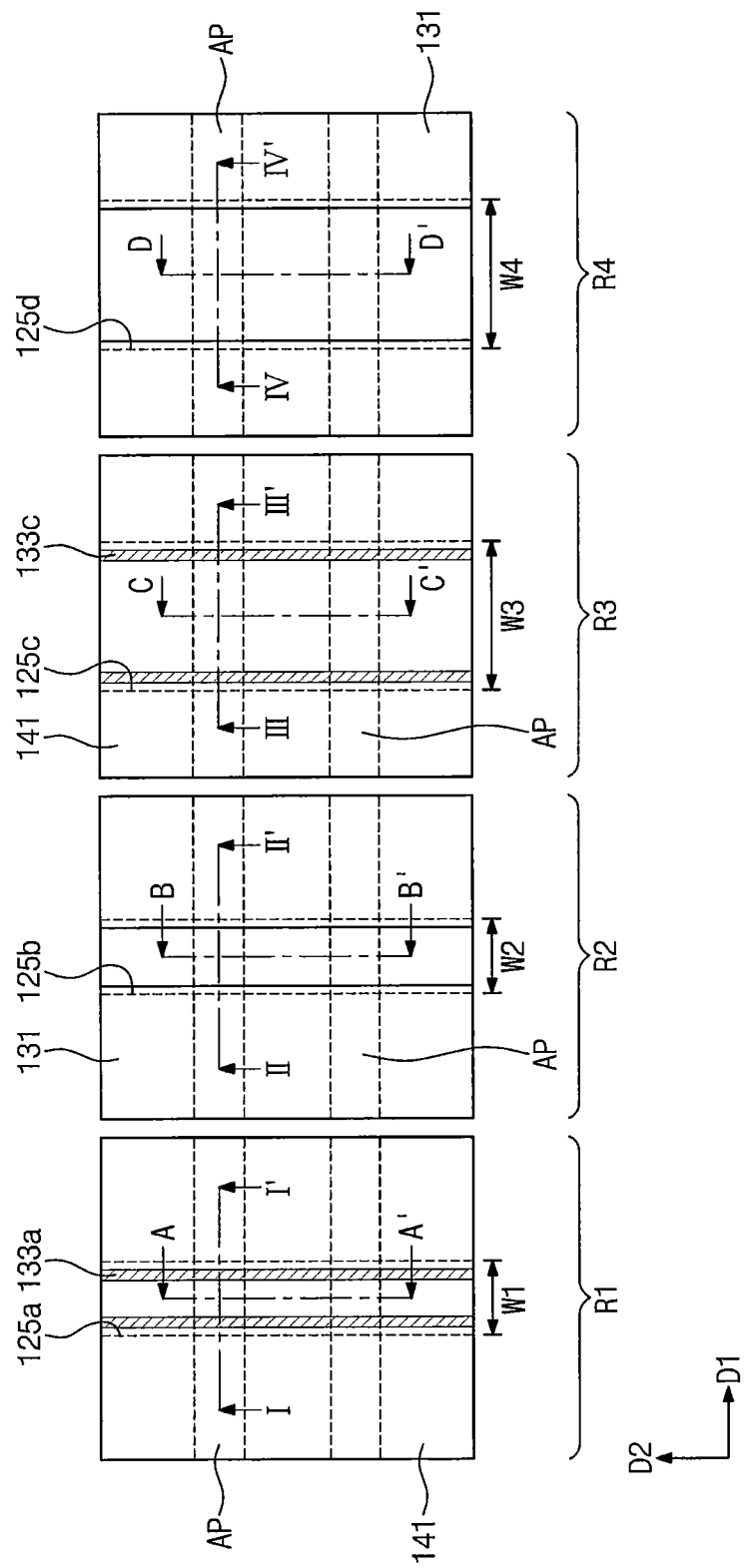
Figure 14B:
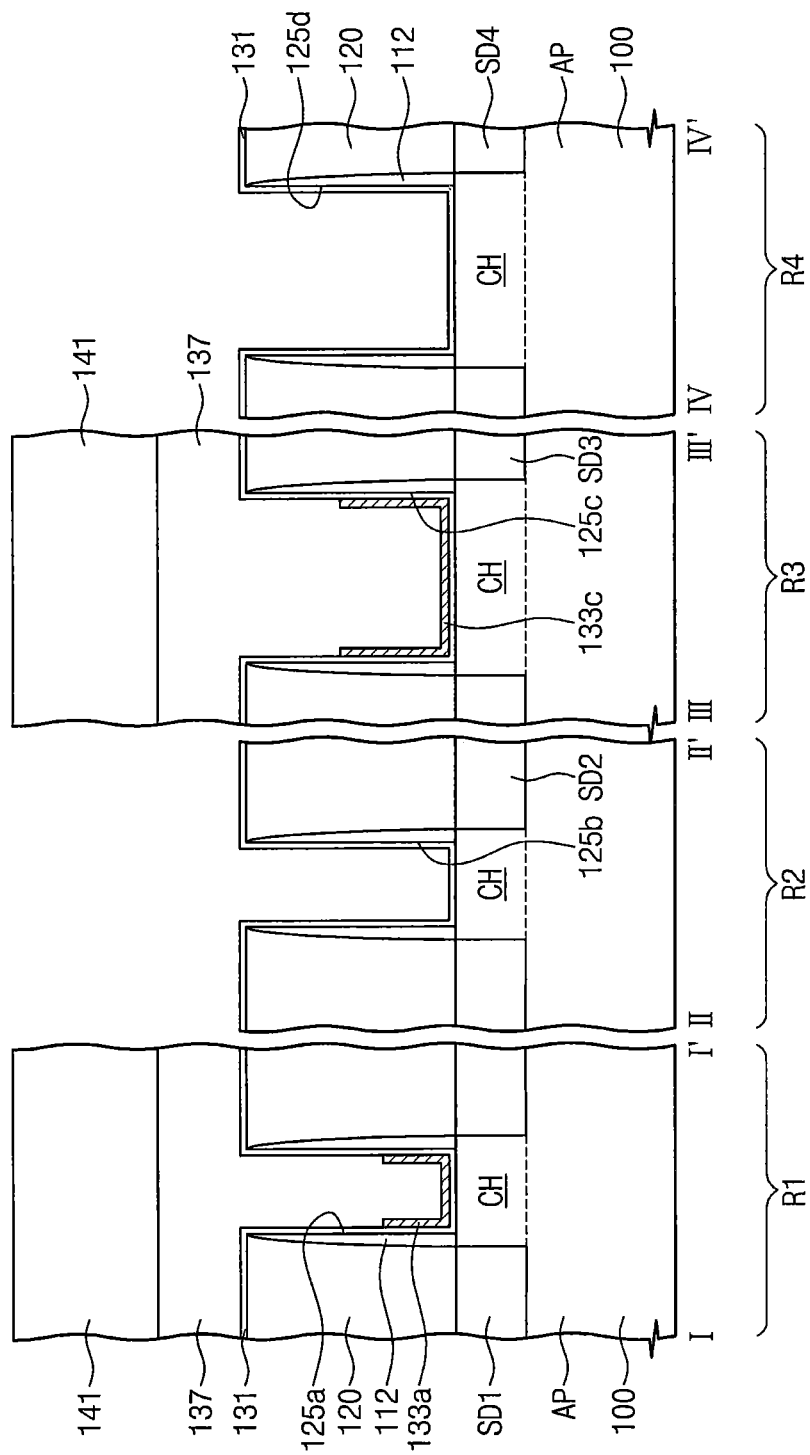
Figure 15A:
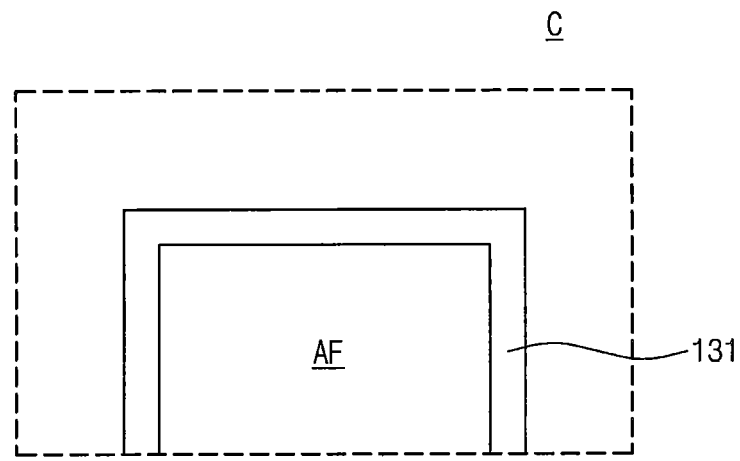
FIGS. 15A and 15B are enlarged cross-sectional views illustrating portion C of FIG. 14C.
Figure 15B:
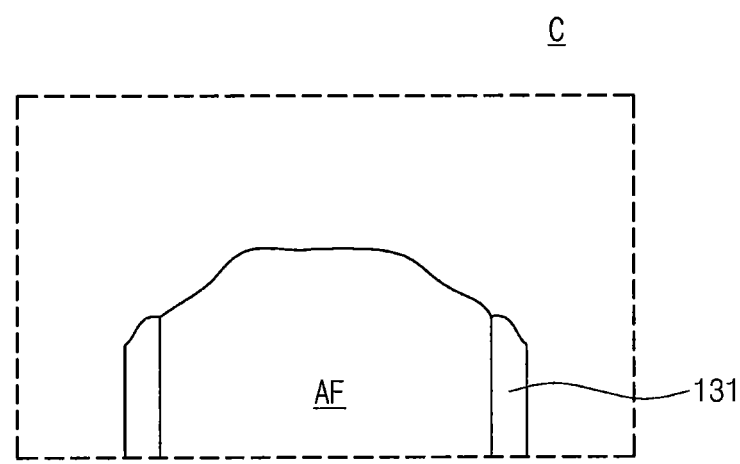

Referring to FIGS. 14A, 14B and 14C, mask patterns 141 may be formed on the second sacrificial layer 137. In some example embodiments, the mask patterns 141 may be formed to open at least one of the grooves 125a to 125d (block 560). The mask patterns 141 may open, for example, the second and fourth grooves 125b and 125d. The mask patterns 141 may include, for example, a photoresist material.

A second etching process may be successively performed using the mask patterns 141 as an etch mask to remove the second sacrificial layer 137 which is exposed by the mask patterns 141 (block 570). The second etching process may then expose the first conductive patterns (see 133b and 133d of FIGS. 13A to 13C) in the second and fourth grooves 125b and 125d. Thereafter, a wet etching process may be performed to remove the first conductive patterns 133b and 133d in the second and fourth grooves 125b and 125d (block 580).

According to the present inventive concept, the second etching process may be performed in the same manner as the first etching process. For example, the second etching process may be an anisotropic dry etching process using plasma. The second etching process may be an etching process using the reverse loading effect where etch rates are varied in accordance with the widths of the grooves 125a to 125d. Consequently, the second etching process may be performed in such a way that an etch rate of the second sacrificial layer 137 formed in the fourth groove 125d having a wider width is less than an etch rate of the second sacrificial layer 137 formed in the second groove 125b having a narrower width.

In some example embodiments, the second etching process may use a mixture of H2 and N2 as an etch gas. For example, a mixture ratio (H2/N2) may be about 0.5 to about 2. The second etching process may be performed at a temperature of about 30° C. to about 80° C. Moreover, the second etching process may use a pulsed bias power. In other words, as a radio frequency bias power is applied to the substrate 100, a pulsed bias power may be periodically supplied in a pulsed on/off mode. The pulsed bias power of the second etching process may have a duty ratio of about 0.05 to about 0.75. For example, the duty ratio of the second etching process may be in the range of about 0.25 to about 0.75.

The second and fourth grooves 125b and 125d may include bottom surfaces whose levels are different owing to the active fins AF, i.e., the channel regions CH. In case where conventional dry etching process is performed to remove the second sacrificial layer 137, the second sacrificial layer 137 lying above a top surface of the active fin AF may be removed ahead than the second sacrificial layer 137 placed below the top surface of the active fin AF. In other words, portions of the first conductive patterns 133b and 133d disposed on the top surfaces of the active fins AF may be exposed ahead than the first conductive patterns 133b and 133d located on the device isolation patterns 102. Therefore, the active fins AF may suffer from damages while a series of etching processes are performed to remove the first conductive patterns 133b and 133d, as shown in FIG. 15B. According to some example embodiments, the second sacrificial layer 137 may be removed by the second etching process using the reverse loading effect such that it may be prevented from over-etching the second sacrificial layer 137 in the fourth groove 125 having a wider width and on the top surfaces of the active fins AF. As shown in FIG. 15A, the first conducive patterns 135b and 135d in the second and fourth grooves 125b and 125d may be removed without the damages of the active fins AF (block 580). Consequently, gate electrodes GE1 to GE4 of FIGS. 1A to 1C may be formed to have diverse work functions and secure electrical characteristics thereof.

The afore-mentioned operations 550 to 580 may be referred to as a second removal process. The second removal process may correspond to a process for adjusting work functions of gate electrodes by removing the first conductive patterns in the grooves.

Figure 16A:
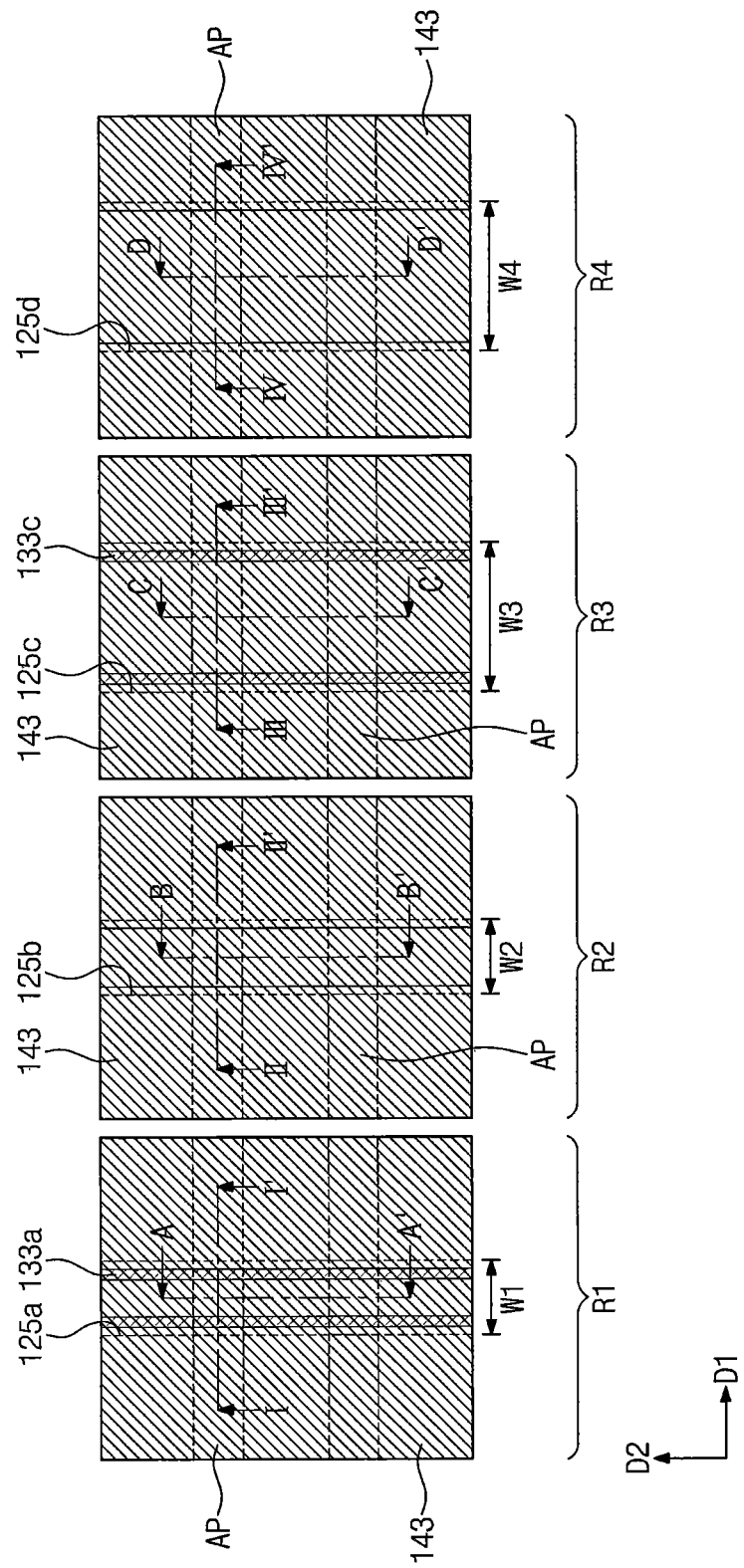
Figure 16B:
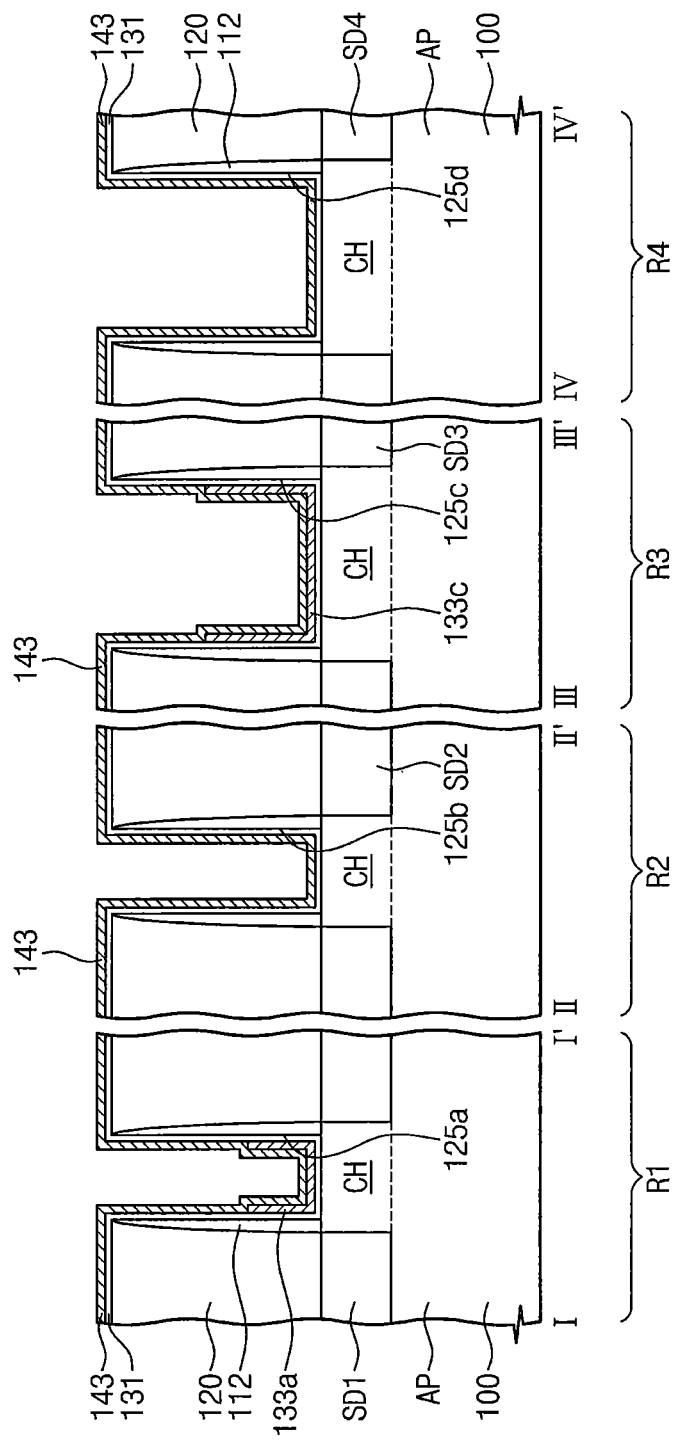
Figure 16C:
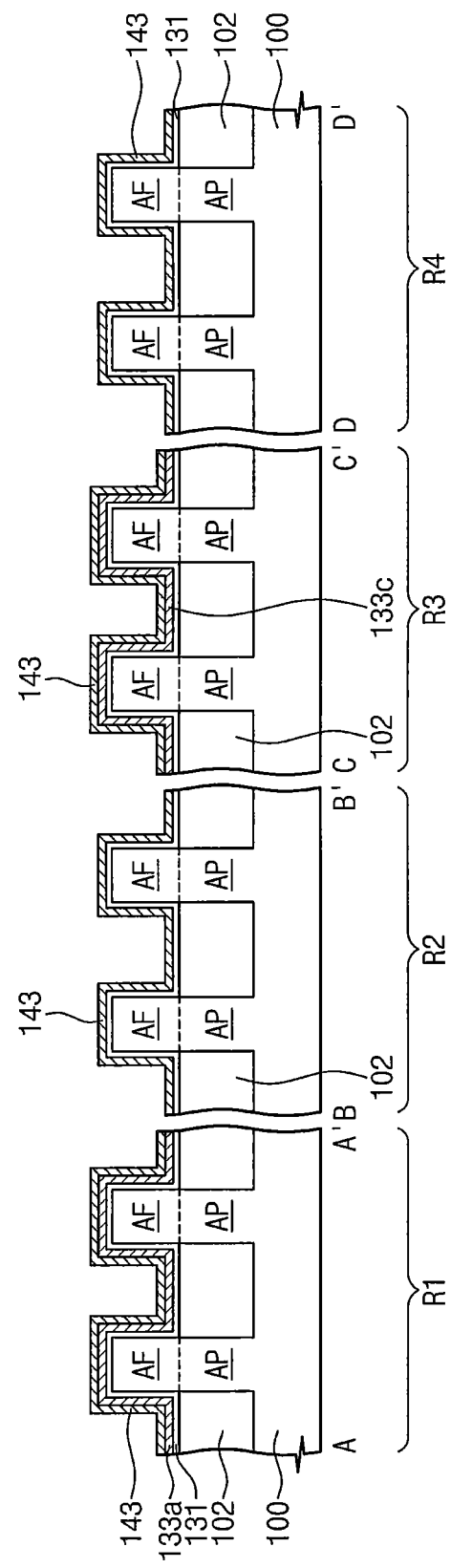

Referring to FIGS. 16A, 16B and 16C, the second sacrificial layer 137 and the mask patterns 141 of FIG. 14A to 14C may be removed. The removal of the second sacrificial layer 137 and the mask patterns 141 may be performed by, for example, an ashing process and/or a strip process.

Thereafter, a second conductive layer 143 may be formed in the first to fourth grooves 125a to 125d (block 590). The second conductive layer 143 may be formed to have a substantially even thickness on inner surfaces of the first and third grooves 125a and 125c in which the first conductive patterns 133a and 133c are formed, inner surfaces of the second and fourth grooves 125b and 125d in which the first conductive patterns 133b and 133d are removed, and the top surface of the interlayer dielectric layer 120. The second conductive layer 143 may be formed to partially fill the first to fourth grooves 125a to 125d, as shown in FIG. 16B. Some embodiments provide that, otherwise as shown FIG. 16B, the second conductive layer 143 may be formed to completely fill the first groove 125a of the grooves 125a to 125d.

In some example embodiments, the second conductive layer 143 may include aluminum (Al) and/or metal carbide. The metal carbide may be a compound comprising carbon (C) and at least one of Ti, Ta, W, Ru, Nb, Mo, Hf and/or La. The second conductive layer 143 may include, for example, TiAlC. The second conductive layer 143 may be a conductive layer for adjusting work functions of the gate electrodes GE1 to GE4 formed in the grooves 125a to 125d. The second conductive layer 143 may be formed by, for example, a CVD process or an ALD process.

Referring back to FIGS. 1A, 1B and 1C, a third conductive layer may be formed on the entire top surface of the substrate 100. The third conductive layer may completely fill the grooves 125a to 125d in which the second conductive layer 143 is formed. The third conductive layer may include, for example, tungsten.

Thereafter, a planarization process may be performed on the substrate 100 to form gate dielectric patterns 131a to 131d, second conductive patterns 143a to 143d, and third conductive patterns 145a to 145d. The planarization process may be performed until the top surface of the interlayer dielectric layer 120 is exposed. As a result, gate electrodes GE1 to GE4 may be respectively formed to be locally provided in the grooves 125a to 125d (block 595). The planarization process may include, for example, an etch back or a chemical mechanical polishing. Prior to the formation of the third conductive layer, a barrier conductive layer may be further formed in the grooves 125a to 125d. The barrier conductive layer may include a metal nitride.

The present inventive concept has been discussed based on the example in which the gate electrodes GE1 to GE4 are formed by the formation of the first conducive layer (block 510), the first removal process (blocks 550 to 580), the formation of the second conductive layer (block 590), and the formation of the gate electrode (block 595), but the present inventive concept is not limited thereto. The first and second conductive layers may be respectively formed to have multiple layers, and thus the process sequence for forming the gate electrodes may be variously changed. The present inventive concept has been described based on the example in which the first removal process is performed on the first conductive layer, but the first removal process may also be performed on the second conductive layer. Various embodiments are discussed below with reference to figures.

Figure 17A:
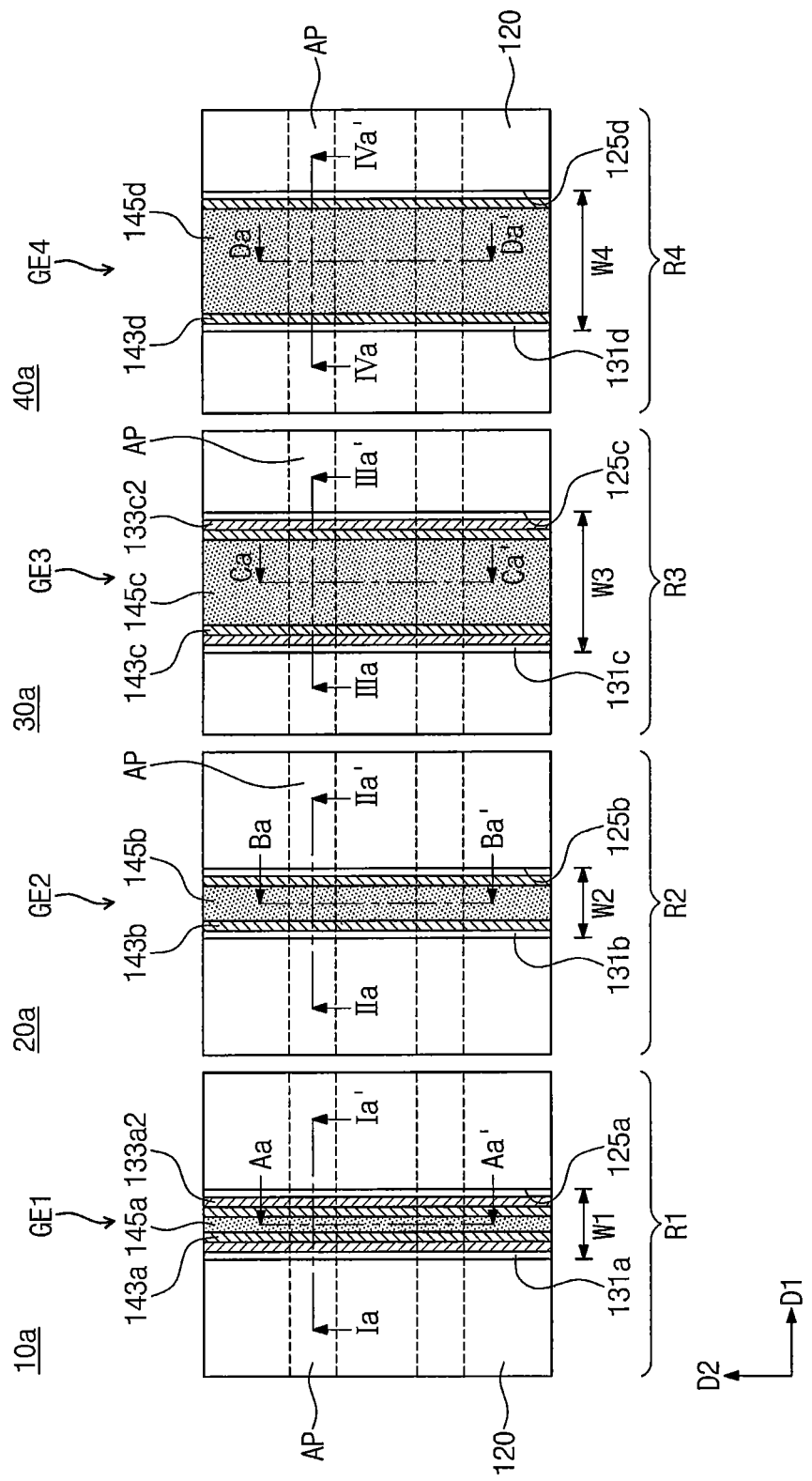
FIG. 17A is a plan view illustrating a semiconductor device and methods for fabricating the same according to some embodiments of the present inventive concept.
Figure 17B:
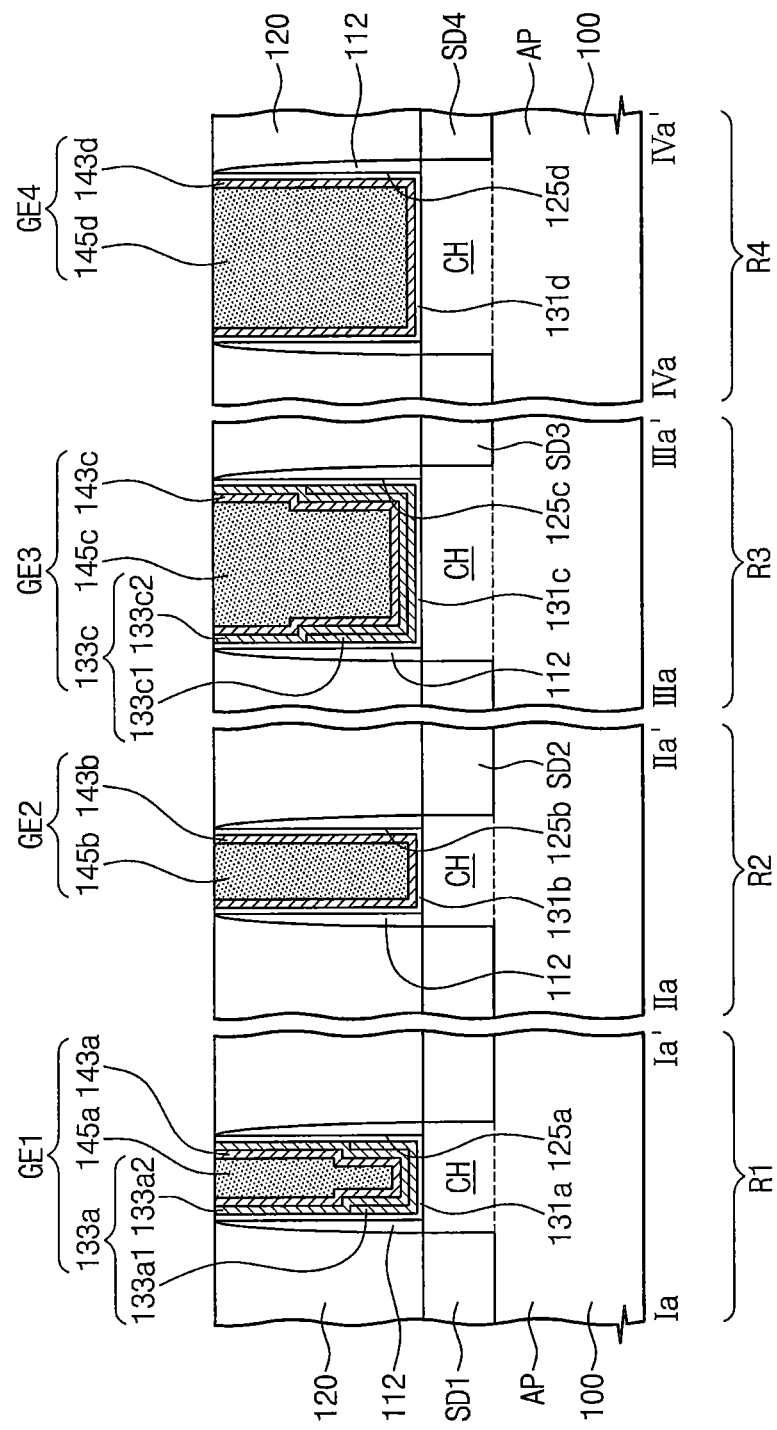
FIG. 17B is a cross-sectional view taken along lines Ia-Ia', IIa-IIa', IIIa-IIIa' and IVa-IVa' of FIG. 17A.
Figure 17C:
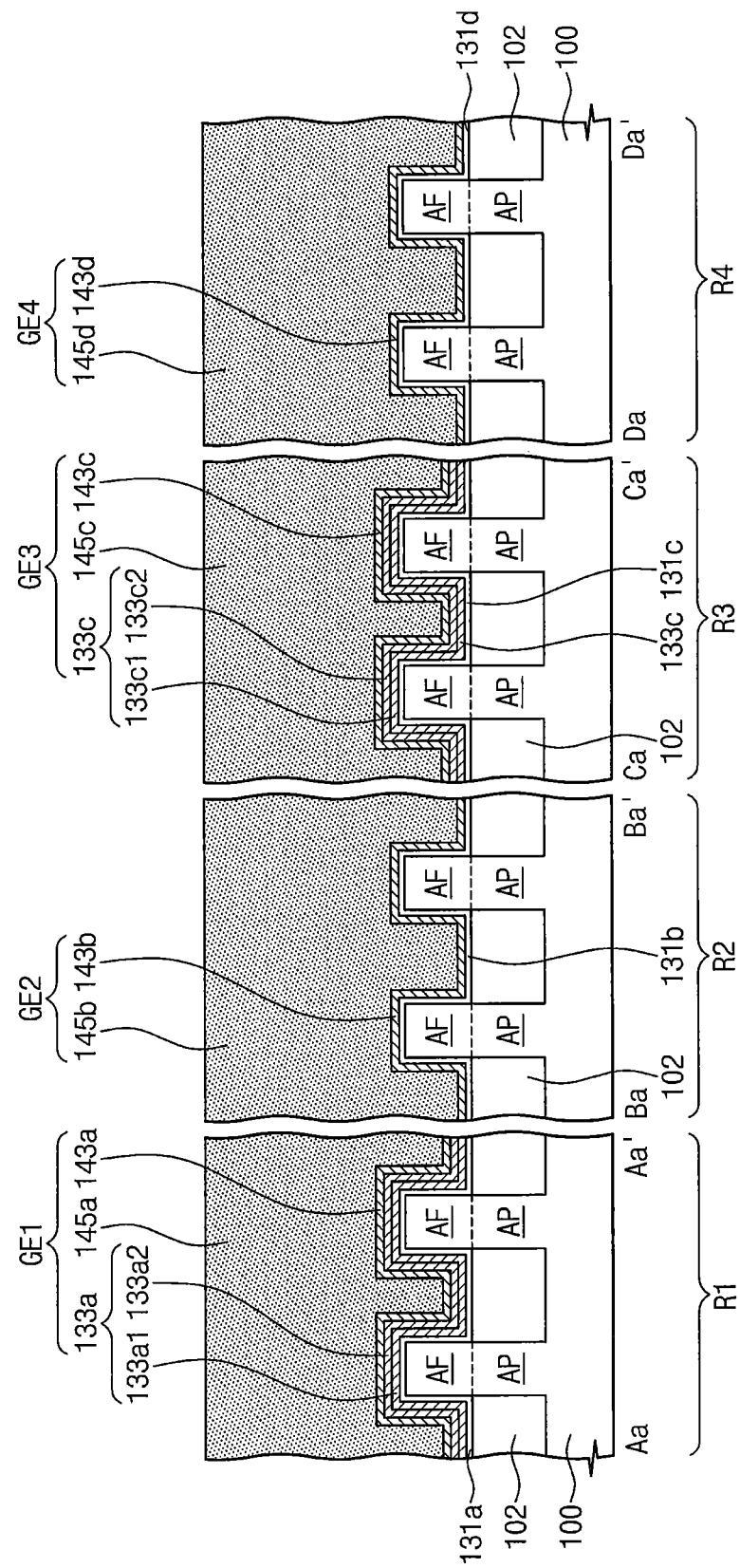
FIG. 17C is a cross-sectional view taken along lines Aa-Aa', Ba-Ba', Ca-Ca' and Da-Da' of FIG. 17A.

FIG. 17A is a plan view illustrating a semiconductor device and a method for fabricating the same according to some other embodiments of the present inventive concept. FIG. 17B is a cross-sectional view taken along lines Ia-Ia', IIa-IIa', IIIa-IIIa' and IVa-IVa' of FIG. 17A. FIG. 17C is a cross-sectional view taken along lines Aa-Aa', Ba-Ba', Ca-Ca' and Da-Da' of FIG. 17A. For the brevity of descriptions, the duplicate explanations will be omitted hereinafter.

Referring to FIGS. 17A, 17B and 17C, first to fourth transistors 10a, 20a, 30a and 40a may be respectively provided on the substrate 100 inclusive of the first to fourth regions R1 to R4.

The first transistor 10a may comprise the first gate electrode GE1, the first gate dielectric pattern 131a and the first source/drain regions SD1. The second transistor 20a may comprise the second gate electrode GE2, the second gate dielectric pattern 131b and the second source/drain regions SD2. The third transistor 30a may comprise the third gate electrode GE3, the third gate dielectric pattern 131c and the third source/drain regions SD3. The fourth transistor 40a may comprise the fourth gate electrode GE4, the fourth gate dielectric pattern 131d and the fourth source/drain regions SD4.

The first transistor 10a may have structural features substantially the same as those of the first transistor 10 discussed with reference to FIGS. 1A to 1C, except that the first gate electrode GE1 includes a double-layered first conductive pattern 133a. The third transistor 30a may have structural features substantially the same as those of the third transistor 30 discussed with reference to FIGS. 1A to 1C, except that the third gate electrode GE3 includes a double-layered first conductive pattern 133c. The second and fourth transistors 20a and 40a may have the structural features substantially the same those of the second and fourth transistors 20 and 40, respectively, discussed with reference to FIGS. 1A to 1C.

The first gate electrode GE1 may comprise the first conductive pattern 133a, the second conductive pattern 143a, and the third conductive pattern 145a. The first conductive pattern 133a may comprise a first sub-conductive pattern 133a1 and a second sub-conductive pattern 133a2. For example, the first sub-conductive pattern 133a1 may be disposed on the first gate dielectric pattern 131a and extend along the first gate dielectric pattern 131a in the second direction D2. In a cross-sectional view, the first sub-conductive pattern 133a1 may have a "U" shape. The first sub-conductive pattern 133a1 may include an uppermost top surface positioned below the top surface of the interlayer dielectric layer 120 and above the top surface of the channel region CH. In other words, the first sub-conductive pattern 133a1 may expose a portion of the first gate dielectric pattern 131a on the opposing sidewalls of the first groove 125a. The second sub-conductive pattern 133a2 may be disposed on the first sub-conductive pattern 133a1. The second sub-conductive pattern 133a2 may cover top surfaces and sidewalls of the first sub-conductive pattern 133a1. Moreover, the second sub-conductive pattern 133a2 may cover the portion of the first gate dielectric layer 131a that is exposed by the first sub-conductive pattern 133a1. The second sub-conductive pattern 133a2 may include an uppermost top surface substantially coplanar with the top surface of the interlayer dielectric layer 120. The second conductive pattern 143a may be disposed on the second sub-conductive pattern 133a2. The second conductive pattern 143a may cover top surfaces and sidewalls of the second sub-conductive pattern 133a2. The second conductive pattern 143a may include an uppermost top surface substantially coplanar with the top surface of the interlayer dielectric layer 120. The third conductive pattern 145a may fill the first groove 125a in which the first sub-conductive pattern 133a1, the second sub-conductive pattern 133a2 and the second conductive pattern 143a are formed. The third conductive pattern 145a may be spaced apart from the first conductive pattern 133a. The third conductive pattern 145a may include a top surface substantially coplanar with the top surface of the interlayer dielectric layer 120.

Likewise with the first gate electrode GE1, the third gate electrode GE3 may comprise the first conductive pattern 133c, the second conductive pattern 143c, and the third conductive pattern 145c. The first conductive pattern 133c may comprise a first sub-conductive pattern 133c1 and a second sub-conductive pattern 133c2. The first sub-conductive pattern 133c1, the second sub-conductive pattern 133c2, the second conductive pattern 143c, and the third conductive pattern 145c of the third gate electrode GE3 may respectively include sizes and arrangement substantially identical to those of the first sub-conductive pattern 133a1, the second sub-conductive pattern 133a2, the second conductive pattern 143a, and the third conductive pattern 145a of the first gate electrode GE1. The first sub-conductive patterns 133a1 and 133c1 and the second sub-conductive patterns 133a2 and 133c2 may include a material identical to that of the first conductive pattern 133a discussed with reference to FIGS. 1A to 1C.

The followings are descriptions of methods for forming the first to fourth transistors 10a to 40a according to some embodiments of the inventive concept.

At the step illustrated in FIGS. 12A to 12C, the first to fourth sacrificial patterns 136a to 136d may be removed after the first conductive patterns 133a to 133d are formed. The removal of the first to fourth sacrificial patterns 136a to 136d may be performed using an ashing process and/or a strip process. Thereafter, a second conductive layer may be formed conformally on the entire top surface of the substrate 100. The first conductive patterns 133a to 133d illustrated in FIGS. 12A to 12C may correspond to the first sub-conductive patterns. The second sub-conductive layer may be formed to have a substantially even thickness on the inner surfaces of the grooves 125a to 125d and the top surface of the interlayer dielectric layer 120. And then, the second removal process (blocks 550 to 580) may be identically or similarly performed to remove the first sub-conductive patterns and the second sub-conductive layer in the second and fourth grooves 125b and 125d. This removal of the first sub-conductive patterns and the second sub-conductive layer in the second and fourth grooves 125b and 125d may expose the second and fourth gate dielectric layers 131b and 131d. In other words, the first sub-conductive patterns 133a1 and 133c1 and the second sub-conductive layer may be selectively formed in the first and third grooves 125a and 125c. Thereafter, processes identical or similar to those discussed in FIGS. 16, 1A, 1B and 1C may be performed to form the second sub-conductive patterns 133a2 and 133c2, the second conductive patterns 143a to 143d, and the third conductive patterns 145a to 145d. Consequently, it may be possible to form transistors having various threshold voltages.

Figure 18A:
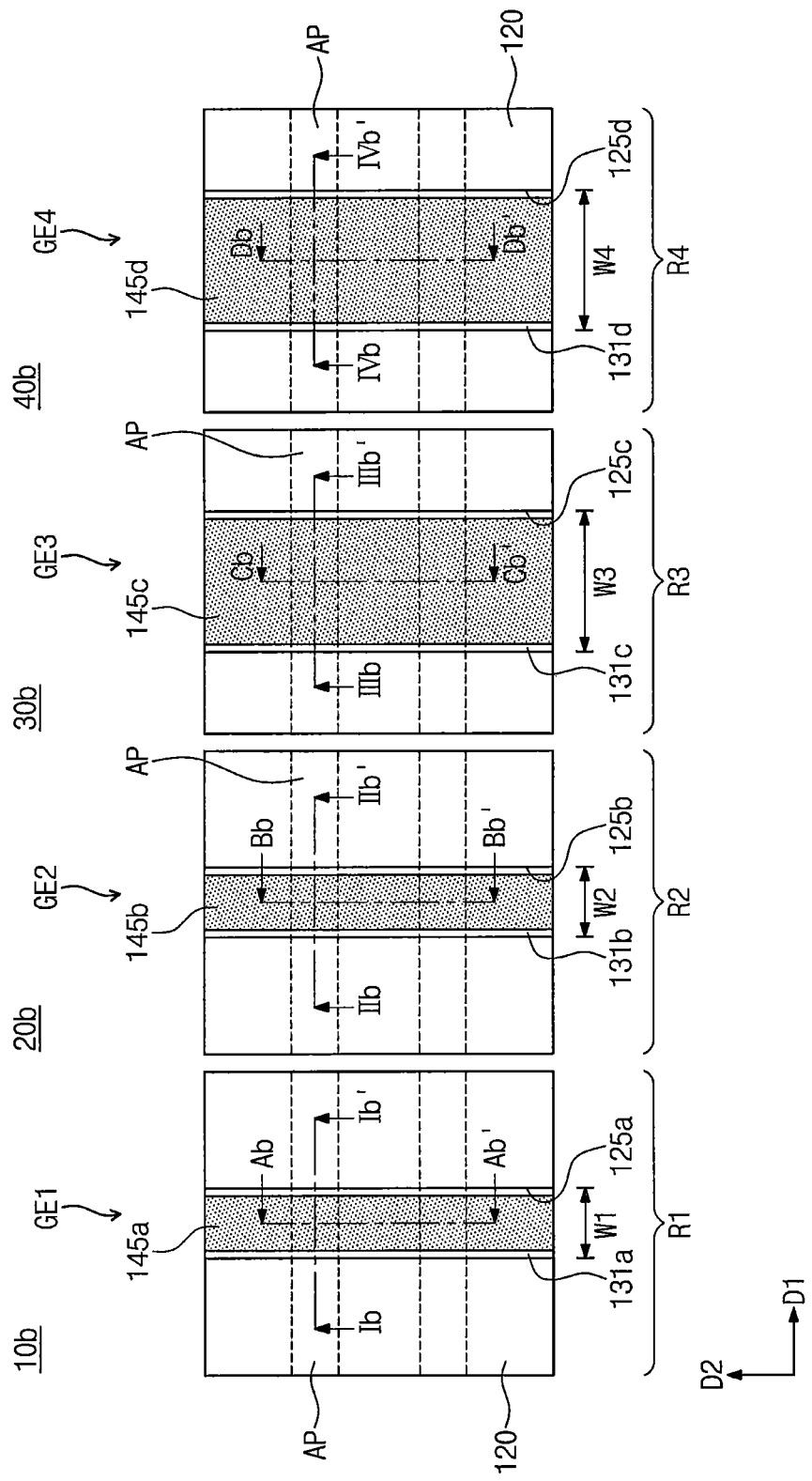
FIG. 18A is a plan view illustrating a semiconductor device and methods for fabricating the same according to some embodiments of the present inventive concept.

FIG. 18A is a plan view illustrating a semiconductor device and a method for fabricating the same according to some other embodiments of the present inventive concept.

Figure 18B:
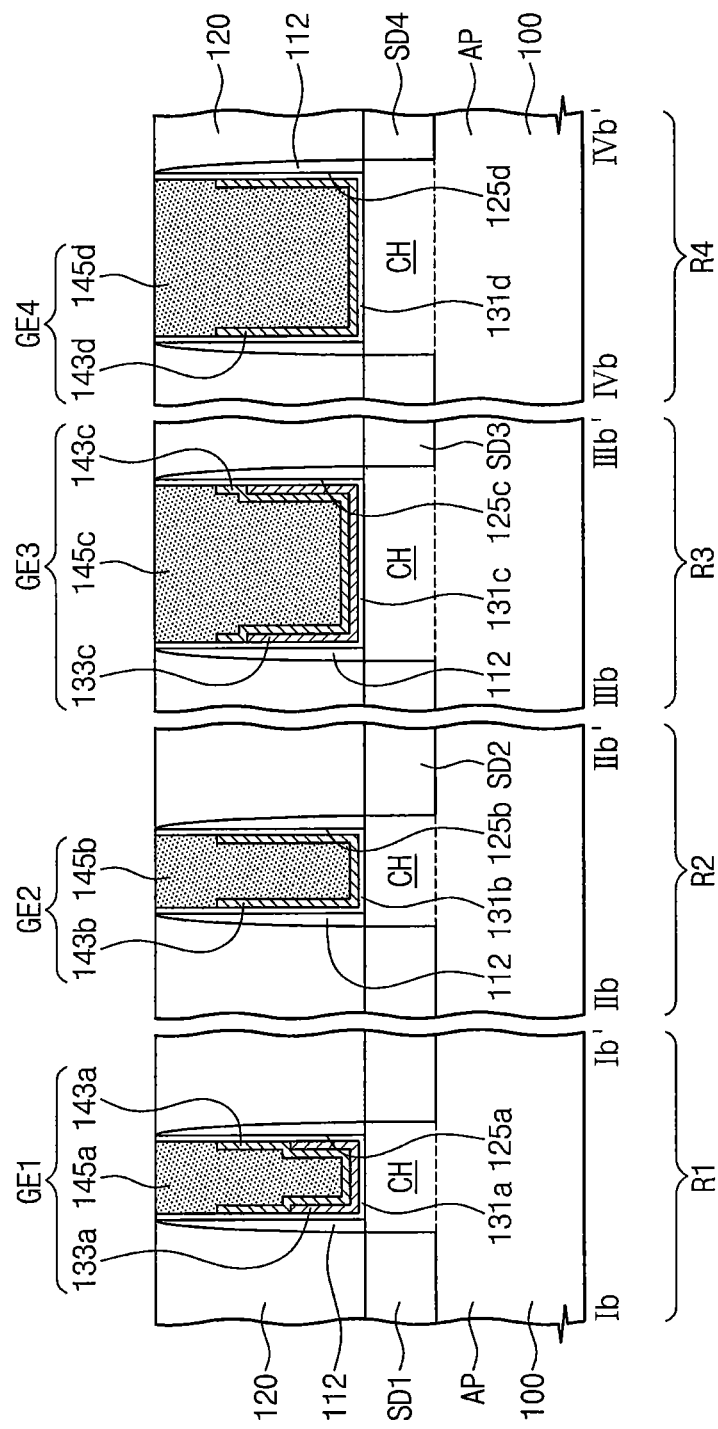
FIG. 18B is a cross-sectional view taken along lines Ia-Ia', IIa-IIa', IIIa-IIIa' and IVa-IVa' of FIG. 18A.
Figure 18C:
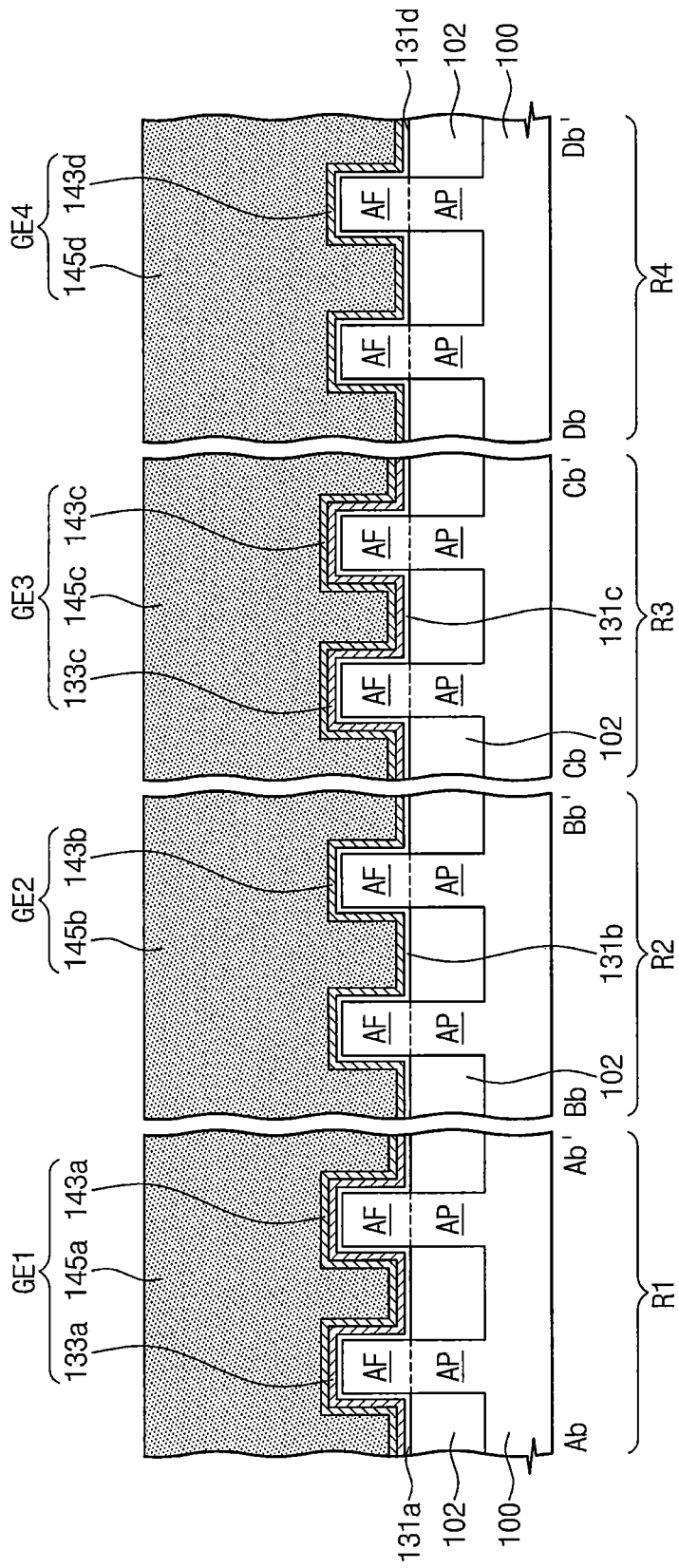
FIG. 18C is a cross-sectional view taken along lines Aa-Aa', Ba-Ba', Ca-Ca' and Da-Da' of FIG. 18A.

FIG. 18B is a cross-sectional view taken along lines Ia-Ia', IIa-IIa', IIIa-IIIa' and IVa-IVa' of FIG. 18A. FIG. 18C is a cross-sectional view taken along lines Aa-Aa', Ba-Ba', Ca-Ca' and Da-Da' of FIG. 18A. For the brevity of descriptions, the duplicate explanations will be omitted hereinafter.

First to fourth transistors 10b, 20b, 30b and 40b may be respectively provided on the substrate 100 inclusive of the first to fourth regions R1 to R4.

The first transistor 10b may comprise the first gate electrode GE1, the first gate dielectric pattern 131a and the first source/drain regions SD1. The second transistor 20b may comprise the second gate electrode GE2, the second gate dielectric pattern 131b and the second source/drain regions SD2. The third transistor 30b may comprise the third gate electrode GE3, the third gate dielectric pattern 131c and the third source/drain regions SD3. The fourth transistor 40b may comprise the fourth gate electrode GE4, the fourth gate dielectric pattern 131d and the fourth source/drain regions SD4.

The first to fourth transistors 10b to 40b may have structural features substantially the same as those of the first to fourth transistors 10 to 40, respectively, discussed in FIGS. 1A to 1C, except of shape differences between the second conductive patterns 143a to 143d respectively constituting the gate electrodes GE1 to GE4.

For example, the second conductive patterns 143a to 143d may respectively include the uppermost top surfaces positioned above the uppermost top surfaces of the first conductive patterns 133a to 133d and the top surface of the interlayer dielectric layer 120. At the step illustrated in FIGS. 16A to 16C, the second conductive patterns 143a to 143d may be formed by performing processes identical or similar to the first removal process (blocks 520 to 540). Successive processes may be identical or similar to those described with reference to FIGS. 1A to 1C. The first removal process may be performed on the second conductive layer such that a gap-fill margin of the third conductive layer may be increased. Therefore, resistance characteristics of the gate electrodes GE1 to GE4 may be improved.

Figure 19:
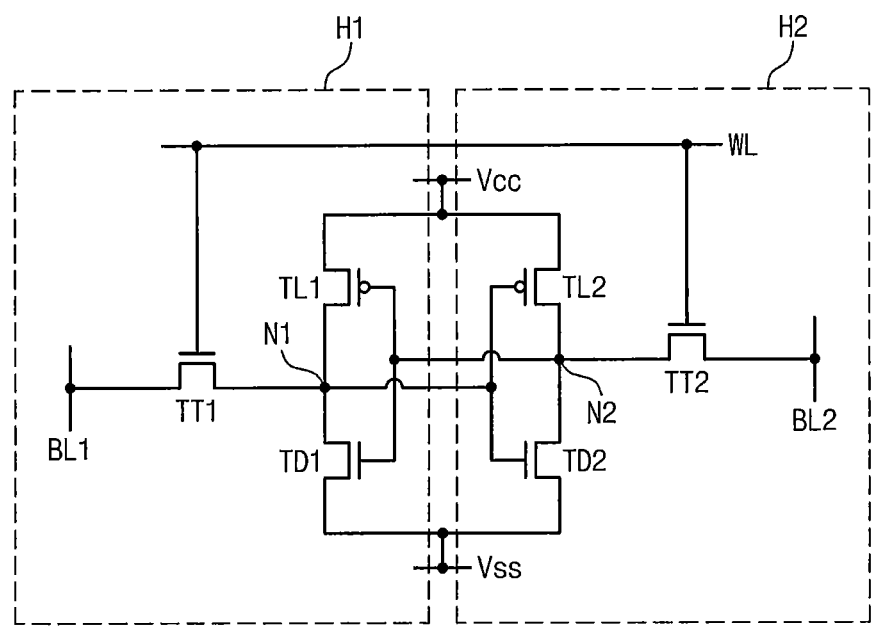
FIG. 19 is a circuit diagram of a complementary metal-oxide-semiconductor (CMOS) static random access memory (SRAM) cell including a semiconductor device according to some example embodiments of the present inventive concept.

FIG. 19 is a circuit diagram of a complementary metal-oxide-semiconductor (CMOS) static random access memory (SRAM) cell including at least one of a semiconductor device according to some example embodiments of the present inventive concept.

Referring to FIG. 19, the CMOS SRAM cell may include a pair of driver transistors TD1 and TD2, a pair of transfer transistors TT1 and TT2, and a pair of load transistors TL1 and TL2. The drive transistors TD1 and TD2 may correspond to pull-down transistors, the transfer transistors TT1 and TT2 may correspond to pass transistors, and the load transistors TL1 and TL2 may correspond to pull-up transistors. The drive transistors TD1 and TD2 and the transfer transistors TT1 and TT2 may be NMOS transistors, and the load transistors TL1 and TL2 may be PMOS transistors.

A first driver transistor TD1 and a first transfer transistor TT1 may be connected in series to each other. A source region of the first drive transistor TD1 may be electrically connected to a ground line Vss, and a drain region of the first transfer transistor TT1 may be electrically connected to a first bit line BL1. A second drive transistor TD2 and a second transfer transistor TT2 may be connected in series to each other. A source region of the second driver transistor TD2 may be electrically connected to the ground line Vss, and a drain region of the second transfer transistor TT2 may be electrically connected to a second bit line BL2.

A source region and a drain region of a first load transistor TL1 may be electrically connected to a power line Vcc and a drain region of the first drive transistor TD2, respectively. A source region and a drain region of a second load transistor TL2 may be electrically connected to the power line Vcc and a drain region of the second drive transistor TD2, respectively. The drain region of the first load transistor TL1, the drain region of the first drive transistor TD1, and the source region of the first transfer transistor TT1 may correspond to a first node N1. The drain region of the second load transistor TL2, the drain region of the second drive transistor TD2, and the source region of the second transfer transistor TT2 may correspond to a second node N2. Gate electrodes of the first drive transistor TD1 and the first load transistor TL1 may be electrically connected to the second node N2, and the gate electrodes of the second drive transistor TD2 and the second load transistor TL2 may be electrically connected to the first node N1. Gate electrodes of the first and second transfer transistors TT1 and TT2 may be electrically connected to a word line WL. The first drive transistor TD1, the first transfer transistor TT1, and the first load transistor TL1 may constitute a first half cell H1, and the second drive transistor TD2, the second transfer transistor TT2, and the second load transistor TL2 may constitute a second half cell H2.

The present inventive concept is not limited to the SRAM, and may also be applied to a dynamic random access memory (DRAM) device, a magnetic random access memory (MRAM) device, and/or other semiconductor devices and method for fabricating the same.

Figure 20:
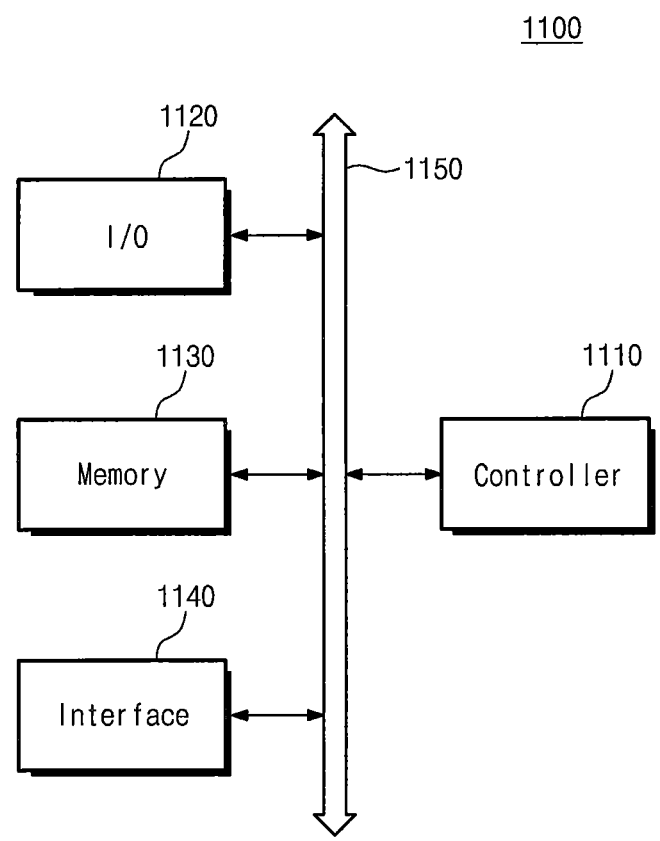
FIG. 20 is a block diagram illustrating an example of electronic systems including a semiconductor device according to some example embodiments of the present inventive concept.

FIG. 20 is a block diagram illustrating an example of electronic systems including a semiconductor device according to some example embodiments of the present inventive concept.

Referring to FIG. 20, an electronic system 1100 may comprise a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, and/or other logic devices. The other logic devices may have a similar function to any one of the microprocessor, the digital signal processor and/or the microcontroller. The I/O unit 1120 may include a key pad, a keyboard, and/or a display unit. The memory device 1130 may store data and/or commands. The interface unit 1140 may operate wirelessly and/or by cable. For example, the interface unit 1140 may include an antenna for wireless communication and/or a transceiver for cable communication. The electronic system 1100 may further include a fast DRAM device and/or a fast SRAM device which acts as a cache memory for improving an operation of the controller 1110. The semiconductor devices according to some embodiments of the present inventive concept may be provided in the memory device 1130, or in any portion of the controller 1110 and/or the I/O unit 1120.

The electronic system 1100 may be applied to a personal digital assistant (PDA), a portable computer, a web tablet, a wireless phone, a mobile phone, a digital music player, a memory card, and/or other electronic products receiving and/or transmitting information wirelessly.

Figure 21:
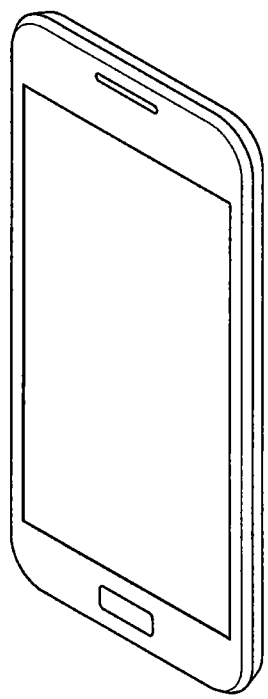
FIG. 21 illustrates a case where an electronic system is applied to a mobile phone.

The electronic system 1100 may also be applied to an electronic controlling apparatus of various electronic appliances. FIG. 21 illustrates a case where an electronic system such as the system 1100 of FIG. 20 is applied to a mobile phone 1200. Furthermore, the electronic system (e.g., 1100 of FIG. 20) may be applied to a portable notebook computer, an MP3 player, a navigator, an SSD, a car, and/or household appliances.

According to some embodiments of the present inventive concept, the first conductive layer formed in the grooves having different widths may be partially removed in order to improve gap-fill margin of the subsequent second conductive layer. In this case, the first etching process using the reverse loading effect may be performed to remove a portion of the first sacrificial layer covering the first conductive layer such that the first conductive layer may be partially removed without formation of separate mask. As a result, it may be possible to simplify the semiconductor fabrication methods for forming gate electrodes.

Furthermore, the first conductive pattern formed in the grooves may be removed to adjust work function of gate electrode. In this case, The second etching process using the reverse loading effect may be performed to remove the second sacrificial layer covering the first conductive pattern such that it may be possible to prevent damages to the active fins while a series of etching processes are performed. It may then be possible to form gate electrodes having various work functions and secure electrical characteristics thereof.

Consequently, the driving characteristics of semiconductor device including the gate electrodes may be improved and the fabrication method may be simplified.

Although the present inventive concept has been described in connection with the embodiments of the present inventive concepts illustrated in the accompanying drawings, it is not limited thereto. It will be apparent to those skilled in the art that various substitution, modifications and changes may be thereto without departing from the scope and spirit of the inventive concept.

What is claimed is:

1. A method for fabricating a semiconductor device, the method comprising:
    forming active patterns on a substrate, the active patterns protruding from the substrate;
    forming an interlayer dielectric layer on the active patterns, the interlayer dielectric layer including a plurality of grooves that expose the active patterns, the plurality of grooves including a first groove having a first width and a second groove having a second width that is greater than the first width;
    forming a first conductive layer on inner surfaces of the first and second grooves;
    forming a first sacrificial layer filling the first and second grooves;
    performing a first etching process to remove the first sacrificial layer and expose a portion of the first conductive layer; and
    removing the exposed portion of the first conductive layer to form first conductive patterns on top surfaces and sidewalls of the active patterns in the first and second grooves,
    wherein the plurality of grooves further comprise a third groove having a third width that is substantially equal to the first width of the first groove, wherein the first conductive patterns are formed in the first, second and third grooves, and
    wherein the method further comprises removing at least one of the first conductive patterns in the first, second and third grooves.

2. The method of claim 1, wherein each of the first conductive patterns has a "U" shape in a cross-sectional view.

3. The method of claim 2, wherein each of the first conductive patterns has an uppermost top surface that is positioned below a top surface of the interlayer dielectric layer and above a top surface of the active pattern.

4. The method of claim 3, wherein the uppermost top surface of the first conductive pattern in the second groove is higher than that of the first conductive pattern in the first groove relative to the substrate.

5. The method of claim 1, wherein the first etching process includes an anisotropic dry etching process using a mixture of hydrogen (H2) and nitrogen (N2) as an etch gas.

6. The method of claim 1, wherein removing the at least one of the first conductive patterns in the first, second and third grooves includes removing the first conductive patterns in the first groove and the second groove,
wherein removing the first conductive patterns in the first groove and the second groove comprises:
forming a second sacrificial layer filling the first, second and third grooves;
forming mask patterns on the second sacrificial layer, the first and second grooves opened by the mask patterns; and
performing a second etching process using the mask patterns as an etch mask to remove the second sacrificial layer in the first and second grooves.

7. The method of claim 6, wherein the second etching process includes an anisotropic dry etching process using a mixture of hydrogen (H2) and nitrogen (N2) as an etch gas, and
wherein a pulsed bias power is employed as a bias power applied to the substrate while the second etching process is performed.

8. The method of claim 6, after removing the first conductive patterns in the first groove and the second groove, further comprising forming a second conductive layer in the first, second and third grooves, the second conductive layer including a material that is different from that of the first conductive layer.

9. The method of claim 8, wherein the first conductive layer includes a metal nitride and the second conductive layer includes aluminum and a metal carbide.

10. The method of claim 1, further comprising:
forming first and second sacrificial gate patterns crossing the active patterns on the substrate prior to forming the interlayer dielectric layer,
wherein forming the interlayer dielectric layer includes covering sidewalls of each of the first and second sacrificial gate patterns with the interlayer dielectric layer, and
removing the first and second sacrificial gate patterns to create spaces that serve as the first and second grooves.

11. The method of claim 10, prior to removing the first and second sacrificial gate patterns, further comprising:
forming first source/drain regions on the active patterns at opposing sides of the first sacrificial gate patterns; and
forming second source/drain regions on the active patterns at opposing sides of the second sacrificial gate patterns,
wherein the first and second source/drain regions have a same conductivity type each other.

12. The method of claim 1, wherein forming the first sacrificial layer comprises:
forming a first sub-sacrificial layer filling the first and second grooves;
recessing the first sub-sacrificial layer; and
forming a second sub-sacrificial layer on the recessed first sub-sacrificial layer.

13. A method for fabricating a semiconductor device, the method comprising:
forming active patterns on a substrate, the active patterns protruding from the substrate;
forming sacrificial gate patterns crossing the active patterns on the substrate;
forming an interlayer dielectric layer on sidewalls of the sacrificial gate patterns;
removing the sacrificial gate patterns to form a plurality of grooves exposing the active patterns, at least one of the plurality of grooves having a width greater than those of respective others of the plurality of grooves; and
forming gate electrodes in the plurality of grooves,
wherein forming the gate electrodes includes:
forming first work function conductive patterns in the plurality of grooves;
removing at least one of the first work function conductive patterns in the plurality of grooves; and
forming second work function conductive patterns in the plurality of grooves;
wherein each of the first work function conductive patterns has a "U" shape in a cross-sectional view, and
wherein each of the first work function conductive patterns has an uppermost top surface positioned below a top surface of the interlayer dielectric layer and higher than a top surface of each of the active patterns.

14. The method of claim 13, wherein forming the first work function conductive patterns comprising:
forming a first work function conductive layer in the plurality of grooves;
forming a first sacrificial layer in the plurality of grooves;
performing a first etching process to expose a portion of the first work function conductive layer in the plurality of grooves; and
removing the exposed portion of the first work function conductive layer.

15. The method of claim 14, wherein forming the first sacrificial layer comprises:
forming a first sub-sacrificial layer filling the plurality of grooves;
recessing the first sub-sacrificial layer; and
forming a second sub-sacrificial layer on the recessed first sub-sacrificial layer.

16. The method of claim 14, wherein removing the at least one of the first work function conductive patterns comprises:
forming a second sacrificial layer filling the plurality of grooves in which the first work function conductive patterns are formed;
forming a mask pattern on the second sacrificial layer, the mask pattern opening at least one of the plurality of grooves; and
performing a second etching process using the mask pattern as an etch mask to remove the second sacrificial layer in the at least one of the plurality of grooves.

17. The method of claim 16, wherein at least one of the first and second etching processes includes an anisotropic dry etching process using a mixture of hydrogen (H2) and nitrogen (N2) as an etch gas.

18. The method of claim 17, wherein
a first pulsed bias power is employed as a first bias power applied to the substrate while the first etching process is performed; and
a second pulsed bias power is employed as a second bias power applied to the substrate while the second etching process is performed.

19. The method of claim 13, wherein the second work function conductive patterns have an uppermost top surface positioned below the top surface of the interlayer dielectric layer and above uppermost top surfaces of the first work function conductive patterns.

\* \* \* \* \*